United States Patent
Miyamoto et al.

(10) Patent No.: US 7,652,908 B2
(45) Date of Patent: Jan. 26, 2010

(54) FERROELECTRIC MEMORY HAVING A REFRESH CONTROL CIRCUIT CAPABLE OF RECOVERING RESIDUAL POLARIZATION OF UNSELECTED MEMORY CELLS

(76) Inventors: Hideaki Miyamoto, 310-20, Arakawa-cho, Ogaki-shi, Gifu 503-0993 (JP); Naofumi Sakai, 1-1-1-1205, Kanada, Kokurakita-ku, Kitakyushu-shi, Fukuoka 803-0816 (JP); Kouichi Yamada, 5, Nakagawa-cho, Kasamatsu-cho, Hashima-gun, Gifu 501-6095 (JP); Shigeharu Matsushita, 4-10-13-609, Hoshida, Katano-shi, Osaka 576-0016 (JP)

( * ) Notice: Subject to any disclaimer, the term of this patent is extended or adjusted under 35 U.S.C. 154(b) by 295 days.

(21) Appl. No.: 11/630,851

(22) PCT Filed: Jun. 16, 2005

(86) PCT No.: PCT/JP2005/011031
§ 371 (c)(1),
(2), (4) Date: Dec. 22, 2006

(87) PCT Pub. No.: WO2006/001212
PCT Pub. Date: Jan. 5, 2006

(65) Prior Publication Data
US 2007/0237016 A1    Oct. 11, 2007

(30) Foreign Application Priority Data

| Jun. 23, 2004 | (JP) | ............................ 2004-184498 |
| Jul. 28, 2004 | (JP) | ............................ 2004-220505 |
| Jul. 29, 2004 | (JP) | ............................ 2004-221038 |

(51) Int. Cl.
*G11C 11/22* (2006.01)

(52) U.S. Cl. .................. 365/145; 365/222; 365/210.11; 365/210.12

(58) Field of Classification Search .................. 365/222, 365/145, 210.11, 210.12, 150
See application file for complete search history.

(56) References Cited

U.S. PATENT DOCUMENTS 4,617,564 A    10/1986    Yoshioka
(Continued)

FOREIGN PATENT DOCUMENTS

JP    10-162588    6/1988
(Continued)

OTHER PUBLICATIONS

Hada, H., "Process Technology for ferroelectric random access memory (FeRAM)," FED Review, Mar. 14, 2002, p. 1-7, vol.1, No. 22.
Korean Office Action, with English translation, issued in Korean Patent Application No. KR10-2006-7021560 dated on May 27, 2008.

*Primary Examiner*—Andrew Q Tran
(74) *Attorney, Agent, or Firm*—Schwabe, Williamson & Wyatt, P.C.

(57) ABSTRACT

A memory wherein any "disturb effect" can be suppressed in which data in unselected memory cells are lost. This memory has a memory cell array (1) including bit lines, word lines, which are disposed to intersect the bit lines, and memory cells (12) each connected between bit and word lines. In this memory, an access operation, which includes at least one of read, rewrite and write operations, is made to a selected memory cell (12). During this access operation, it is performed to apply to the memory cell (12) a first voltage pulse, which provides an electrical field in a first direction so as to invert a stored data, and a second voltage pulse, which provides as electrical field in the opposite direction to the first one so as not to invert the stored data. In addition, a recovery operation for recovering a residual polarization amount is made to the memory cell (12).

10 Claims, 18 Drawing Sheets

U.S. PATENT DOCUMENTS

| | | | |
|---|---|---|---|
| 5,487,029 A | | 1/1996 | Kuroda |
| 5,550,770 A | | 8/1996 | Kuroda |
| 5,907,483 A | | 5/1999 | Iio et al. |
| 5,986,919 A | * | 11/1999 | Allen et al. ................. 365/145 |
| 6,067,244 A | * | 5/2000 | Ma et al. .................... 365/145 |
| 6,720,096 B1 | | 4/2004 | Matsushita et al. |
| 7,167,386 B2 | | 1/2007 | Matsushita |
| 7,525,830 B2 | * | 4/2009 | Kang .......................... 365/65 |
| 2003/0179610 A1 | | 9/2003 | Sakai |

FOREIGN PATENT DOCUMENTS

| | | |
|---|---|---|
| JP | 6-77434 A | 3/1994 |
| JP | 7-73682 A | 3/1995 |
| JP | 2000-235789 A | 8/2000 |
| JP | 2001-210795 A | 8/2001 |
| JP | 2002-343078 A | 11/2002 |
| JP | 2003-7051 A | 1/2003 |
| JP | 2004-47045 A | 2/2004 |

* cited by examiner

X2 : 00001111
X1 : 00110011
X0 : 01010101

PRIOR ART

FERROELECTRIC MEMORY HAVING A REFRESH CONTROL CIRCUIT CAPABLE OF RECOVERING RESIDUAL POLARIZATION OF UNSELECTED MEMORY CELLS

TECHNICAL FIELD

The present invention relates to a memory.

BACKGROUND ART

In general, a ferroelectric memory is known as one of nonvolatile memories. Such a ferroelectric memory is disclosed in Japanese Patent Laying-Open No. 2001-210795, for example. This conventional ferroelectric memory is a memory utilizing a pseudo-capacitance change responsive to the direction of polarization of a ferroelectric substance as a memory device. The ferroelectric memory is spotlighted as an ideal memory having both of such an advantage that the same can rewrite data at a high speed with a low voltage in principle and such an advantage that the same is nonvolatile.

FIG. 33 is an equivalent circuit diagram showing a memory cell array of an exemplary conventional simple matrix ferroelectric memory. FIG. 34 is a hysteresis diagram for illustrating operations of the exemplary conventional simple matrix ferroelectric memory. Referring to FIG. 33, a memory cell 501 of the exemplary conventional simple matrix ferroelectric memory is constituted of single ferroelectric capacitors 501a consisting of word lines WL and bit lines BL formed to extend in directions intersecting with each other and ferroelectric films (not shown) arranged between the word lines WL and the bit lines BL.

Operations of the exemplary conventional simple matrix ferroelectric memory are now described with reference to FIGS. 33 and 4. Table 1 shows voltages applied to the word lines WL and the bit lines BL in a read operation and a write operation.

TABLE 1

|  | Standby | Read | Write"1" | Write"0" |
|---|---|---|---|---|
| Selected WL | ½ Vcc | Vcc | 0 | Vcc |
| Unselected WL | ½ Vcc | ⅓ Vcc | ⅔ Vcc | ⅓ Vcc |
| Selected BL | ½ Vcc | 0→Floating | Vcc | 0 |
| Unselected BL | ½ Vcc | ⅔ Vcc | ⅓ Vcc | ⅔ Vcc |

As the write operation, both ends of the ferroelectric capacitors 501a are at the same potentials in a standby state. When writing data "0", the memory applies a voltage Vcc to a selected word line WL (selected WL) while applying a voltage 0 V to a selected bit line BL (selected BL). At this time, a potential difference Vcc is applied to the ferroelectric capacitors 501a. Thus, the polarization state of the ferroelectric capacitor 501a of a selected memory cell 501 shifts to a point A shown in FIG. 34. When the memory thereafter sets both ends of the ferroelectric capacitor 501a to the same potential, the polarization state of the ferroelectric capacitor 501a makes a transition to "0" shown in FIG. 34. When writing data "1", the memory applies the voltage 0 V to the selected WL while applying the voltage Vcc to the selected BL. At this time, a potential difference −Vcc is applied to the ferroelectric capacitors 501a (see FIG. 33). Thus, the polarization state of the ferroelectric capacitor 501a of the selected memory cell 501 shifts to a point B in FIG. 34. When the memory thereafter sets both ends of the ferroelectric capacitor 501a to the same potential, the polarization state of the ferroelectric capacitor 501a (see FIG. 33) makes a transition to "1" shown in FIG. 34.

As the read operation, the memory first precharges the selected BL to the voltage 0 V, and thereafter brings the same into a floating state. Then, the memory sets up the selected WL to the voltage Vcc. The current potential difference Vcc between the selected WL and the selected BL is capacitance-divided by CFE and CBL assuming that CFE represents the capacitance of the ferroelectric capacitor 501a (see FIG. 33) and CBL represents the parasitic capacitance of the selected bit line BL. The capacitance CFE of the ferroelectric capacitor 501a can be approximated as C0 or C1 depending on held data ("0" or "1"). Therefore, the potential of the selected bit line BL is expressed by the following expressions (1) and (2):

$$V0 = \{C0/(C0+CBL)\} \times Vcc \quad (1)$$

$$V1 = \{C1/(C1+CBL)\} \times Vcc \quad (2)$$

The above expression (1) indicates the potential V0 of the selected BL when data "0" is held, and the above expression (2) indicates the potential V1 of the selected BL when data "1" is held.

The memory performs data reading by determining the potential difference between the bit line potential V0 of the above expression (1) and the bit line potential V1 of the above expression (2) with a read amplifier. Since data of the memory cell 501 is destroyed in this data reading, the memory performs a rewrite operation (restore) responsive to the read data after the data reading.

In the exemplary conventional simple matrix ferroelectric memory shown in FIG. 33, however, it follows that a potential difference of ⅓ Vcc is applied to all unselected memory cells 501 in the write operation and the read operation, and hence there is such inconvenience that the quantity of polarization of the ferroelectric capacitor 501a decreases due to hysteretic properties of the ferroelectric film, as shown in FIG. 35. Consequently, there is such a problem that such a disturbance phenomenon takes place that data are lost from the unselected memory cells 501.

DISCLOSURE OF THE INVENTION

The present invention has been proposed in order to solve the aforementioned problem, and an object of the present invention is to provide a memory capable of suppressing such a disturbance phenomenon that data are lost from unselected memory cells.

In order to attain the aforementioned object, a memory according to a first aspect of the present invention comprises a memory cell array including a bit line, a word line arranged to intersect with the bit line and a memory cell connected between the bit line and the word line, for applying a first voltage pulse providing an electrical field in a first direction inverting stored data and a second voltage pulse providing an electrical field in a direction opposite to the first direction, not inverting stored data to the memory cell through an access operation, including at least one of a read operation, a rewrite operation and a write operation, performed on a selected memory cell, and performing a recovery operation for recovering a quantity of residual polarization on the memory cell.

In this memory according to the first aspect, as hereinabove described, deterioration of the quantity of residual polarization and cancellation (recovery) of the deterioration are performed in an unselected memory cell by applying the first voltage pulse and the second voltage pulse of the mutually opposite directions to the unselected memory cell through the access operation including at least one of the reading, the rewrite operation and the write operation performed on the selected memory cell, whereby the quantity of residual polarization of the unselected memory cell can be inhibited from unilateral deterioration. Thus, a disturbance phenomenon on the unselected memory cell can be suppressed. Also when deterioration of the quantity of residual polarization takes place in an arbitrary memory cell through the access operation, the quantity of residual polarization of the memory cell causing deterioration of the quantity of residual polarization can be recovered by performing the recovery operation for recovering the quantity of residual polarization on the memory cell. Thus, occurrence of a disturbance phenomenon of the memory call resulting from occurrence of deterioration of the quantity of residual polarization can be reliably suppressed also when deterioration of the quantity of residual polarization takes place in an arbitrary memory cell through the access operation.

In the aforementioned memory according to the first aspect, the recovery operation is preferably so performed that a quantity of residual polarization allowing determination of stored data is maintained in the memory cell other than the memory cell subjected to the recovery operation. According to this structure, the memory cell other than the memory cell subjected to the recovery operation can be inhibited from occurrence of a disturbance phenomenon resulting from deterioration of the quantity of residual polarization while recovering the memory cell subjected to the recovery operation from deterioration of the quantity of residual polarization through the recovery operation.

The aforementioned memory according to the first aspect preferably performs the recovery operation after deterioration of a quantity of residual polarization exceeding a prescribed quantity takes place in an arbitrary memory cell due to the access operation. According to this structure, the operating time of the recovery operation can be remarkably reduced as compared with a case of regularly performing the recovery operation every access operation. Thus, the memory can inhibit the number of operations thereof from increase also when performing the recovery operation.

In the aforementioned memory according to the first aspect, the memory cell preferably includes a selected memory cell linked to a selected bit line and a selected word line and an unselected memory cell other than the selected memory cell, and the recovery operation is preferably performed by applying the first voltage pulse providing an electrical field in the first direction and the second voltage pulse providing an electrical field in the direction opposite to the first direction to the memory cell through read and rewrite operations performed on the selected memory cell and varying a technique for applying the first voltage pulse and the second voltage pulse to the memory cell with a case where data read by the read operation is first data and a case where the data is second data. According to this structure, the memory can suppress unilateral deterioration of the quantity of residual polarization taking place in the unselected memory cell by the first voltage pulse and the second voltage pulse of mutually opposite directions applied to the unselected memory cell while recovering the selected memory cell from deterioration of the quantity of residual polarization by the read and rewrite operations performed on the selected memory cell in the recovery operation. Thus, the memory can inhibit the unselected memory cell from occurrence of deterioration of the quantity of residual polarization while recovering the selected memory cell from deterioration of the quantity of residual polarization, thereby suppressing occurrence of a disturbance phenomenon resulting from deterioration of the quantity of residual polarization in all memory cells. Further, the memory can apply voltages of mutually opposite directions to the unselected memory cell by necessary frequencies separately in the case where the data is the first data and in the case where the data is the second data respectively by varying the technique for applying the first voltage pulse and the second voltage pulse to the memory cell with the case where the data read by the read operation in the recovery operation is the first data and the case where the data is the second data.

In this case, the recovery operation is preferably performed by applying the first voltage pulse and the second voltage pulse to the memory cell by the same frequencies respectively through read and rewrite operations performed on the selected memory cell. According to this structure, the memory can reliably cancel deterioration of the quantity of residual polarization caused in the unselected memory cell.

In the aforementioned memory according to the first aspect, the recovery operation is preferably performed one by one on all memory cells linked to the selected word line. According to this structure, the memory can easily recover all memory cells linked to the selected word line from deterioration of the quantities of residual polarization. Thus, the memory can easily recover all memory cells included in the memory cell array from deterioration of the quantities of residual polarization when successively selecting all word lines included in the memory cell array and performing the recovery operation one by one on all memory cells linked to the selected word lines.

In the aforementioned memory according to the first aspect, the recovery operation is preferably collectively performed on all memory cells linked to the selected word line. According to this structure, the memory can easily recover all memory cells linked to the selected word line from deterioration of the quantities of residual polarization. Thus, the memory can easily recover all memory cells included in the memory cell array from deterioration of the quantities of residual polarization when successively selecting all word lines included in the memory cell array and collectively performing the recovery operation on all memory cells linked to the selected word lines.

The aforementioned memory according to the first aspect preferably further comprises a recovery operation control circuit for starting the recovery operation on the memory cell on the basis of the fact that deterioration of a quantity of residual polarization exceeding a prescribed quantity has taken place in the memory cell due to the access operation. According to this structure, the memory can easily perform the recovery operation on the memory cell with the recovery operation control circuit after deterioration of the quantity of residual polarization exceeding the prescribed quantity has taken place in the memory cell.

In this case, the memory preferably further comprises a dummy cell to which a third voltage pulse providing an electrical field in the first direction and having a voltage substantially identical to the first voltage pulse and a fourth voltage pulse providing an electrical field in the direction opposite to the first direction and having a voltage substantially identical to the second voltage pulse are applied in correspondence to that the first voltage pulse and the second voltage pulse are applied to the memory cell through the access operation, and the recovery operation control circuit preferably starts the recovery operation on the memory cell in response to the fact that deterioration of a quantity of residual polarization exceeding a prescribed quantity has taken place in the dummy cell. According to this structure, the memory can easily start the recovery operation on the memory cell with the recovery operation control circuit in response to the fact that deterioration of the quantity of residual polarization exceeding the prescribed quantity has taken place in the dummy cell having the same polarization characteristics as the memory cell through the access operation.

In the aforementioned memory according to the first aspect, the memory cell preferably includes a ferroelectric capacitor, the memory preferably applies a voltage pulse of a high voltage having a prescribed pulse width to the selected memory cell while applying a voltage pulse of a low voltage having the prescribed pulse width on an unselected memory cell at least either in the access operation or in the recovery operation, and the prescribed pulse width is preferably set to a pulse width causing polarization inversion when the memory applies the voltage pulse of a high voltage to the ferroelectric capacitor while substantially causing no polarization inversion when the memory applies the voltage pulse of a low voltage to the ferroelectric capacitor. According to this structure, the memory can perform writing or reading following polarization inversion on the selected memory cell while causing substantially no polarization inversion on the unselected memory cell at least either in the access operation or in the recovery operation. Consequently, the memory can more effectively avoid the disturbance phenomenon in the unselected memory cell at least either in the access operation or in the recovery operation.

A memory according to a second aspect of the present invention comprises a memory cell array including a plurality of memory blocks each having a plurality of nonvolatile memory cells, a refresh portion for performing rewriting on the memory cells, a first frequency detecting portion detecting access frequencies with respect to all memory cells in the memory cell array and an access operation detecting portion detecting an access operation every prescribed number of memory cells, and the refresh portion performs rewriting on the memory cells included in at least one memory cell block to which the prescribed number of memory cells belong on the basis of the fact that it has been detected by the first frequency detecting portion that the sum of the access frequencies with respect to all memory cells has reached a prescribed frequency and results of detection of the access operation detecting portion.

In this memory according to the second aspect, as hereinabove described, the access operation detecting portion detecting the access operation every prescribed number of memory cells is provided and the refresh portion is so formed as to perform rewriting on the memory cells included in at least one memory cell block to which the prescribed number of memory cells belong on the basis of the results of detection of the access operation detecting portion so that the memory can perform rewriting restrictively to the memory cells in the memory cell block to which the prescribed number of memory cells belong, whereby the memory can reduce the frequency by which memory cells already subjected to rewriting (refresh) are subjected to disturbance resulting from a refresh operation of other memory cells as compared with a case of successively performing rewriting on all memory cells included in the memory cell array in the refresh operation. Thus, the memory can reduce the frequency of disturbance caused in the memory cells in refreshing. Further, the refresh portion is so formed as to perform rewriting on the basis of the fact that it has been detected by the first frequency detecting portion that the sum of the access frequencies on all memory cells has reached the prescribed frequency, whereby the memory can periodically perform the refresh operation every constant access frequency dissimilarly to a case of detecting the access frequency with respect to each memory cell block and performing the refresh operation every prescribed access frequency with respect to each memory cell block. Thus, the memory can periodically exercise control such as that for temporarily bringing an ordinary access operation into a standby state in the refresh operation every constant access frequency, whereby control of the memory can be simplified.

In the aforementioned memory according to the second aspect, the access operation detecting portion preferably includes a first holding portion holding presence/absence of an access operation every memory cell block, and the refresh portion preferably performs rewriting on the memory cells included in at least one memory cell block on the basis of the fact that it has been detected by the first frequency detecting portion that the sum of the access frequencies with respect to all memory cells has reached a prescribed frequency and the fact that it is held by the first holding portion that there has been an access operation with respect to the corresponding memory cell block. According to this structure, the memory can easily perform rewriting restrictively on the memory cells in the memory cell block subjected to the access operation, thereby easily reducing the frequency of disturbance caused in the memory cells in refreshing.

In the aforementioned memory according to the second aspect, the access operation detecting portion preferably includes a second frequency detecting portion detecting an access frequency every memory cell block, and the refresh portion preferably performs rewriting on all memory cells included in at least one memory cell block on the basis of the fact that it has been detected by the first frequency detecting portion that the sum of the access frequencies with respect to all memory cells has reached a prescribed frequency and the fact that it has been detected by the second frequency detecting portion that the access frequency with respect to the corresponding memory cell block has reached a prescribed frequency. According to this structure, the memory can easily select a memory cell block requiring a refresh operation through the fact that the access frequency has reached the prescribed frequency and perform the refresh operation.

The aforementioned memory according to the second aspect preferably further comprises a plurality of word lines to which the prescribed number of memory cells are connected respectively, the access operation detecting portion preferably includes a first holding portion holding presence/absence of an access operation every word line, and the refresh portion preferably performs rewriting on the memory cells included in the memory cell block corresponding to at least one word line on the basis of the fact that it has been detected by the first frequency detecting portion that the sum of the access frequencies with respect to all memory cells has reached a prescribed frequency and the fact that it is held by the first holding portion that there has been an access operation with respect to the corresponding word line. According to this structure, the memory can easily perform rewriting restrictively on the memory cells in the memory cell block corresponding to the word line subjected to the access operation, thereby easily reducing the frequency of disturbance caused in the memory cells in refreshing.

In this case, the first holding portion is preferably provided every word line. According to this structure, the memory can easily select the memory cell block corresponding to the word line subjected to the access operation on the basis of the first holding portion.

In the aforementioned structure including the first holding portion holding presence/absence of the access operation every word line, the memory preferably further comprises a second frequency detecting portion detecting an access frequency every memory cell block, all first holding portions corresponding to at least one memory cell block are preferably changed to such a state that it is held that there has been no access operation if it is held by all first holding portions corresponding to at least one memory cell block that there has been an access operation when it has been detected by the second frequency detecting portion that an access frequency with respect to at least one memory cell block has reached a prescribed frequency, and the refresh portion preferably performs no rewriting on the memory cells included in at least one memory cell block when it is held by all first holding portions corresponding to at least one memory cell block that there has been no access operation. According to this structure, the memory can perform no rewriting on a memory cell block conceivably less influenced by disturbance due to a relatively uniformly performed access operation on the memory cells through performance of the access operation through all corresponding word lines. Thus, the memory can reduce the frequency for performing rewriting through the refresh operation, thereby reducing the frequency of disturbance caused in the memory cells in refreshing also by this.

In this case, the second frequency detecting portion is preferably provided every memory cell block. According to this structure, the memory can easily detect the access frequency every memory cell block with the second frequency detecting portion.

In the aforementioned memory according to the second aspect, the refresh portion preferably performs rewriting on the memory cells in a power-up state. According to this structure, the memory can perform the refresh operation on the memory cells every time entering a power-up state. Also when the memory is brought into a power-off state before the access frequency with respect to the memory cells reaches the prescribed frequency for performing the refresh operation and hence data of the access frequency detected in a counter before the refresh operation is lost, therefore, the memory can refresh the memory cells in a subsequent power-up state. Consequently, the memory can prevent the memory cells from accumulation of disturbance also when repeatedly brought into the power-up and power-down states, whereby loss of data resulting from disturbance can be reliably suppressed.

In this case, the memory preferably further comprises a power-up detecting portion detecting a power-up state, and the refresh portion preferably performs rewriting on the memory cells on the basis of a result of detection of the power-up detecting portion. According to this structure, the memory can easily perform rewriting on the memory cells in the power-up state.

A memory according to a third aspect of the present invention comprises a nonvolatile memory cell and a refresh portion for performing rewriting on the memory cell, and the refresh portion performs reading and rewriting on the memory cell in a power-up state.

As hereinabove described, this memory according to the third aspect can perform a refresh operation on the memory cell every power-up state by performing reading and rewriting on the memory cell with the refresh portion in the power-up state. Thus, the memory can inhibit the memory cell from accumulation of disturbance caused by an access operation before the same enters a power-down state also when repeating an operation of entering a power-down state before reaching a prescribed frequency and thereafter entering a power-up state. Consequently, the memory can suppress loss of data from the memory cell caused by accumulated disturbance.

The aforementioned memory according to the third aspect preferably further comprises a first frequency detecting portion detecting an access frequency with respect to the memory cell, and the refresh portion preferably performs reading and rewriting on the memory cell on the basis of the fact that it has been detected by at least the first frequency detecting portion that the sum of the access frequency with respect to the memory cell has reached a prescribed frequency in addition to the power-up state. According to this structure, the memory can perform reading and rewriting on the memory cell also when it has been detected by at least the first frequency detecting portion that the sum of the access frequency with respect to the memory cell has reached the prescribed frequency in addition to the power-up state. Thus, the memory can more reliably suppress loss of data resulting from disturbance.

The aforementioned memory according to the third aspect is preferably provided with a plurality of memory cells and preferably further comprises a memory cell array including a plurality of memory cell blocks each having the plurality of memory cells and an access operation detecting portion detecting an access operation every prescribed number of memory cells, and the refresh portion preferably performs reading and rewriting on the memory cells included in at least one memory cell block to which the prescribed number of memory cells belong at least on the basis of a result of detection of the access operation detecting portion in addition to the power-up state. According to this structure, the memory can perform reading and rewriting restrictively on the memory cells in the memory cell block to which the prescribed number of memory cells belong, thereby reducing the frequency by which memory cells already subjected to rewriting (refresh) are subjected to disturbance resulting from a refresh operation of other memory cells as compared with a case of successively performing rewriting on all memory cells included in the memory cell array in the refresh operation. Thus, the memory can reduce the frequency of disturbance caused in the memory cells in refreshing.

In this case, the access operation detecting portion preferably includes a first holding portion holding presence/absence of an access operation every memory cell block, and the refresh portion preferably performs reading and rewriting on the memory cells included in at least one memory cell block on the basis of the fact that it is held by at least the first holding portion that there has been an access operation with respect to the corresponding memory cell block in addition to the power-up state. According to this structure, the memory can easily perform rewriting restrictively on the memory cells in the memory cell block subjected to the access operation, thereby easily reducing the frequency of disturbance caused in the memory cells in refreshing.

In the aforementioned structure including the access operation detecting portion, the access operation detecting portion preferably includes a second frequency detecting portion detecting an access frequency every memory block, and the refresh portion preferably performs reading and rewriting on the memory cells included in at least one memory cell block on the basis of the fact that it has been detected by at least the second frequency detection portion that the access frequency with respect to the corresponding memory cell block has reached a prescribed frequency in addition to the power-up state. According to this structure, the memory can easily select a memory cell block requiring a refresh operation through the fact that the access frequency has reached the prescribed frequency and perform the refresh operation.

In the aforementioned structure including the access operation detecting portion, the memory preferably further comprises a plurality of word lines to which the prescribed number of memory cells are connected respectively, the access operation detecting portion preferably includes a first holding portion holding presence/absence of an access operation every word line, and the refresh portion preferably performs reading and rewriting on the memory cells included in the memory cell block corresponding to at least one word line on the basis of the fact that it is held by at least the first holding portion that there has been an access operation with respect to the corresponding word line in addition to the power-up state. According to this structure, the memory can easily perform reading and rewriting restrictively on the memory cells in the memory cell block corresponding to the word line subjected to the access operation, thereby easily reducing the frequency of disturbance caused in the memory cells in refreshing.

According to the present invention, the following structure is also conceivable: In the aforementioned memory according to the first aspect, the memory cell preferably includes a selected memory cell linked to a selected word line and an unselected memory cell which is a memory cell other than the selected memory cell, and the recovery operation is preferably performed by applying the first voltage pulse providing an electrical field in the first direction and the second voltage pulse providing an electrical field in the direction opposite to the first direction to the memory cell or applying substantially no voltage pulse to the memory cell through read and rewrite operations performed on the selected memory cell. According to this structure, the memory can recover the selected memory cell from deterioration of the quantity of residual polarization by the read and rewrite operations performed on the selected memory cell in the recovery operation. Further, the memory can suppress unilateral deterioration of the quantity of residual polarization when applying the first voltage pulse and the second voltage pulse of mutually opposite directions to the unselected memory cell, and can suppress occurrence of deterioration of the quantity of residual polarization when applying substantially no voltage pulse. Thus, the memory can inhibit all memory cells from occurrence of a disturbance phenomenon resulting from deterioration of the quantities of residual polarization.

In this case, the recovery operation is preferably performed by applying the first voltage pulse and the second voltage pulse to the memory cell by the same frequencies respectively through read and rewrite operations performed on the selected memory cell. According to this structure, deterioration of the quantity of residual polarization caused in the unselected memory cell and cancellation (recovery) of the deterioration are performed by the same frequencies, whereby the memory can reliably suppress deterioration of the quantity of residual polarization.

The aforementioned memory according to the first aspect preferably further comprises a counting portion for counting the access frequency with respect to the memory cell, and the recovery operation is preferably performed every prescribed access frequency with respect to the memory cell counted by the counting portion. According to this structure, the memory can inhibit the number of operations thereof from remarkable increase also when performing the recovery operation in addition to an ordinary access operation, by adjusting the access frequency for performing the recovery operation.

The aforementioned memory according to the first aspect preferably further comprises a counting portion for counting the access frequency with respect to the memory cell, and the recovery operation is preferably performed every time a prescribed access time with respect to the memory cell counted by the counting portion elapses. According to this structure, the memory can inhibit the number of operations thereof from remarkable increase also when performing the recovery operation in addition to an ordinary access operation, by adjusting the access time for performing the recovery operation.

The aforementioned memory according to the third aspect preferably further comprises a power-up detecting portion detecting a power-up state, and the refresh portion preferably performs reading and rewriting on the memory cell in response to the fact that the power-up detecting portion detects the power-up state. According to this structure, the memory can easily perform reading and rewriting (refresh) on the memory cell in the power-up state.

In the aforementioned structure having the access operation detecting portion including the first holding portion holding presence/absence of an access operation every word line, the first holding portion is preferably provided every word line. According to this structure, the memory can easily select a memory cell block corresponding to the word line subjected to the access operation on the basis of the first holding portion.

In the aforementioned structure having the access operation detecting portion including the first holding portion holding presence/absence of an access operation every word line, the memory preferably further comprises a second frequency detecting portion detecting an access frequency every memory cell block, all first holding portions corresponding to at least one memory cell block are preferably changed to such a state that it is held that there has been no access operation if it is held by all first holding portions corresponding to at least one memory cell block that there has been an access operation when it has been detected by the second frequency detecting portion that an access frequency with respect to at least one memory cell block has reached a prescribed frequency, and the refresh portion preferably performs no rewriting on the memory cells included in at least one memory cell block when it is held by all first holding portions corresponding to at least one memory cell block that there has been no access operation. According to this structure, the memory can perform no rewriting on a memory cell block conceivably less influenced by disturbance due to a relatively uniformly performed access operation on the memory cells through performance of the access operation through all corresponding word lines. Thus, the memory can reduce the frequency for performing reading and rewriting through the refresh operation, thereby reducing the frequency of disturbance caused in the memory cells in refreshing also by this.

In this case, the second frequency detecting portion is preferably provided every memory cell block. According to this structure, the memory can easily detect the access frequency every memory cell block with the second frequency detecting portion.

BEST MODES FOR CARRYING OUT THE INVENTION

Figure 1:
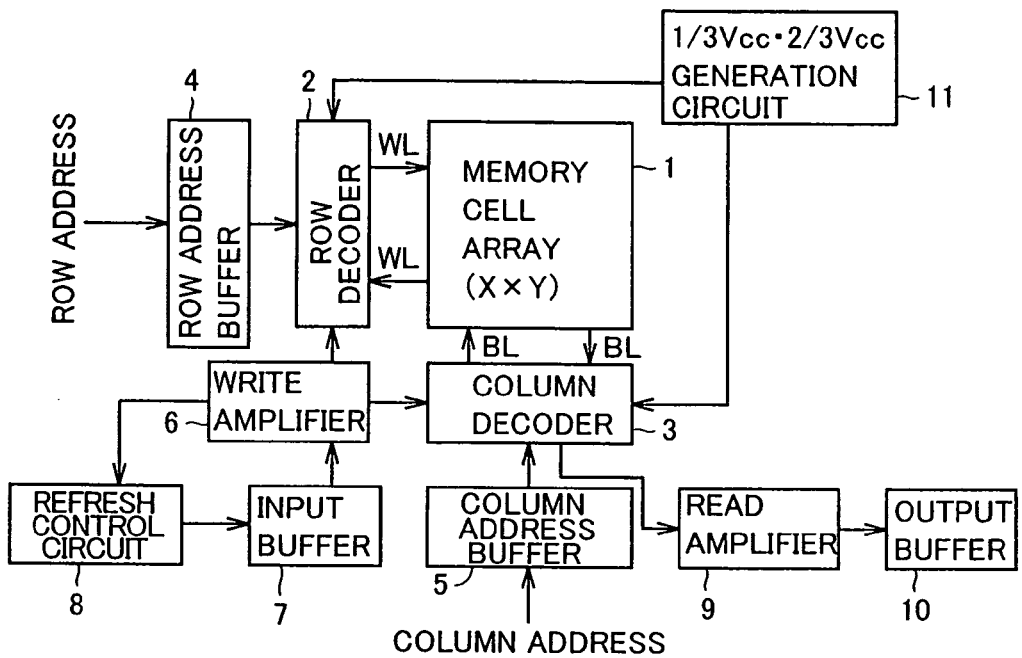
FIG. 1 is a block diagram showing the overall structure of a simple matrix ferroelectric memory according to a first embodiment of the present invention.

Embodiments of the present invention are now described with reference to the drawings.

First Embodiment

First, the structure of a simple matrix ferroelectric memory according to a first embodiment is described with reference to FIGS. 1 to 3. The ferroelectric memory according to the first embodiment comprises a memory cell array 1, a row decoder 2, a column decoder 3, a row address buffer 4, a column address buffer 5, a write amplifier 6, an input buffer 7, a refresh control circuit 8, a read amplifier 9 formed by a voltage sense amplifier, an output buffer 10 and a ⅓ Vcc-⅔ Vcc generation circuit 11. The refresh control circuit 8 is an example of the "recovery operation control circuit" in the present invention.

Figure 2:
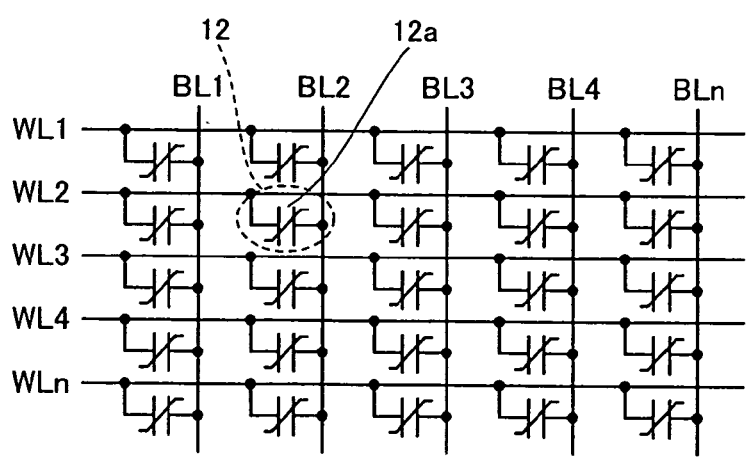
FIG. 2 is an equivalent circuit diagram of a memory cell array of the ferroelectric memory according to the first embodiment shown in FIG. 1.
Figure 3:
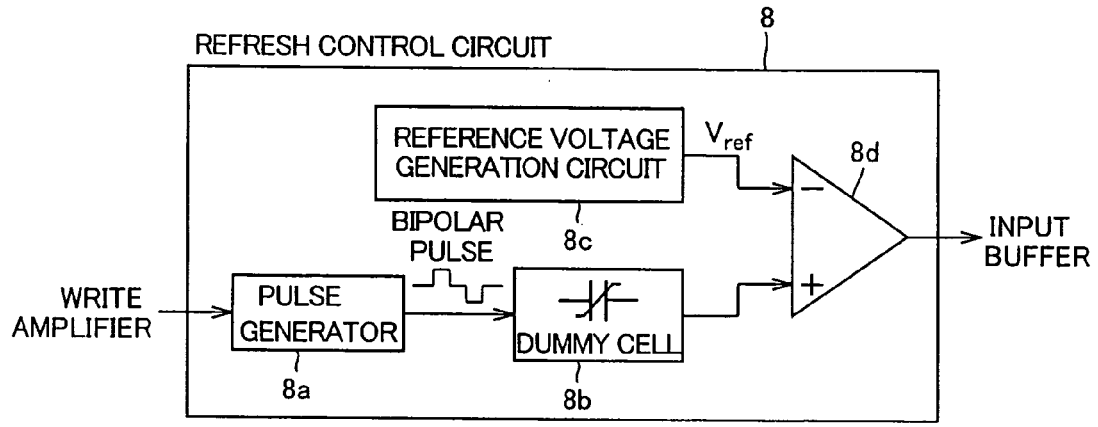
FIG. 3 is a block diagram showing the structure of a refresh control circuit of the ferroelectric memory according to the first embodiment shown in FIG. 1.
Figure 34:
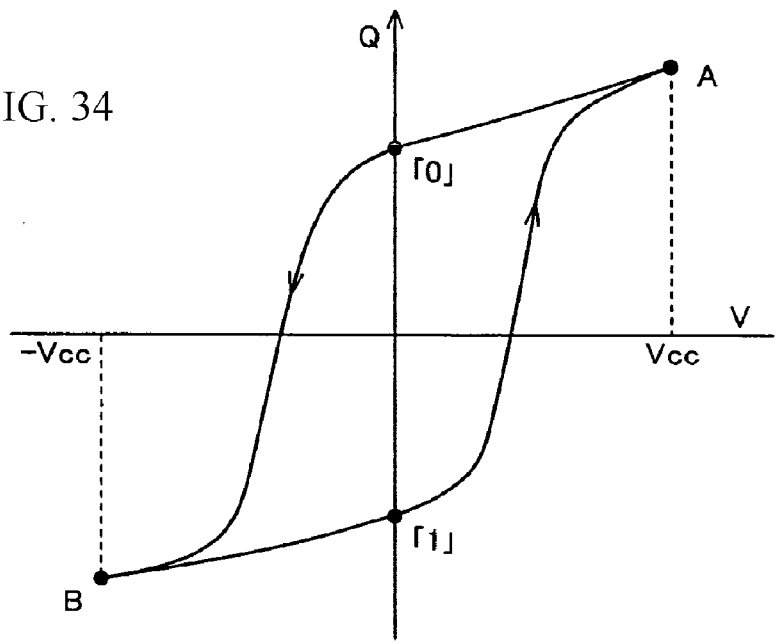
FIG. 34 is a hysteresis diagram for illustrating operations of the exemplary conventional simple matrix ferroelectric memory.
Figure 35:
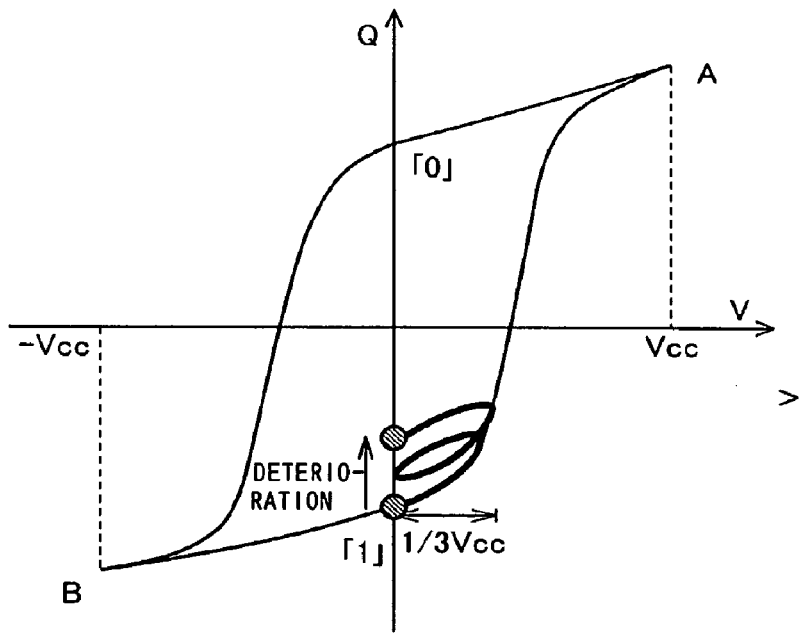
FIG. 35 is a hysteresis diagram for illustrating a disturbance phenomenon in the exemplary conventional simple matrix ferroelectric memory.

The memory cell array 1 includes a plurality of simple matrix memory cells 12 formed by only ferroelectric capacitors 12a, as shown in FIG. 2. In other words, the simple matrix memory cells 12 according to the first embodiment are constituted of the ferroelectric capacitors 12a consisting of word lines WL and bit lines BL formed to extend in directions intersecting with each other and ferroelectric films (not shown) arranged between the word lines WL and the bit lines BL, similarly to the conventional simple matrix memory cells 501 shown in FIG. 34. As shown in FIG. 1, the row decoder 2 is connected to the word lines WL of the memory cell array 1, and the column decoder 3 is connected to the bit lines BL. The ⅓ Vcc-⅔ Vcc generation circuit 11 is connected to the row decoder 2 and the column decoder 3. Thus, voltages ⅓ Vcc and ⅔ Vcc are applicable to unselected word lines WL (unselected WLs) and unselected bit lines BL (unselected BLs). The row decoder 2 and the column decoder 3 are formed to be capable of applying voltages Vcc (power supply voltage or voltage generated on the basis of power supply voltage) and 0 V to a selected word line WL (selected WL) and a selected bit line BL (selected BL).

According to the first embodiment, the refresh control circuit 8 is provided for starting a refresh operation on all memory cells 12 when deterioration of quantities of residual polarization of at least about 10% from quantities of residual polarization immediately after a write operation take place in the memory cells 12 (see FIG. 2). This refresh operation, which is an example of the "recovery operation" in the present invention, is an operation for recovering the quantities of residual polarization of the memory cells 12 to the quantities of residual polarization immediately after the write operation. This refresh control circuit 8 is constituted of a pulse generator 8a, a dummy cell 8b, a reference voltage generation circuit 8c and an operational amplifier 8d, as shown in FIG. 3. The pulse generator 8a has a function of generating a bipolar pulse by receiving an output signal from the write amplifier 6 (see FIG. 1). This bipolar pulse consists of a pair of voltage pulses, providing electrical fields of opposite directions to the dummy cell 8b, having the same voltage. More specifically, the bipolar pulse consists of a voltage pulse +⅓ Vcc and a voltage pulse −⅓ Vcc. The pulse width of these voltage pulses ±⅓ Vcc is set to be identical to the pulse width of a voltage pulse applied to the memory cells 12 (see FIG. 2) in read and rewrite operations and the write operation. The dummy cell 8b consists of a single ferroelectric capacitor similar to the ferroelectric capacitors 12a (see FIG. 2) of the memory cells 12. This dummy cell 8b is so formed that the bipolar pulse consisting of the voltage pulses ±⅓ Vcc is applied from the pulse generator 8a once every time the voltage pulses ±⅓ Vcc are applied to unselected memory cells 12 (see FIG. 2) in the read and rewrite operations and the write operation.

The reference voltage generation circuit 8c is provided for generating a reference voltage Vref. This reference voltage Vref is set to a voltage of about 90% of a read voltage corresponding to the quantities of residual polarization of the memory cells 12 and the dummy cell 8b immediately after the write operation. The operational amplifier 8d is provided for amplifying the difference between a read voltage from the dummy cell 8b and the reference voltage Vref and output the same to the input buffer 7 (see FIG. 1). A positive input terminal (+) of this operational amplifier 8d is supplied with the read voltage responsive to the quantity of residual polarization of the dummy cell 8b from the dummy cell 8b, while a negative input terminal (−) is supplied with the reference voltage Vref from the reference voltage generation circuit 8c. The operational amplifier 8d outputs a voltage pulse of a positive voltage (high level) when the read voltage from the dummy cell 8b is larger than the reference voltage Vref, while outputting a voltage pulse of a negative voltage (low level) when the read voltage from the dummy cell 8b is smaller than the reference voltage Vref. Thus, when the quantity of residual polarization of the dummy cell 8b is so deteriorated by at least about 10% from the quantity of residual polarization immediately after the write operation that the read voltage of the dummy cell 8b is reduced below a voltage of about 90% of the read voltage immediately after the write operation, the voltage pulse of the negative voltage (low level) is output from the operational amplifier 8d. The input buffer 7 (see FIG. 1) receives the voltage pulse of the negative voltage (low level) from the operational amplifier 8d, to output a signal for starting a refresh operation to the write amplifier 6 (see FIG. 1). The ferroelectric memory is so formed as to thereby start the refresh operation on all memory cells 12 of the memory cell array 1.

Figure 4:
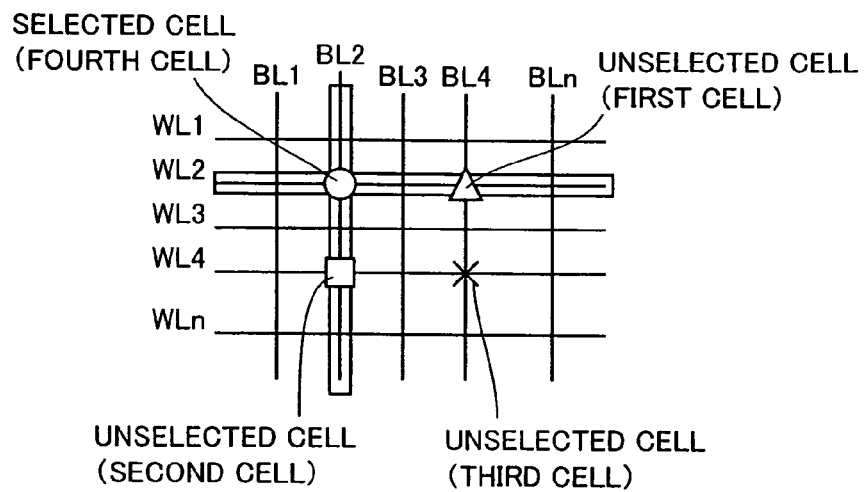
FIG. 4 is a schematic diagram for illustrating a selected cell and unselected cells of the memory cell array according to the first embodiment of the present invention.

Read and rewrite operations in ordinary access, a write operation in the ordinary access and a refresh operation in the simple matrix ferroelectric memory according to the first embodiment are now described. These operations are described on the assumption that a fourth cell located on the intersection between a word line WL2 and a bit line BL2 shown in FIG. 4 is a selected memory cell (hereinafter referred to as a selected cell).

(Read and Rewrite Operations: Ordinary Access Operation)

Figure 5:
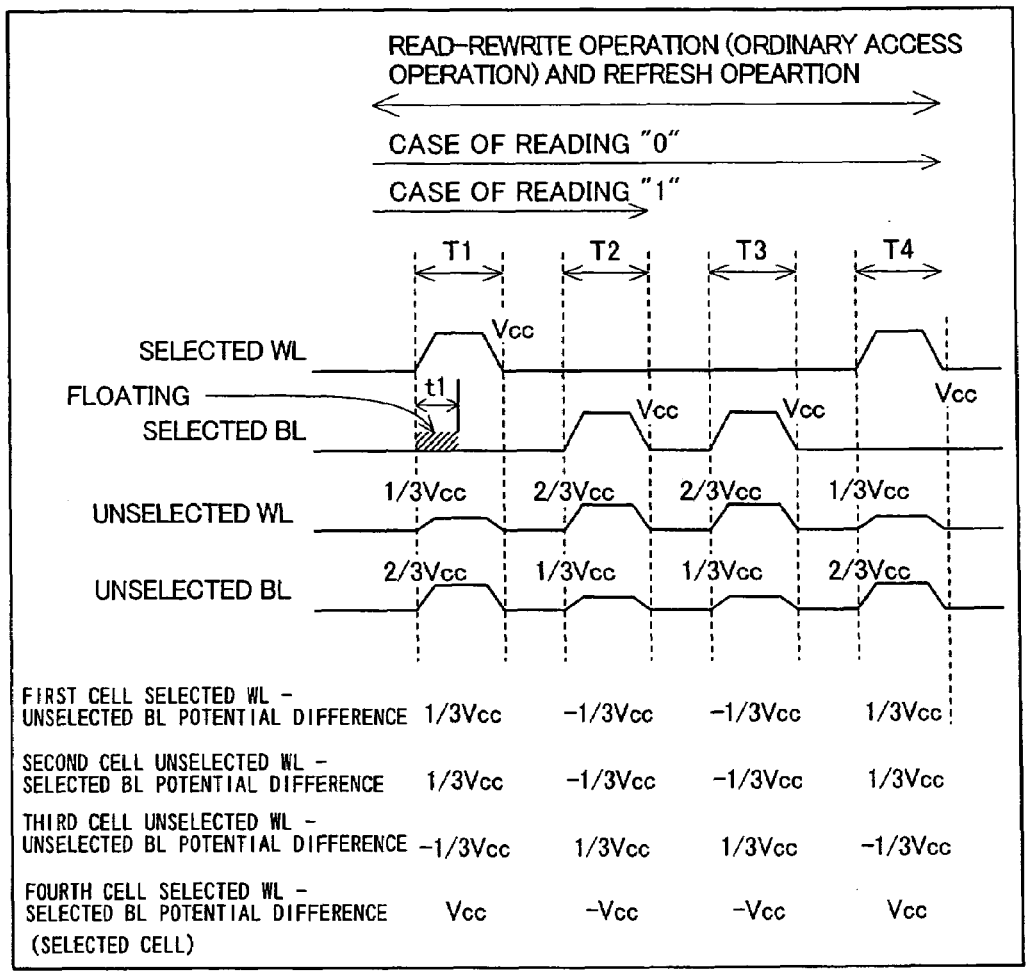
FIG. 5 is a voltage waveform diagram for illustrating read and rewrite operations (ordinary access operation) and a refresh operation according to the first embodiment of the present invention.

The read and rewrite operations according to the first embodiment are now described with reference to FIGS. 1 to 6. It is assumed that times for applying potential differences (voltage pulses) ±⅓ Vcc and ±Vcc to the memory cells in respective periods T1 to T4 shown in FIG. 5 are times (T seconds) identical to each other. Respective operations performed in the periods T1 to T4 may be continuously performed, or may be performed independently of each other.

(1) Read Operation (T1)

In the period T1 shown in FIG. 5, the ferroelectric memory performs a read operation. First, the ferroelectric memory brings the selected BL into a floating state from a standby state (0 V). It is assumed that the time when the selected BL is in the floating state is one second. At the same timing, the ferroelectric memory sets up the selected WL, the unselected WLs and the unselected BLs to the potentials Vcc, ⅓ Vcc and ⅔ Vcc respectively. In this state, the ferroelectric memory determines data "0" or data "1" by sensing the potential (read potential) of the selected BL. The ferroelectric memory performs this determination of the data "0" or "1" by comparing and amplifying the potential (read potential) of the selected BL and the separately generated reference potential with the read amplifier 9 (see FIG. 1) which is a voltage sense amplifier. Further, the ferroelectric memory returns the selected BL to the potential 0 V again after termination of the determination of the data "0" or "1". Thereafter the ferroelectric memory holds the selected BL at the potential 0 V, while entirely returning the selected WL, the unselected WLs and the unselected BLs to the potential 0 V, thereby temporarily returning the same to the standby state.

In this case, the potential difference ⅓ Vcc is applied to a first cell (see FIG. 4) which is an unselected cell located on the intersection between the selected WL and an unselected BL for T seconds. ⅓ Vcc–the potential (floating potential) of the selected BL is applied to a second cell which is an unselected cell located on the intersection between an unselected WL and the selected BL for t1 seconds, while the potential difference −⅓ Vcc is applied to a third cell which is an unselected cell located on the intersection between an unselected WL and an unselected BL for T seconds. To the fourth cell located between the selected WL and the selected BL, a potential difference Vcc–the potential (floating potential) of the selected BL is applied for t1 seconds, and thereafter the potential difference Vcc is applied for T−t1 seconds.

It is assumed that the aforementioned t1 seconds are set to a sufficiently short period t1 so that a change of the quantity of polarization resulting from ⅓ Vcc–the potential of the selected BL received in t1 seconds is sufficiently small as compared with a change of the quantity of polarization resulting from ⅓ Vcc received in T1–t1 seconds in the second cell which is the unselected cell located between the unselected WL and the selected BL and a change of the quantity of polarization in the period T1 reaches a quantity substantially identical to a change of the quantity of polarization caused in the periods T2 to T4 after the period T1 due to application of ⅓ Vcc for T–t1 seconds. Thus, the ferroelectric memory can change the quantities of residual polarization in the read operation in this period T1 as follows: In the first cell which is an unselected cell, deterioration of the quantity of residual polarization takes place if data "1" is held, while recovery of the quantity of residual polarization takes place if data "0" is held. In the second cell which is an unselected cell, deterioration of the quantity of residual polarization takes place if data "1" is held, while recovery of the quantity of residual polarization (cancellation of deterioration) takes place if data "0" is held. In the third cell which is an unselected cell, recovery of the quantity of residual polarization takes place if data "1" is held, while deterioration of the quantity of residual polarization takes place if data "0" is held. In the fourth cell which is a selected cell, data "1" is broken and data "0" is written if the data "1" is held, while the quantity of residual polarization of data "0" is held if the data "0" is held. The aforementioned deterioration of the quantity of residual polarization denotes that the quantity of charges stored in the ferroelectric capacitor 12a (see FIG. 2) is reduced, and the recovery of the quantity of residual polarization (cancellation) denotes that the reduced quantity of charges increases.

(2) Data "1" Rewrite Operation (T2)

In the period T2, the ferroelectric memory holds the selected WL at the potential 0 V, while setting up the selected BL, the unselected WLs and the unselected BLs to the potentials Vcc, ⅔ Vcc and ⅓ Vcc respectively. Then, the ferroelectric memory holds the selected WL at 0 V, while entirely returning the selected WL, the unselected WLs and the unselected BLs to the potential 0 V, thereby temporarily returning the same to the standby state. In this period T2, the following potential differences are applied to the first to fourth cells: The potential differences –⅓ Vcc, –⅓ Vcc and ⅓ Vcc are applied to the first, second and third cells which are unselected cells for T seconds respectively. Thus, in the first cell which is an unselected cell, recovery of the quantity of residual polarization takes place if data "1" is held, while deterioration of the quantity of residual polarization takes place if data "0" is held. In the second cell which is an unselected cell, recovery of the quantity of residual polarization takes place if data "1" is held, while deterioration of the quantity of residual polarization takes place if data "0" is held. In the third cell which is an unselected cell, deterioration of the quantity of residual polarization takes place if data "1" is held, while recovery of the quantity of residual polarization takes place if data "0" is held.

Figure 6:
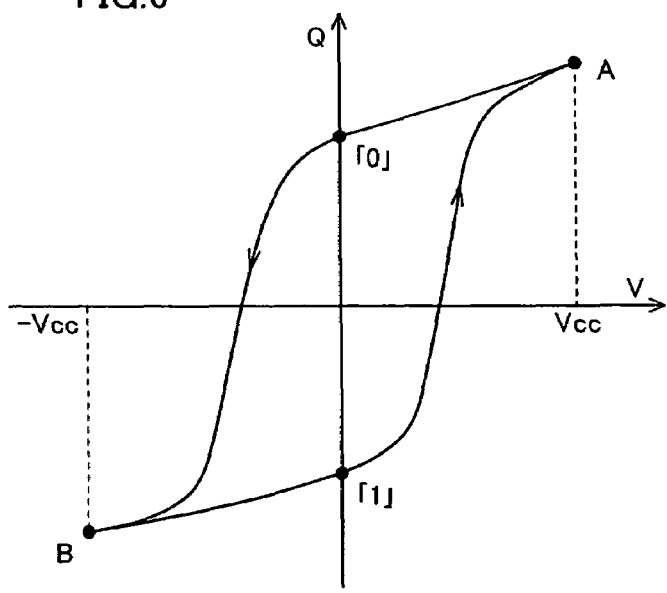
FIG. 6 is a hysteresis diagram for illustrating operations of the ferroelectric memory according to the first embodiment of the present invention.

In the fourth cell which is the selected cell, the potential difference –Vcc is applied for T seconds, whereby a rewrite operation for data "1" is completed in an operation of this period T2 if data "1" has been read in the read operation in the period T1. In other words, if the fourth cell which is the selected cell has held data "1", the polarization state of the fourth cell makes a transition from "1" to "0" through the point A in the period T1 and thereafter makes a transition from "0" to "1" through the point B in the period T2, as shown in FIG. 6. If data "1" has been read in the selected cell in the period T1, therefore, the ferroelectric memory terminates the read and rewrite operations at the point of termination of this period T2.

(3) Compensatory Operation for Rewriting Data "0" (T3)

In the period T3, the ferroelectric memory holds the selected WL at the potential 0 V while setting up the selected BL, the unselected WLs and the unselected BLs to the potentials Vcc, ⅔ Vcc and ⅓ Vcc respectively. Then, the ferroelectric memory holds the selected WL at 0 V, while entirely returning the selected BL, the unselected WLs and the unselected BLs to the potential 0 V, thereby temporarily returning the same to the standby state. In this period T3, the following potential differences are applied to the first to fourth cells for T seconds: More specifically, the potential differences –⅓ Vcc, –⅓ Vcc and ⅓ Vcc are applied to the first, second and third cells which are unselected cells for T seconds respectively. Further, the potential difference –Vcc is applied to the fourth cell which is the selected cell for T seconds. In the first cell which is an unselected cell, recovery of the quantity of residual polarization takes place if data "1" is held while deterioration of the quantity of residual polarization takes place if data "0" is held due to this application of the potential difference. In the second cell which is an unselected cell, recovery of the quantity of residual polarization takes place if data "1" is held, while deterioration of the quantity of residual polarization takes place if data "0" is held. In the third cell which is an unselected cell, deterioration of the quantity of residual polarization takes place if data "1" is held, while recovery of the quantity of residual polarization takes place if data "0" is held. The fourth cell which is the selected cell enters a state for writing data "1" again although held data has become "1" due to the operation in the aforementioned period T2.

(4) Data "0" Rewrite Operation (T4)

In the period T4, the ferroelectric memory holds the selected BL at the potential 0 V, while setting up the selected WL, the unselected WLs and the unselected BLs to the potentials Vcc, ⅓ Vcc and ⅔ Vcc respectively. Then, the ferroelectric memory holds the selected BL at 0 V, while entirely returning the selected WL, the unselected WLs and the unselected BLs to the potential 0 V, thereby temporarily returning the same to the standby state. In this period T4, the potential differences ⅓ Vcc, ⅓ Vcc and –⅓ Vcc are applied to the first, second and third cells which are unselected cells for T seconds respectively. Further, the potential difference Vcc is applied to the fourth cell which is the selected cell for T seconds. Thus, in the first cell which is an unselected cell, deterioration of the quantity of residual polarization takes place if data "1" is held, while recovery of the quantity of residual polarization takes place if data "0" is held. In the second cell which is an unselected cell, deterioration of the quantity of residual polarization takes place if data "1" is held, while recovery of the quantity of residual polarization takes place if data "0" is held. In the third cell which is an unselected cell, recovery of the quantity of residual polarization takes place if data "1" is held, while deterioration of the quantity of residual polarization takes place if data "0" is held. The fourth cell which is the selected cell is in a state where data "0" has been rewritten due to the application of the potential difference Vcc. The ferroelectric memory terminates the series of read and rewrite operations through the operation in this period T4.

When data "0" is read in the read operation in the period T1, the polarization state changes in the following manner so that data "0" is rewritten: If the fourth cell which is the selected cell has held data "0", the polarization state of the fourth cell makes a transition from "0" to the point A in the period T1 and thereafter returns to "0", as shown in FIG. 6. Thereafter the polarization state makes a transition from "0" to "1" through the point B in the period T2. Then, the polarization state makes a transition from "1" to the point B and thereafter returns to "1" in the period T3. Then, the polarization state makes a transition from "1" to "0" through the point A in the period T4. Thus, data "0" is rewritten in the selected cell.

According to this first embodiment, the ferroelectric memory advances to the operation in the period T2 if data "1" is read in the read and rewrite operations of the ordinary access, and advances to the operation in the period T4 if data "0" is read. Thereafter the ferroelectric memory shifts to subsequent read and rewrite operations respectively. In the read and rewrite operations of the ordinary access according to this first embodiment, the frequencies of deterioration of the quantities of residual polarization and the frequencies of recovery of the quantities of residual polarization are equal to each other in both of the case where data "1" is read and the case where data "0" is read. Also when the ferroelectric memory repetitively performs the read and rewrite operations, therefore, deterioration of the quantities of residual polarization is hardly accumulated in the unselected cells.

In other words, the ferroelectric memory alternately applies the voltages (voltage pulses) ±⅓ Vcc to the first and third cells among the unselected cells while alternately applying ⅓ Vcc–the voltage (voltage pulse) of the selected bit line and the voltage (voltage pulse) ⅓ Vcc and the voltage (voltage pulse)–⅓ Vcc to the second cell among the unselected cells in directions canceling deterioration of the quantities of residual polarization of the unselected cells throughout the read and rewrite operations in the read and rewrite operations of the ordinary access according to the first embodiment, thereby effectively suppressing loss of data (disturbance phenomenon) from the unselected cells resulting from deterioration of the quantities of residual polarization dissimilarly to a case of repetitively applying only the voltage (voltage pulse) ⅓ Vcc to the unselected cells. The voltage pulses alternately applied in this case are examples of the "first voltage pulse in the first direction inverting stored data" and the "second voltage pulse, in the direction opposite to the first direction, not inverting the stored data" in the present invention respectively.

(Write Operation: Ordinary Access Operation)

The write operation according to the first embodiment of the present invention is now described with reference to FIGS. 4 and 6 to 8.

Figure 7:
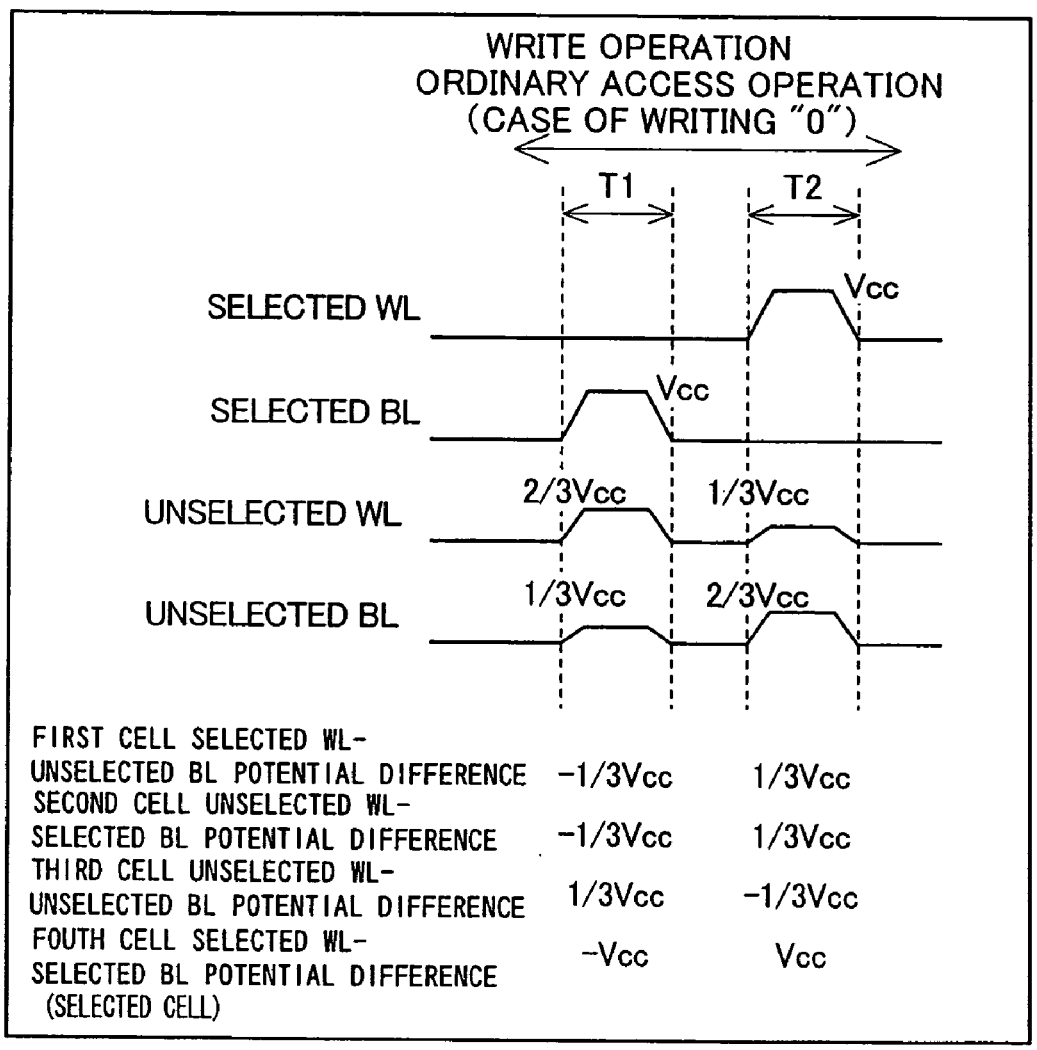
FIG. 7 is a voltage waveform diagram for illustrating a write operation (ordinary access operation) according to the first embodiment of the present invention.

In a case of writing data "0", the ferroelectric memory writes data "1" reverse to data "0" in the period T1, as shown in FIG. 7. Thereafter the ferroelectric memory writes data "0" in the period T2. More specifically, the ferroelectric memory holds the selected WL at the potential 0 V from the standby state (0 V), while setting up the selected BL, the unselected WLs and the unselected BLs to the potentials Vcc, ⅔ Vcc and ⅓ Vcc respectively in the period T1. Then, the ferroelectric memory holds the selected WL at the potential 0 V, while entirely returning the selected BL, the unselected WLs and the unselected BLs to the potential 0 V, thereby temporarily returning the same to the standby state. In this period T1, the following potential differences are applied to the first to fourth cells for T seconds: More specifically, the potential differences –⅓ Vcc, –⅓ Vcc and ⅓ Vcc are applied to the first, second and third cells which are unselected cells for T seconds respectively. Further, the potential difference –Vcc is applied to the fourth cell which is the selected cell for T seconds. In the first cell which is an unselected cell, recovery of the quantity of residual polarization takes place if data "1" is held, while deterioration of the quantity of residual polarization takes place if data "0" is held due to this application of the potential difference. In the second cell which is an unselected cell, recovery of the quantity of residual polarization takes place if data "1" is held, while deterioration of the quantity of residual polarization takes place if data "0" is held. In the third cell which is an unselected cell, deterioration of the quantity of residual polarization takes place if data "1" is held, while recovery of the quantity of residual polarization takes place if data "0" is held. Reverse data "1" is written in the fourth cell which is the selected cell.

After writing the reverse data "1" in the period T1, the ferroelectric memory writes data "0" to be originally written in the period T2. More specifically, the ferroelectric memory holds the selected BL at the potential 0 V, while setting up the selected WL, the unselected WLs and the unselected BLs to the potentials Vcc, ⅓ Vcc and ⅔ Vcc respectively in the period T2. Thereafter the ferroelectric memory holds the selected BL at 0 V, while entirely returning the selected WL, the unselected WLs and the unselected BLs to the potential 0 V, thereby returning the same to the standby state. In this period T2, the following potential differences are applied to the first to fourth cells for T seconds: More specifically, the potential differences ⅓ Vcc, ⅓ Vcc and –⅓ Vcc are applied to the first, second and third cells which are unselected cells for T seconds respectively. Further, the potential difference Vcc is applied to the fourth cell which is the selected cell for T seconds. In the first cell which is an unselected cell, deterioration of the quantity of residual polarization takes place if data "1" is held, while recovery of the quantity of residual polarization takes place if data "0" is held due to this application of the potential difference. In the second cell which is an unselected cell, deterioration of the quantity of residual polarization takes place if data "1" is held, while recovery of the quantity of residual polarization takes place if data "0" is held. In the third cell which is an unselected cell, recovery of the quantity of residual polarization takes place if data "1" is held, while deterioration of the quantity of residual polarization takes place if data "0" is held. Further, data "0" is written in the fourth cell which is the selected cell.

In the aforementioned operation of writing data "0", the polarization state changes in the following manner so that data "0" is written in the selected cell: The polarization state of the fourth cell which is the selected cell makes a transition to the point B in the period T1 and thereafter shifts to "1", as shown in FIG. 6. Thereafter the polarization state makes a transition from "1" to "0" through the point A in the period T2. Thus, data "0" is written in the selected cell.

Figure 8:
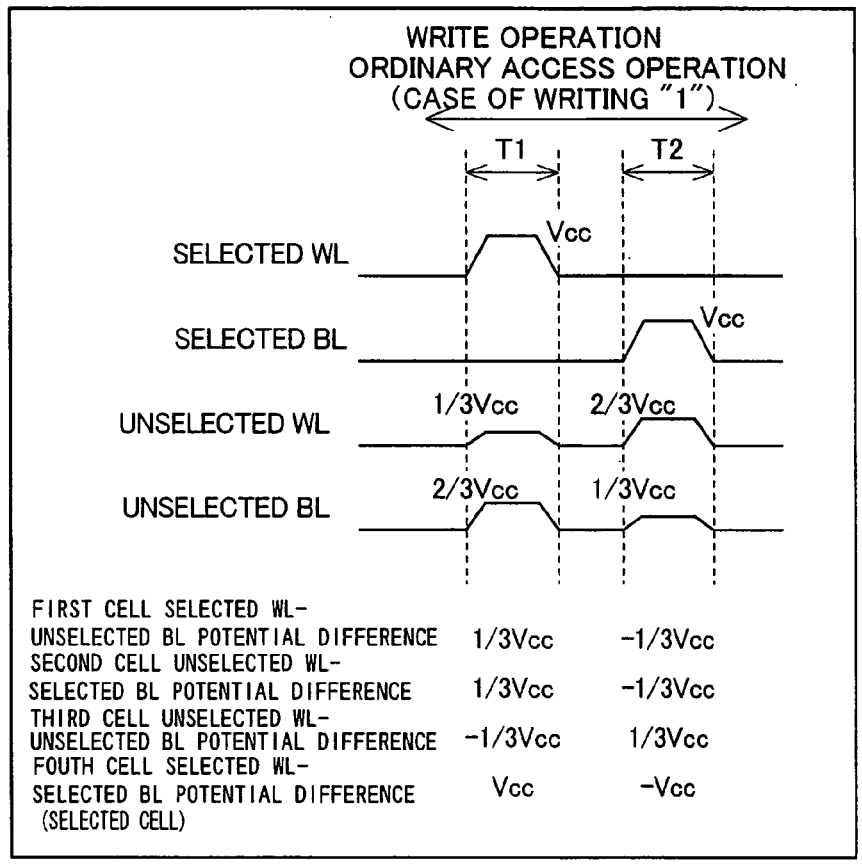
FIG. 8 is a voltage waveform diagram for illustrating the write operation (ordinary access operation) according to the first embodiment of the present invention.

In a case of writing data "1", the ferroelectric memory writes data "0" reverse to the data "1" in the period T1, as shown in FIG. 8. Thereafter the ferroelectric memory writes the data "1" in the period T2. In this operation of writing data "1", the ferroelectric memory performs an operation exchanging the periods T1 and T2 in the aforementioned operation of writing data "0" (see FIG. 7) for each other. Thus, the potential differences ⅓ Vcc, ⅓ Vcc and –⅓ Vcc are applied to the first, second and third cells which are unselected cells for T seconds respectively in the period T1 in the operation of writing data "1", as shown in FIG. 8. Further, the potential difference Vcc is applied to the fourth cell which is the selected cell for T seconds. In the first cell which is an unselected cell, deterioration of the quantity of residual polarization takes place if data "1" is held, while recovery of the quantity of residual polarization takes place if data "0" is held due to this application of the potential difference. In the second cell which is an unselected cell, deterioration of the quantity of residual polarization takes place if data "1" is held, while recovery of the quantity of residual polarization takes place if data "0" is held. In the third cell which is an unselected cell, recovery of the quantity of residual polarization takes place if data "1" is held, while deterioration of the quantity of residual polarization takes place if data "0" is held. Further, the reverse data "0" is written in the fourth cell which is the selected cell.

In the period T2, the potential differences −⅓ Vcc, −⅓ Vcc and ⅓ Vcc are applied to the first, second and third cells which are unselected cells for T seconds respectively. Further, the potential difference −Vcc is applied to the fourth cell which is the selected cell for T seconds. In the first cell which is an unselected cell, recovery of the quantity of residual polarization takes place if data "1" is held, while deterioration of the quantity of residual polarization takes place if data "0" is held due to this application of the potential difference. In the second cell which is an unselected cell, recovery of the quantity of residual polarization takes place if data "1" is held, while deterioration of the quantity of residual polarization takes place if data "0" is held. In the third cell which is an unselected cell, deterioration of the quantity of residual polarization takes place if data "1" is held, while recovery of the quantity of residual polarization takes place if data "0" is held. Further, data "1" is written in the fourth cell which is the selected cell.

In this operation of writing data "1", the polarization state changes in the following manner, so that data "1" is written in the selected cell: The polarization state of the fourth cell which is the selected cell makes a transition to the point A in the period T1, and thereafter shifts to "0", as shown in FIG. 6. Thereafter the polarization state makes a transition from "0" to "1" through the point B in the period T2. Thus, data "1" is written in the selected cell.

In the write operation of the ordinary access according to the first embodiment, the voltages (voltage pulses) ±⅓ Vcc are applied once to all unselected cells (first to third cells) respectively. The voltage pulses ±⅓ Vcc in this case are examples of the "first voltage pulse in the first direction inverting stored data" and the "second voltage pulse, in the direction opposite to the first direction, not inverting stored data". In other words, deterioration of the quantities of residual polarization and recovery of the quantities of residual polarization take place once in both of the case of writing data "0" and the case of writing data "1" in the write operation of the ordinary access according to the first embodiment. Also when the ferroelectric memory repetitively performs the write operation, therefore, deterioration of the quantities of residual polarization is hardly accumulated in the unselected cells dissimilarly to a case of repetitively applying only the voltage (voltage pulse) ⅓ Vcc to the unselected cells. Consequently, the ferroelectric memory can effectively suppress occurrence of loss of data (disturbance phenomenon) from the unselected cells resulting from deterioration of the quantities of residual polarization.

Figure 9:
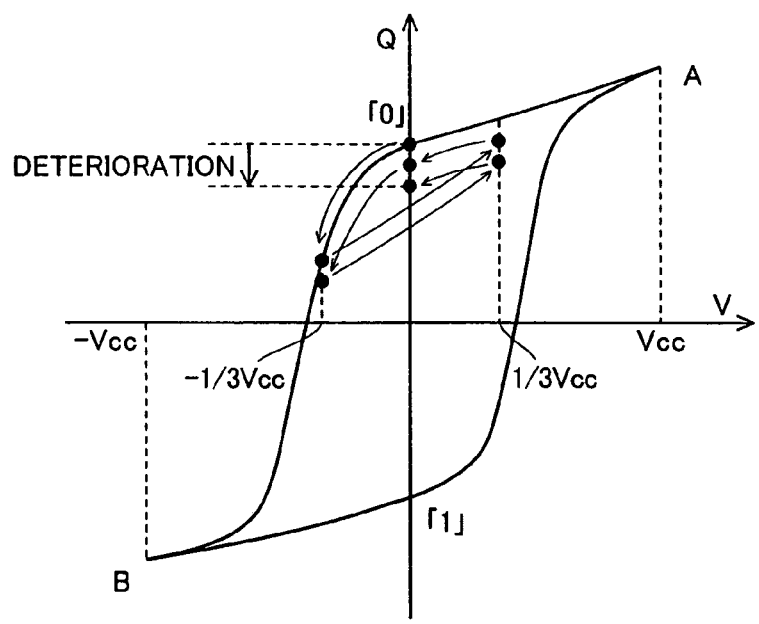
FIG. 9 is a hysteresis diagram for illustrating accumulation of deterioration in quantities of residual polarization in the ferroelectric memory according to the first embodiment of the present invention.

Also when the ferroelectric memory applies the potential differences ±⅓ Vcc to the unselected cells by the same frequencies in the aforementioned read and rewrite operations of the ordinary access operation and the write operation respectively, deterioration of the quantities of residual polarization may be accumulated in the unselected cells. More specifically, deterioration of the quantity of residual polarization resulting from application of the potential difference −⅓ Vcc may not be completely recoverable when data "0" is held in any unselected cell, for example, even if the ferroelectric memory thereafter applies the potential difference ⅓ Vcc, if inclination of a hysteresis curve of the ferroelectric film is large, as shown in a hysteresis diagram of FIG. 9. Thus, slight unrecoverable deterioration of the quantity of residual polarization may be accumulated in the unselected cell following repetitive application of the potential differences ±⅓ Vcc.

Figure 10:
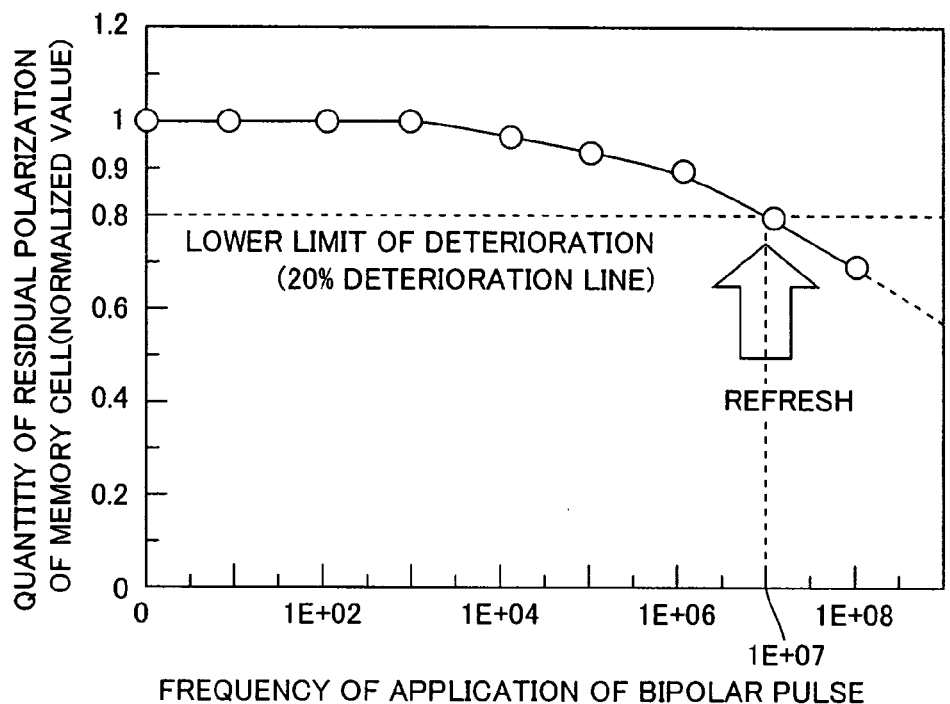
FIG. 10 is a correlation diagram showing the relation between the quantity of residual polarization of a memory cell of the ferroelectric memory according to the first embodiment of the present invention and a frequency of application of a bipolar pulse.

FIG. 10 shows the relation between the frequency of application of the bipolar pulse consisting of the voltage pulses ±⅓ Vcc and the quantity of residual polarization of the memory cell. FIG. 10 shows the quantity of residual polarization of the memory cell with values normalized by the quantity of residual polarization of the memory cell in a state (application frequency 0) not applying the bipolar pulses ±⅓ Vcc once. It is understood from FIG. 10 that the quantity of residual polarization of the memory cell gradually decreases (deteriorates) as the application frequency of the bipolar pulses ±⅓ Vcc increases. It is also understood that the quantity of residual polarization of the memory cell decreases below about 0.8 when the application frequency of the bipolar pulses ±⅓ Vcc exceeds about 10,000,000 times (1E+07 times). In other words, it is understood that the quantity of residual polarization of the memory cell deteriorates by at least about 20% when the application frequency of the bipolar pulses ±⅓ Vcc exceeds about 10,000,000 times (1E+07 times).

According to the first embodiment, the ferroelectric memory performs a refresh operation of recovering the quantities of residual polarization to those immediately after the write operation on all memory cells 12 when the quantities of residual polarization of the memory cells 12 (see FIG. 2) deteriorate by at least about 10% from the quantities of residual polarization immediately after the write operation. More specifically, the ferroelectric memory applies the bipolar pulse consisting of the voltage pulses ±⅓ Vcc once to the dummy cell 8b of the refresh control circuit 8 (see FIG. 3) from the pulse generator 8a in correspondence to that the potential differences ±⅓ Vcc are applied once to the unselected cells in the ordinary access operation (the read and rewrite operations and the write operation) to the memory cells 12. The voltage pulses ±⅓ Vcc applied to the dummy cell 8b in this case are examples of the "third voltage pulse" and the "fourth voltage pulse" in the present invention. Thus, deterioration of the same quantity as deterioration of the quantity of residual polarization accumulated by application of the potential differences ±⅓ Vcc to the unselected cells in the ordinary access operation is accumulated in the dummy cell 8b. As deterioration of the quantity of residual polarization is accumulated in the dummy cell 8b, a read voltage read from the dummy cell 8b to the operational amplifier 8b lowers.

The reference voltage Vref supplied from the reference voltage generation circuit 8c to the operational amplifier 8d is set to a voltage of about 90% of a read voltage corresponding to the quantities of residual polarization of the memory cells 12 and the dummy cell 8b immediately after the write operation. Thus, a voltage pulse of a positive voltage (high level) is output from the operation amplifier 8b while the read voltage of the dummy cell 8b is larger than the voltage of about 90% of the read voltage corresponding to the quantities of residual polarization of the memory cells 12 and the dummy cell 8b immediately after the write operation. When the read voltage of the dummy cell 8b decreases below the voltage of about 90% of the read voltage corresponding to the quantities of residual polarization of the memory cells 12 and the dummy cell 8b immediately after the write operation, on the other hand, a voltage pulse of a negative voltage (low level) is output from the operational amplifier 8d. The voltage pulse of the negative voltage (low level) output from the operational amplifier 8d is input in the input buffer 7 (see FIG. 1), whereby a signal for starting the refresh operation is output from the input buffer 7 to the write amplifier 6. Thus, the refresh operation on the memory cells 12 (see FIG. 2) is started. The refresh operation according to the first embodiment is now described with reference to FIGS. 1, 2 and 5.

(Refresh Operation)

The refresh operation according to the first embodiment is performed on all memory cells 12 (see FIG. 2) of the memory cell array 1 (see FIG. 1). More specifically, the ferroelectric memory first performs the refresh operation by selecting the memory cell 12 located on the intersection between the word line WL1 and the bit line BL1, and thereafter performs the refresh operation by successively selecting the memory cells adjacent along the word line WL1 one by one. After performing the refresh operation on all memory cells 12 linked to the word line WL1, the ferroelectric memory selects the word line WL2 for performing the refresh operation on all memory cells 12 linked to the word line WL2 one by one, similarly to the case of the word line WL1. Thereafter the ferroelectric memory similarly performs the refresh operation on all memory cells 12 linked to the respective word lines WL subsequent to the word line WL3 one by one. Thus, the refresh operation is performed on all memory cells 12 (see FIG. 2) of the memory cell array 1 (see FIG. 1). The specific method of the refresh operation according to the first embodiment is absolutely similar to the aforementioned case of the read and rewrite operations of the ordinary access operation.

In other words, the ferroelectric memory advances to the operation in the period T2 when data "1" is read from the selected cell in the period T1 of the read and rewrite operations as shown in FIG. 5, whereby data "1" is rewritten in the selected cell. On the other hand, the ferroelectric memory advances to the operation in the period T4 when data "0" is read from the selected cell in the period T1, whereby data "0" is rewritten in the selected cell. In the read and rewrite operations of the refresh operation according to the first embodiment, the frequency of deterioration of the quantity of residual polarization and the frequency of recovery of the quantity of residual polarization are equal to each other in both of the case where the data "1" is read and the case where data "0" is read. Also when the ferroelectric memory performs the refresh operation one by one on all memory cells 12 (see FIG. 2), therefore, deterioration of the quantities of residual polarization is hardly accumulated in the unselected cells.

In other words, the ferroelectric memory can effectively suppress loss of data (disturbance) from the unselected cells resulting from deterioration of the quantities of residual polarization by alternately applying the voltages $\pm\frac{1}{3}$ Vcc to the first and third cells among the unselected cells and alternately applying $\frac{1}{3}$ Vcc–the potential of the selected bit line and the voltage $\frac{1}{3}$ Vcc and the voltage $-\frac{1}{3}$ Vcc to the second cell among the unselected cells in the directions canceling deterioration of the quantities of residual polarization of the unselected cells resulting from disturbance throughout the read and rewrite operations in the refresh operation according to the first embodiment, dissimilarly to the case of repetitively applying only the voltage $\frac{1}{3}$ Vcc to the unselected cells. Thus, the ferroelectric memory can inhibit the unselected cells from occurrence of a disturbance phenomenon resulting from deterioration of the quantities of residual polarization while recovering the selected cell from deterioration of the quantity of residual polarization in the refresh operation according to the first embodiment.

According to the first embodiment, the ferroelectric memory does not regularly perform the refresh operation every ordinary access operation but performs the refresh operation on the basis of the fact that deterioration of the quantities of residual polarization of at least about 10% have taken place in the memory cells 12, whereby the operating time of the refresh operation can be remarkably reduced as compared with a case of regularly performing the refresh operation every ordinary access operation. Thus, the ferroelectric memory can inhibit the number of operations thereof from increase also when performing the refresh operation.

An experiment conducted in order to investigate influence exerted by the time (T seconds) for applying the potential differences $\pm\frac{1}{3}$ Vcc to the unselected cells to the read potential difference in the read and rewrite operations of the ordinary access operation and the refresh operation and the write operation of the ordinary access operation is now described. In this experiment, one memory cell was selected from the memory cell array for performing an operation of writing data "0" (write voltage $\pm$Vcc=$\pm$3.0 V), thereafter applying the bipolar pulse consisting of the voltage pulses $\pm\frac{1}{3}$ Vcc (=$\pm$1.0 V) and thereafter performing a read operation. Then, the read potential (data "0" read potential) of the bit line BL linked to the selected cell was measured. When applying the bipolar pulse, measurement was performed by changing times for applying the voltage pulse $-\frac{1}{3}$ Vcc (=$-1.0$ V) and the voltage pulse $\frac{1}{3}$ Vcc (=$1.0$ V) to 25 nsec. to 200 nsec. while changing the application frequency of the bipolar pulse from once to $10^9$ times. In this case, the write voltage $\pm$Vcc=$\pm$3.0 V in the operation of writing data "0" ("1") in the memory cell is a voltage capable of causing polarization inversion in the memory cell.

Figure 11:
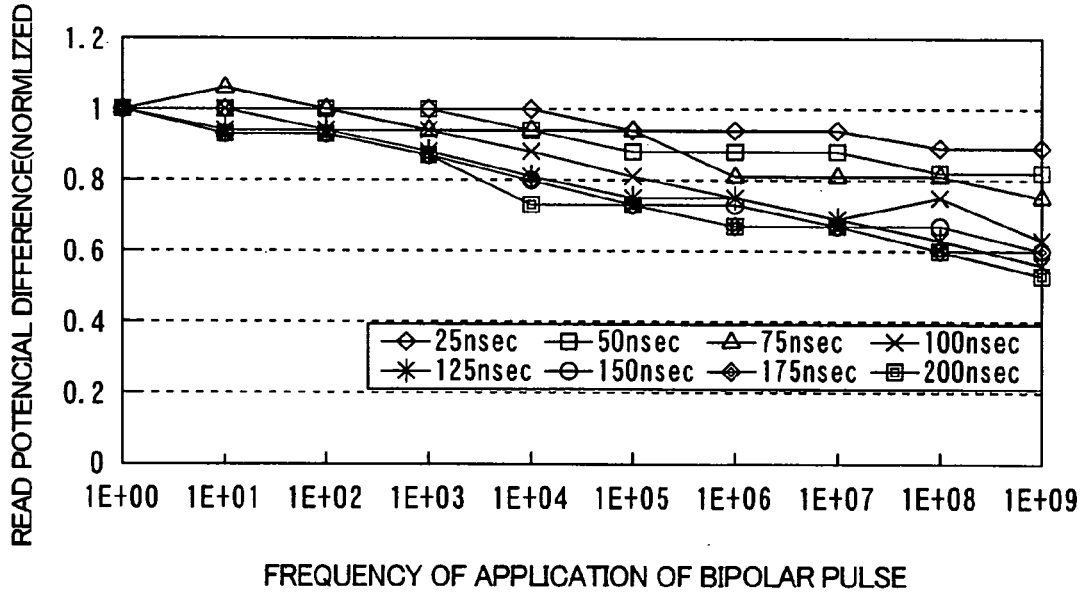
FIG. 11 is a correlation diagram showing the relation between a read potential difference in the ferroelectric memory according to the first embodiment of the present invention and the frequency of application of the bipolar pulse.

Then, one memory cell was selected from the memory cell array for performing an operation of writing data "1", thereafter applying the bipolar pulse consisting of the voltage pulses $\pm\frac{1}{3}$ Vcc (=$\pm$1.0 V), and thereafter performing a read operation. Then, the read potential (data "1" read potential) of the bit line BL linked to the selected cell was measured. The bipolar pulse was applied similarly to the aforementioned case of measuring the data "0" read potential. The read potential difference was calculated by subtracting the data "0" read potential from the data "1" read potential. FIG. 11 shows the relation between the read potential difference calculated every application time (25 nsec. to 200 nsec.) for the voltage pulses $\pm\frac{1}{3}$ Vcc (=$\pm$1.0 V) and the application frequency of the bipolar pulse. FIG. 11 shows values obtained by normalizing the calculated read potential difference by the read potential difference in a case of applying the bipolar pulse once.

As understood from FIG. 11, the read potential difference shows a tendency of gradually decreasing as the application frequency of the bipolar pulses $\pm\frac{1}{3}$ Vcc (=$\pm$1.0 V) increases from once to $10^9$ times. This is conceivably because deterioration of the quantity of residual polarization accumulated in the memory cell increases in response to the increase of the application frequency of the bipolar pulses $\pm\frac{1}{3}$ Vcc (=$\pm$1.0 V). Further, it is understood from FIG. 11 that the degree of reduction of the read potential difference following increase of the application frequency of the bipolar pulse decreases as the pulse width (application time) of the voltage pulses $\pm\frac{1}{3}$ Vcc (=$\pm$1.0 V) of the bipolar pulse decreases from 200 nsec. to 25 nsec. In addition, it is understood that the quantity of deterioration does not fall below 20% until the application frequency reaches $10^8$ times with voltage pulses having pulse widths of not more than 75 nsec. This is conceivably because deterioration of the quantity of residual polarization accumulated in the memory cell is reduced as the pulse width (application time) of the voltage pulses $\pm\frac{1}{3}$ Vcc (=$\pm$1.0 V) applied to the memory cell decreases. From this result, it has been proved that the time (T seconds) for applying the voltages $\pm\frac{1}{3}$ Vcc to the unselected cells is preferably shorter, in order to inhibit the unselected cells from accumulation of deterioration of the quantities of residual polarization in the read and rewrite operations of the ordinary access operation and the refresh operation and the write operation of the ordinary access operation.

In the read and rewrite operations and the write operation, the time (T seconds) for applying the voltages (voltage pulses) ±Vcc and ±⅓ Vcc must be set to such a time that the ferroelectric capacitor 12a (see FIG. 2) of the selected cell is reliably polarization-inverted when the ferroelectric memory applies the voltages (voltage pulses) ±Vcc while the ferroelectric capacitors 12a of the unselected cells are not polarization-inverted when the ferroelectric memory applies the voltages (voltage pulses) ±⅓ Vcc, in order to perform data writing in the selected cell while rendering data of the unselected cells unchanged. In order to reliably polarization-invert the ferroelectric capacitor 12a with the voltage pulse ±Vcc and not to polarization-invert the ferroelectric capacitors 12a with the voltage pulses ±⅓ Vcc while inhibiting the unselected cells from accumulation of deterioration of the quantities of residual polarization in this case, the time (T seconds) for applying the voltage pulses ±Vcc and ±⅓ Vcc to the memory cells 12 is preferably set to not more than 75 nsec. Thus, the application time for the voltage pulses (pulse width of the voltage pulses) is so set to not more than 75 nsec. that it is possible to reliably cause polarization inversion in the ferroelectric capacitor 12a of the selected cell with the voltage pulse of the high voltage (±Vcc) while it is possible to suppress disturbance of the unselected cells resulting from accumulation of deterioration of the quantities of residual polarization by making the ferroelectric capacitors 12a of the unselected cells cause substantially no polarization inversion with the voltage pulse of the low voltage (±⅓ Vcc).

Consequently, the quantities of deterioration can be rendered not reaching 20% which is the lower limit of data deterioration until the access operation reaches $10^8$ times by setting the application time for the voltage pulses (pulse width of the voltage pulses) to not more than 75 nsec. Thus, the ferroelectric memory can inhibit the unselected cells from occurrence of a disturbance phenomenon resulting from deterioration of the quantities of residual polarization by performing the refresh operation every access operation of $10^8$ times at the maximum.

Second Embodiment

This second embodiment is described with reference to an example of applying the present invention to a case of collectively accessing all memory cells connected to an arbitrary word line WL of a ferroelectric memory, dissimilarly to the aforementioned first embodiment.

Figure 12:
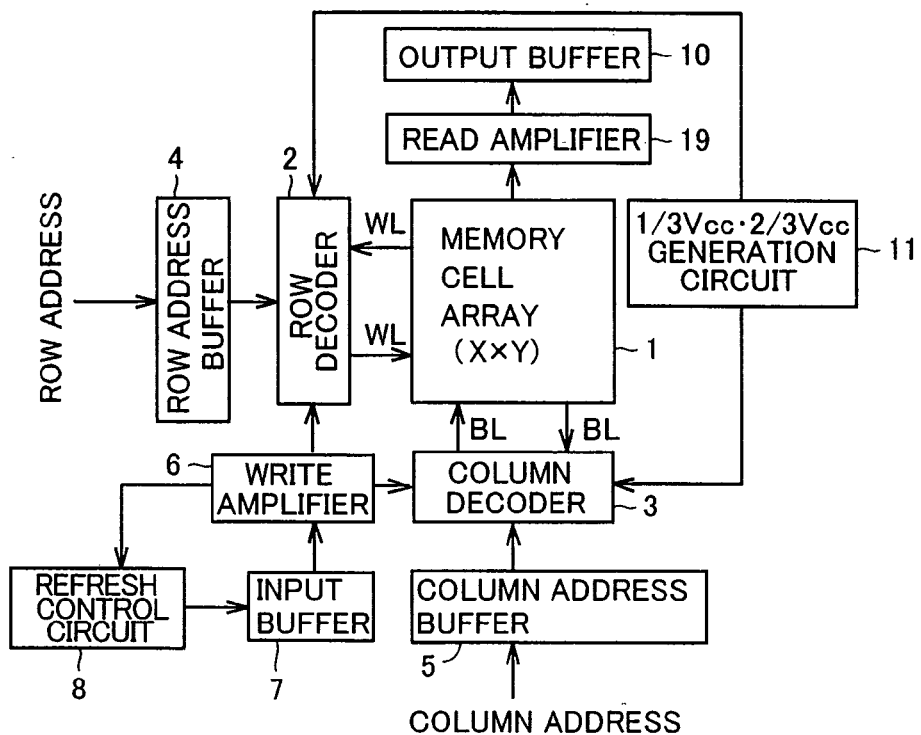
FIG. 12 is a block diagram showing the overall structure of a simple matrix ferroelectric memory according to a second embodiment of the present invention.

Referring to FIG. 12, a read amplifier 19 is directly connected to a memory cell array 1 in the ferroelectric memory according to the second embodiment. The remaining structure of the ferroelectric memory according to the second embodiment is similar to the structure of the ferroelectric memory according to the aforementioned first embodiment.

Figure 13:
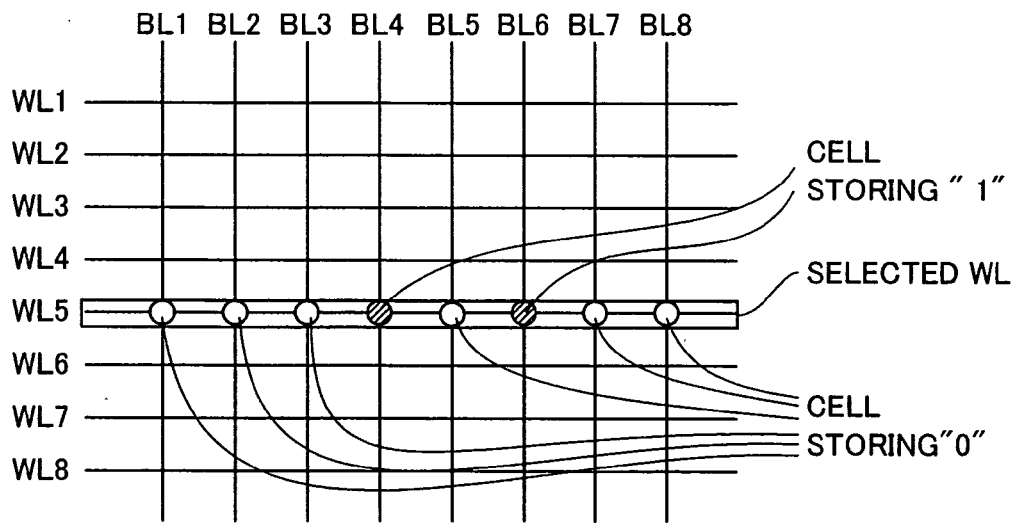
FIG. 13 is a schematic diagram for illustrating data held in memory cells connected to a selected word line in a memory cell array according to the second embodiment of the present invention.
Figure 14:
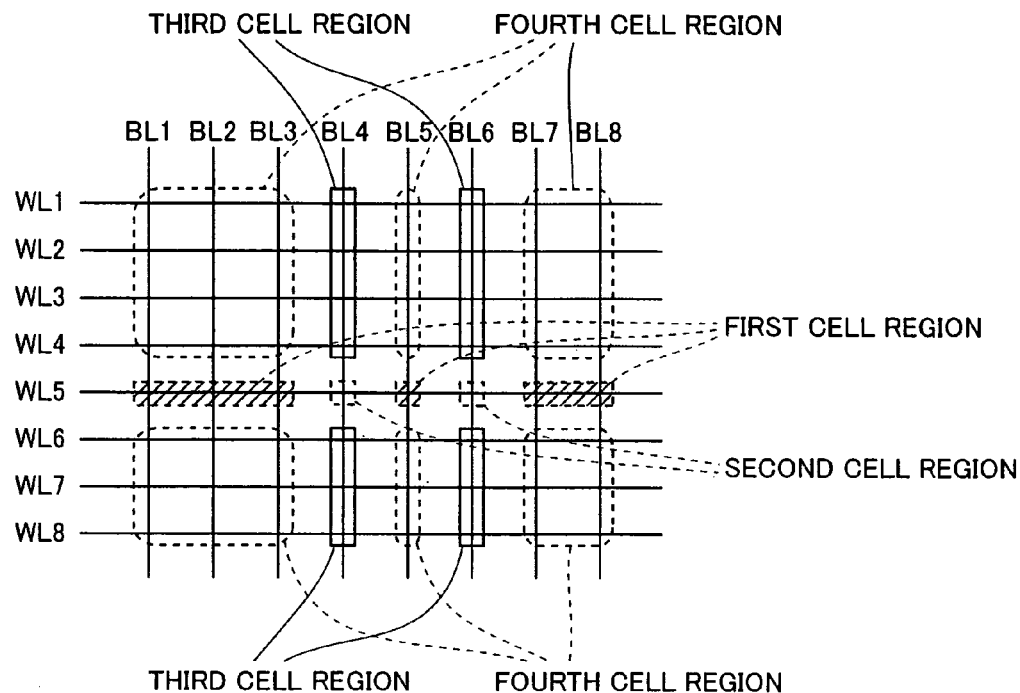
FIG. 14 is a diagram for illustrating definition of cell regions of the memory cell array according to the second embodiment of the present invention.

Operations of the ferroelectric memory according to the second embodiment are now described with reference to FIGS. 12 to 16. In the description of the second embodiment, it is assumed that a selected WL is a word line WL5, as shown in FIG. 13. It is also assumed that data "1" are stored in memory cells connected to a bit lines BL4 and BL6 among memory cells connected to this selected WL (WL5) while data "0" are stored in memory cells connected to the remaining bit lines (BL1 to 3, 5, 7 and 8). As shown in FIG. 14, a memory cell group storing data "0" is referred to as a first cell region among the memory cells connected to the selected WL, and a memory cell group storing data "1" is referred to as a second cell region among the memory cells connected to the selected WL. Further, a memory cell group connected to the bit lines BL4 and BL6 is referred to as a third cell region among memory cells connected to unselected WLs, and a memory cell group connected to bit lines other than the bit lines BL4 and BL6 is referred to as a fourth cell region among the memory cells connected to the unselected WLs. In other words, the memory cells of the first cell region and the second cell region connected to the selected WL (WL5) are selected cells, and the memory cells of the third cell region and the fourth cell region connected to the unselected WLs (WL1 to 4 and 6 to 8) are unselected cells. Read and rewrite operations in ordinary access, a write operation in the ordinary access and a refresh operation in simple matrix ferroelectric memory cells according to the second embodiment are now described.

(Read and Rewrite Operations: Ordinary Access Operation)

Figure 15:
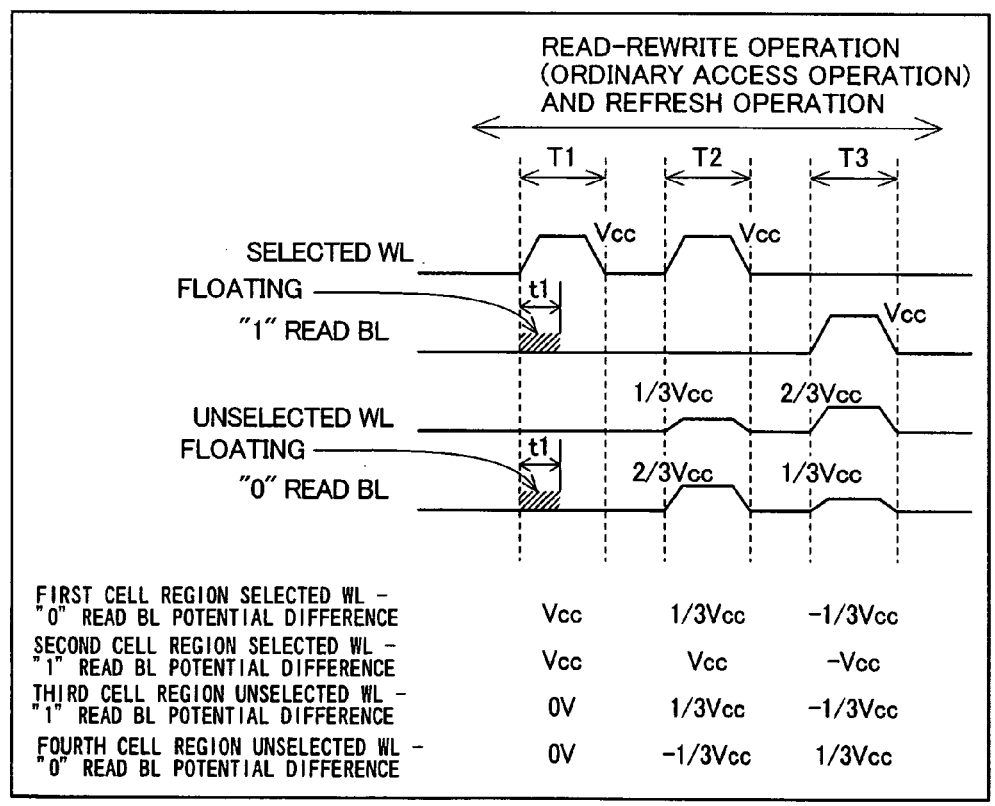
FIG. 15 is a voltage waveform diagram for illustrating read and rewrite operations of an ordinary access operation and a refresh operation according to the second embodiment of the present invention.

As shown in FIG. 15, the read and rewrite operations (ordinary access operation) according to the second embodiment are performed in periods T1, T2 and T3. It is assumed that times for applying potential differences (voltage pulses) ±⅓ Vcc, ±Vcc and 0 V to the memory cells in the respective periods T1 to T3 are the same T seconds respectively. Respective operations performed in the periods T1 to T3 may be continuously performed, or may be performed independently of each other. The respective operations in the periods T1 to T3 are now described. It is assumed that the word lines WL and the bit lines BL are at 0 V in a standby state.

(1) Read Operation (T1)

In the period T1 shown in FIG. 15, the ferroelectric memory performs data reading. First, the ferroelectric memory brings all bit lines BL into floating states from the standby state (0 V), and sets up the selected WL (WL5) to the potential Vcc at the same timing or with a delay of several nsec. to several 10 nsec. In this state, the ferroelectric memory determines data "0" or data "1" by sensing the potentials of all bit lines BL. The ferroelectric memory performs this determination of data "0" or "1" similarly to the read operation of the ordinary access operation according to the aforementioned first embodiment. It is assumed that the time when all bit lines BL are in the floating states is t1 seconds. This period t1 is set to a sufficiently short period, similarly to the read and rewrite operations according to the aforementioned first embodiment. In this period t1, the following potential differences are applied to the memory cells of the first cell region to the fourth cell region (see FIG. 14).

A potential difference Vcc−Vr0 ("0" data read potential) is applied to the memory cells of the first cell region for the period t1. A potential difference Vcc−Vr1 ("1" data read potential) is applied to the memory cells of the second cell region for the period t1. A potential difference −Vr1 is applied to the memory cells of the third cell region for the period t1. A potential difference −Vr0 is applied to the memory cells of the fourth cell region for the period t1. The period t1 is set sufficiently short as hereinabove described, whereby deterioration and recovery of the quantities of residual polarization caused in all memory cells (memory cells of the third and fourth cell regions) connected to the unselected WLs in the period t1 are substantially ignorable as compared with deterioration and recovery of the quantities of residual polarization caused by operations performed in the subsequent periods T2 and T3.

After a lapse of the period t1, the ferroelectric memory sets all bit lines BL to the potential 0 V. This period corresponds to the period T1 other than t1, and potential differences in the memory cells of the respective memory cell regions are as follows: A potential difference Vcc is applied to the memory cells (selected cells) of the first and second cell regions, while no potential difference takes place in the memory cells (unselected cells) of the third and fourth cell regions.

Thereafter the ferroelectric memory completes the read operation by setting the voltage of the word line WL5 which is the selected WL to 0 V and returning the same to the standby state. In the period T1, polarization changes of the memory cells (selected cells) of the first cell region and the second cell region are as follows respectively: Data of the memory cells of the first cell region in which data "0" have been stored are not destroyed by the read operation. On the other hand, data "1" of the memory cells of the second cell region in which the data "1" have been stored are destroyed and the memory cells enter states where data "0" are written. Therefore, the ferroelectric memory must rewrite data "1" in the memory cells of the second cell region. According to the second embodiment, the ferroelectric memory performs this rewrite operation in the periods T2 and T3.

Then, in the period T2 shown in FIG. 15, the ferroelectric memory holds "1" read BLs (BL4 and BL6) at the potential 0 V from the standby state (0 V), while setting up the selected WL (WL5), the unselected WLs (WL1 to 4 and 6 to 8) and "0" read BLs (BL1 to 3, 5, 7 and 8) to the potentials Vcc, ⅓ Vcc and ⅔ Vcc respectively. Thereafter the ferroelectric memory holds the "1" read BLs (BL4 and BL6) at the potential 0 V while entirely returning the selected WL (WL5), the unselected WLs (WL1 to 4 and 6 to 8) and the "0" read BLs (BL1 to 3, 5, 7 and 8) to the potential 0 V thereby temporarily returning the same to the standby states. In this period T2, the following potential differences are applied to the memory cells of the first to fourth cell regions for T seconds: The potential difference ⅓ Vcc is applied to the memory cells of the first cell region and the third cell region for T seconds. The potential difference Vcc is applied to the memory cells of the second cell region for T seconds, while the potential difference −⅓ Vcc is applied to the memory cells of the fourth cell region for T seconds.

In the period T2, polarization changes of the memory cells of the first to fourth cell regions are as follows respectively: In the memory cells of the first cell region, the quantities of residual polarization are recovered since the potential difference ⅓ Vcc is applied in the period T2. In the memory cells of the second cell region in which data "0" have been written in the period T1, data "0" are written again since the potential difference Vcc is applied in the period T2. In the memory cells (unselected cells) of the third and fourth cell regions, recovery or deterioration of the quantities of residual polarization takes place in response to stored data. More specifically, the potential difference ⅓ Vcc is applied to the memory cells of the third cell region, whereby recovery of the quantities of residual polarization takes place when the same have held data "0", while deterioration of the quantities of residual polarization takes place when the same have held data "1". The potential difference −⅓ Vcc is applied to the memory cells of the fourth cell region, whereby deterioration of the quantities of residual polarization takes place when the same have held data "0", while recovery of the quantities of residual polarization takes place when the same have held data "1".

Then, in the period T3 shown in FIG. 15, the ferroelectric memory holds the selected WL (WL5) at the potential 0 V from the standby state (0 V), while setting up the "1" read BLs (BL4 and BL6), the unselected WLs (WL1 to 4 and 6 to 8) and the "0" read BLs (BL1 to 3, 5, 7 and 8) to the potentials Vcc, ⅔ Vcc and ⅓ Vcc respectively. Thereafter the ferroelectric memory holds the selected WL (WL5) at the potential 0 V, while entirely returning the "1" read BLs (BL4 and BL6), the unselected WLs (WL1 to 4 and 6 to 8) and the "0" read BLs (BL1 to 3, 5, 7 and 8) to the potential 0 V thereby returning the same to the standby states. In this period T3, the following potential differences are applied to the memory cells of the first to fourth cell regions for T seconds: The potential difference −⅓ Vcc is applied to the memory cells of the first cell region and the third cell region for T seconds. The potential difference −Vcc is applied to the memory cells of the second cell region for T seconds, while the potential difference ⅓ Vcc is applied to the memory cells of the fourth cell region for T seconds.

In the period T3, polarization changes of the memory cells of the first to fourth cell regions are as follows respectively: The potential difference −⅓ Vcc is applied to the memory cells of the first cell region in the period T3, whereby the quantities of residual polarization deteriorate. The potential difference −Vcc is applied to the memory cells of the second cell region in the period T3, whereby data "1" are written. Thus, rewriting of data "1" destroyed by the read operation is completed. In the memory cells (unselected cells) of the third and fourth cell regions, recovery or deterioration of the quantities of residual polarization takes place in response to the stored data, similarly to the period T2. More specifically, the potential difference −⅓ Vcc is applied to the memory cells of the third cell region, whereby deterioration of the quantities of residual polarization takes place when the same have held data "0", while recovery of the quantities of residual polarization takes place when the same have held data "1". The potential difference ⅓ Vcc is applied to the memory cells of the fourth cell region, whereby recovery of the quantities of residual polarization takes place when the same have held data "0", while deterioration of the quantities of residual polarization takes place when the same have held data "1". The period T3 so elapses that the ferroelectric memory terminates the series of read and rewrite operations.

In the read and rewrite operations of the ordinary access operation according to the second embodiment, recovery and deterioration of the quantities of residual polarization necessarily take place once in all memory cells (memory cells of the first, third and fourth cell regions) other than the memory cells having held data "1" among the memory cells connected to the selected WL (WL5). Therefore, deterioration of the quantities of residual polarization is hardly accumulated in these memory cells also when the ferroelectric memory repetitively performs the read and rewrite operations.

In other words, the ferroelectric memory applies the voltages (voltage pulses) ±⅓ Vcc of mutually opposite directions once to all memory cells (memory cells of the first, third and fourth cell regions) other than the memory cells having held data "1" among the memory cells connected to the selected WL (WL5) throughout the read and rewrite operations in the read and rewrite operations of the ordinary access operation according to the second embodiment, thereby suppressing deterioration of the quantities of residual polarization dissimilarly to a case of repetitively applying only the voltage (voltage pulse) ⅓ Vcc. Thus, the ferroelectric memory can suppress such a disturbance phenomenon that data are lost from all unselected cells (memory cells of the third and fourth cell regions) and the memory cells of the first cell region having held data "0" among the selected cells. The voltage pulses alternately applied in this case are examples of the "first voltage pulse in the first direction inverting stored data" and the "second voltage pulse, in the direction opposite to the first direction, not inverting stored data" in the present invention respectively.

(Write Operation: Ordinary Access Operation)

Figure 16:
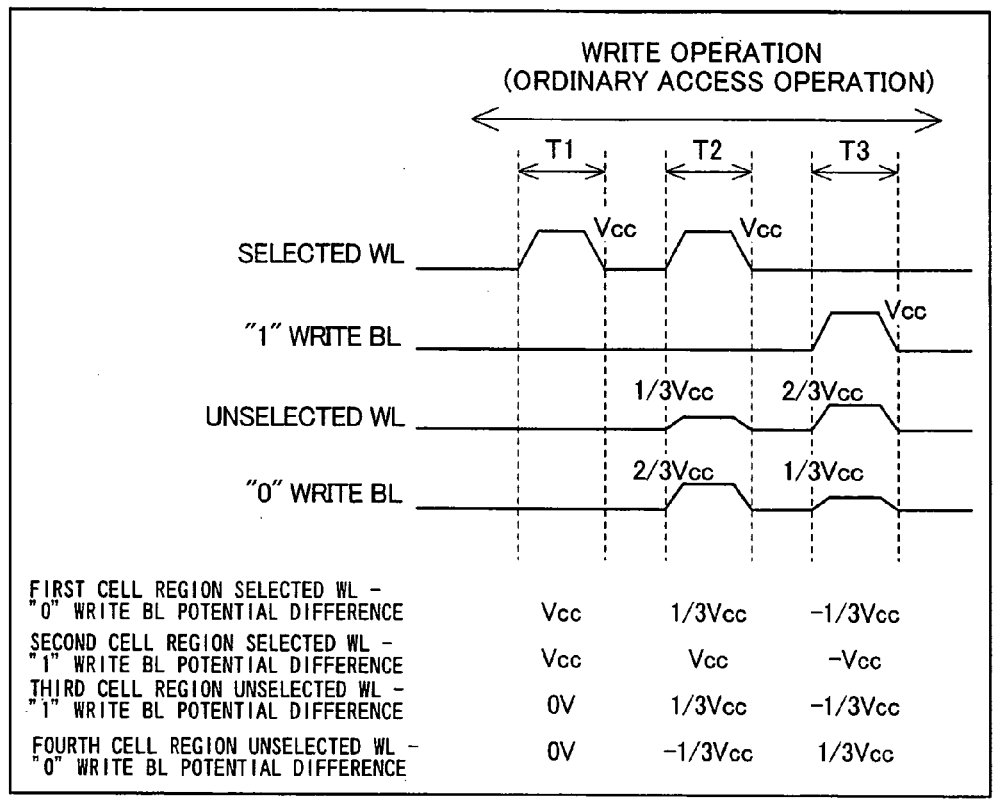
FIG. 16 is a voltage waveform diagram for illustrating a write operation of the ordinary access operation according to the second embodiment of the present invention.

The write operation (ordinary access operation) according to the second embodiment of the present invention is now described with reference to FIGS. 14 to 16. This write operation of the ordinary access operation according to the second embodiment employs "1" write BLs and "0" write BLs in place of the "1" read BLs (see FIG. 15) and the "0" read BLs, as shown in FIG. 16. In the period T1, the ferroelectric memory does not bring the "1" write BLs and the "0" write BLs into floating states but holds the same at the potential 0 V. The operating method of this write operation of the ordinary access operation according to the second embodiment other than the above is similar to the aforementioned read and write operations of the ordinary access operation according to the second embodiment. In the write operation of the ordinary access operation according to the second embodiment, therefore, the potential difference Vcc is applied to the memory cells (selected cells) of the first and second cell regions while no potential difference takes place in the memory cells (unselected cells) of the third and fourth cell regions in the period T1, as shown in FIG. 16. Thus, data "0" are written in the memory cells (selected cells) of the first and second cell regions in the period T1. Polarization states remain unchanged in the memory cells of the third and fourth cell regions.

In the period T2 shown in FIG. 16, the potential difference ⅓ Vcc is applied to the memory cells of the first cell region and the third cell region for T seconds. The potential difference Vcc is applied to the memory cells of the second cell region for T seconds, while the potential difference −⅓ Vcc is applied to the memory cells of the fourth cell region for T seconds. In this period T2, polarization changes of the memory cells of the first to fourth cell regions are as follows respectively: The potential difference ⅓ Vcc is applied to the memory cells of the first cell region, whereby the quantities of residual polarization are recovered. The potential difference Vcc is applied to the memory cells of the second cell region, whereby data "0" are written therein again. In the memory cells (unselected cells) of the third and fourth cell regions, recovery or deterioration of the quantities of residual polarization takes place in response to the stored data. More specifically, the potential difference ⅓ Vcc is applied to the memory cells of the third cell region, whereby recovery of the quantities of residual polarization takes place when the same have held data "0", while deterioration of the quantities of residual polarization takes place when the same have held data "1". The potential difference −⅓ Vcc is applied to the memory cells of the fourth cell region, whereby deterioration of the quantities of residual polarization takes place when the same have held data "0", while recovery of the quantities of residual polarization takes place when the same have held data "1".

In the period T3 shown in FIG. 16, the potential difference −⅓ Vcc is applied to the memory cells of the first cell region and the third cell region for T seconds. The potential difference −Vcc is applied to the memory cells of the second cell region for T seconds, while the potential difference ⅓ Vcc is applied to the memory cells of the fourth cell region for T seconds. In this period T3, polarization changes of the memory cells of the first to fourth cell regions are as follows respectively: The potential difference −⅓ Vcc is applied to the memory cells of the first cell region, whereby the quantities of residual polarization are deteriorated. The potential difference −Vcc is applied to the memory cells of the second cell region, whereby data "1" are written therein. In the memory cells (unselected cells) of the third and fourth cell regions, recovery or deterioration of the quantities of residual polarization takes place in response to the stored data, similarly to the period T2. More specifically, the potential difference −⅓ Vcc is applied to the memory cells of the third cell region, whereby deterioration of the quantities of residual polarization takes place when the same have held data "0", while recovery of the quantities of residual polarization takes place when the same have held data "1". The potential difference ⅓ Vcc is applied to the memory cells of the fourth cell region, whereby recovery of the quantities of residual polarization takes place when the same have held data "0", while deterioration of the quantities of residual polarization takes place when the same have held data "1". The period T3 so elapses that the ferroelectric memory terminates the series of write operation.

In the write operation of the ordinary access operation according to the second embodiment, recovery and deterioration of the quantities of residual polarization necessarily take place once in all memory cells (memory cells of the first, third and fourth cell regions) other than the memory cells in which data "1" are written among the memory cells connected to the selected WL. Therefore, deterioration of the quantities of residual polarization is hardly accumulated in these memory cells also when the ferroelectric memory repetitively performs the write operation.

In other words, the ferroelectric memory applies the voltages (voltage pulses) ±⅓ Vcc of mutually opposite directions once to all memory cells (memory cells of the first, third and fourth cell regions) other than the memory cells in which data "1" are written among the memory cells connected to the selected WL (WL5) in the write operation of the ordinary access operation according to the second embodiment, whereby deterioration of the quantities of residual polarization can be suppressed dissimilarly to a case of repetitively applying only the voltage (voltage pulse) ⅓ Vcc. Thus, the ferroelectric memory can suppress such a disturbance phenomenon that data are lost from all unselected cells (memory cells of the third and fourth cell regions) and the memory cells of the first cell region in which data "0" are written among the selected cells. The voltage pulses ±⅓ Vcc in this case are examples of the "first voltage pulse in the first direction inverting stored data" and the "second voltage pulse, in the direction opposite to the first direction, not inverting stored data" in the present invention.

Also in the read and rewrite operations of the ordinary access operation and the write operation according to the second embodiment, slight unrecoverable deterioration of the quantity of residual polarization may be accumulated in the unselected cells (memory cells of the third and fourth cell regions) following repetitive application of the potential differences ±⅓ Vcc, similarly to the aforementioned first embodiment. Thus, also in the second embodiment, the ferroelectric memory starts a refresh operation on all memory cells in correspondence to that the quantities of residual polarization of the memory cells are deteriorated by at least about 10% from the quantities of residual polarization immediately after the write operation with a refresh control circuit 8 (see FIG. 12), similarly to the aforementioned first embodiment. The refresh operation according to the second embodiment is now described with reference to FIGS. 12, 14 and 15.

(Refresh Operation)

The refresh operation according to the second embodiment is collectively performed on all memory cells linked to the selected word line, dissimilarly to the refresh operation according to the aforementioned first embodiment. More specifically, the ferroelectric memory first selects the word line WL1 (see FIG. 14), and collectively performs the refresh operation on all memory cells linked to the word line WL1. Thereafter the ferroelectric memory selects the word line WL2, and collectively performs the refresh operation on all memory cells linked to the word line WL2. Thereafter the ferroelectric memory similarly successively selects the respective word lines WL subsequent to the word line WL3, and collectively performs the refresh operation on all memory cells linked to the selected word lines WL. Thus, the refresh operation is performed on all memory cells of the memory cell array 1 (see FIG. 12). The specific method of the refresh operation according to the second embodiment is absolutely similar to the read and rewrite operations of the ordinary access operation according to the aforementioned second embodiment.

Thus, in the read and rewrite operations of the refresh operation according to the second embodiment, recovery and deterioration of the quantities of residual polarization necessarily take place once in all memory cells (memory cells of the first, third and fourth cell regions) other than the memory cells having held data "1" among the memory cells connected to the selected WLs. Therefore, deterioration of the quantities of residual polarization is hardly accumulated in these memory cells also when the ferroelectric memory repetitively performs the refresh operation.

In other words, the ferroelectric memory applies the voltages ±⅓ Vcc of mutually opposite directions once to all memory cells (memory cells of the first, third and fourth cell regions) other than the memory cells having held data "1" among the memory cells connected to the selected WLs in the read and rewrite operations of the refresh operation according to the second embodiment, whereby deterioration of the quantities of residual polarization can be suppressed dissimilarly to a case of repetitively applying only the voltage ⅓ Vcc. Thus, the ferroelectric memory can suppress such a disturbance phenomenon that data are lost from all unselected cells (memory cells of the third and fourth cell regions) and the memory cells of the first cell region having held data "0" among the selected cells.

The remaining effects according to the second embodiment are similar to the effects according to the aforementioned first embodiment.

Third Embodiment

The structure of a ferroelectric memory according to a third embodiment of the present invention is now described with reference to FIGS. 17 and 18.

Figure 17:
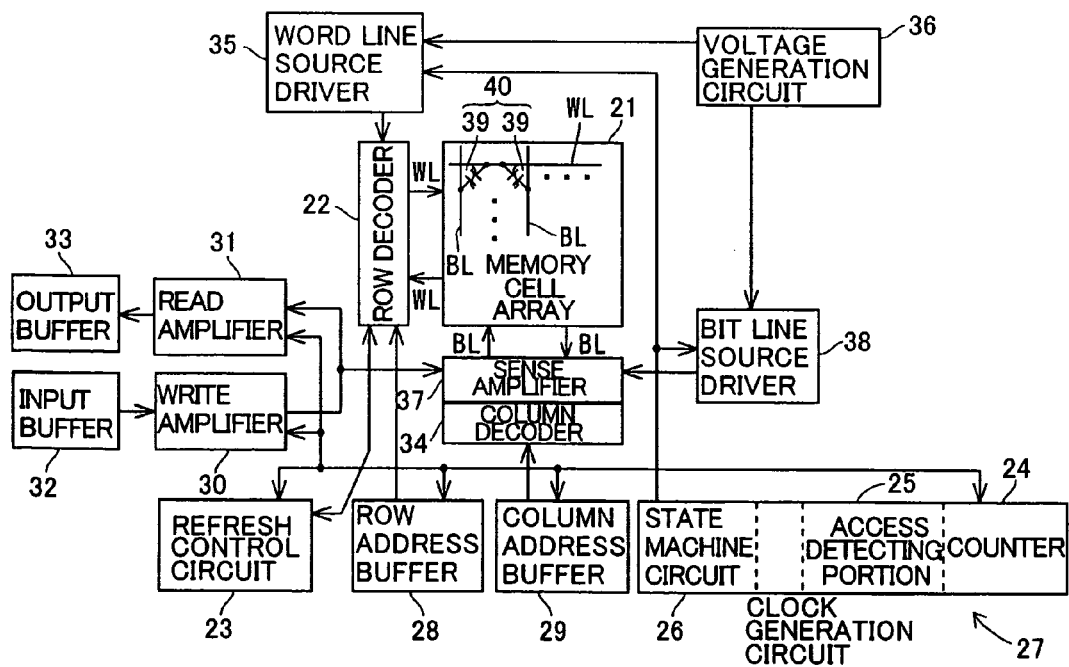
FIG. 17 is a model diagram for illustrating the overall structure of a ferroelectric memory according to a third embodiment of the present invention.
Figure 18:
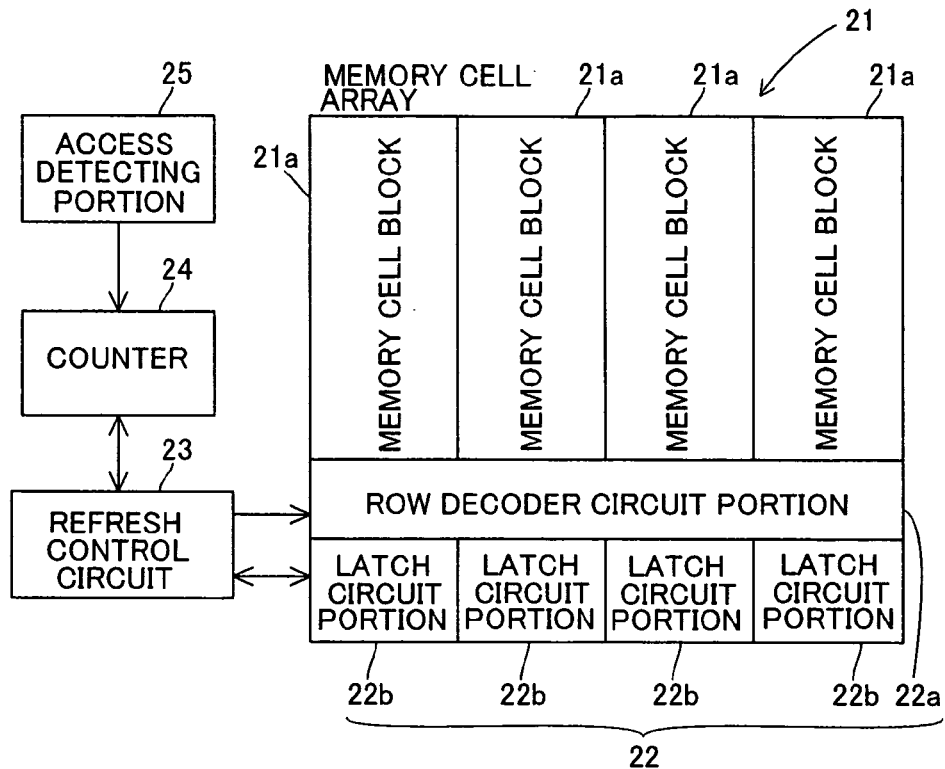
FIG. 18 is a model diagram for illustrating the detailed structure of the ferroelectric memory according to the third embodiment shown in FIG. 17.

The ferroelectric memory according to the third embodiment comprises a memory cell array 21, a row decoder 22, a refresh control circuit 23, a clock generation circuit 27 including a counter 24, an access detecting portion 25 and a state machine circuit 26, a row address buffer 28, a column address buffer 29, a write amplifier 30, a read amplifier 31, an input buffer 32, an output buffer 33, a column decoder 34, a word line source driver 35, a voltage generation circuit 36, a sense amplifier 37 an a bit line source driver 38, as shown in FIG. 17. The refresh control circuit 23 is an example of the "refresh portion" in the present invention, and the counter 24 is an example of the "first frequency detecting portion" in the present invention.

Figure 19:
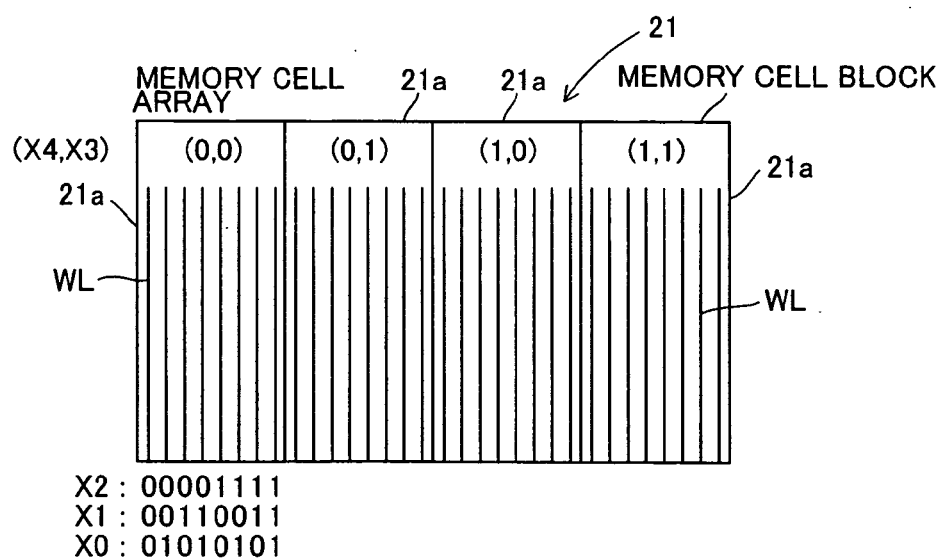
FIG. 19 is a model diagram for illustrating the structure of a memory cell array of the ferroelectric memory according to the third embodiment shown in FIG. 17.

In the memory cell array 21, a plurality of word lines WL and a plurality of bit lines BL are arranged to intersect with each other, while ferroelectric capacitors 39 are arranged on the respective intersectional positions thereof. The ferroelectric capacitors 39 are constituted of the word lines WL, the bit lines BL and ferroelectric films (not shown) arranged between the word lines WL and the bit lines BL. One memory cell 40 is constituted of two ferroelectric capacitors 39. The memory cell array 21 is constituted of four memory cell blocks 21a, as shown in FIG. 18. Each memory cell block 21a includes eight word lines WL and a plurality of memory cells 40 (see FIG. 17) connected to each word line WL, as shown in FIG. 19.

Prescribed row addresses are allocated to each memory cell block 21a and each word line WL respectively. More specifically, a row address expressed as (X4,X3) is allocated to each memory cell block 21a, while an address expressed as (X2, X1,X0) is allocated to each word line WL. Thus, the row address of each word line WL included in each memory cell block 21a is expressed as (X4,X3,X2,X1,X0). The row addresses (X4,X3) of the four memory cell blocks 21a are expressed by row addresses (0,0), (0,1), (1,0) and (1,1) respectively, as shown in FIG. 19. Further, the row addresses (X2,X1,X0) of the eight word lines WL are expressed by row addresses (0,0,0), (0,0,1), (0,1,0), (0,1,1), (1,0,0), (1,0,1), (1,1,0) and (1,1,1) respectively.

The row decoder 22 is connected to the word lines WL, as shown in FIG. 17. This row decoder 22 is constituted of a row decoder circuit portion 22a connected to the word lines WL (see FIG. 17) and four latch circuit portions 22b, as shown in FIG. 18. These latch circuit portions 22b are examples of the "first holding portion" in the present invention.

According to the third embodiment, the latch circuit portions 22b are provided to correspond to the memory cell blocks 21a respectively. Further, each latch circuit portion 22b has a function of holding presence/absence of a read operation or a write operation (hereinafter referred to as an access operation) every memory cell block 21a. More specifically, each latch circuit portion 22b is so formed as to hold high-level data when there has been an access operation with respect to the corresponding memory cell block 21a while holding low-level data when there has been no access operation with respect to the corresponding memory cell block 21a. The refresh control circuit 23 is connected to the row decoder 22, while the counter 24 of the clock generation circuit 27 is connected to the refresh control circuit 23. This counter 24 is so formed as to detect access frequencies (frequencies of read operations and write operations) with respect to all memory cells 40 (see FIG. 17) included in the memory cell array 21 while outputting a prescribed signal to the refresh control circuit 23 when the access frequencies reach a prescribed frequency.

The refresh control circuit 23 is provided for controlling refresh operations on the memory cells 40. This refresh control circuit 23 is so formed as to output a control signal for starting a refresh operation to the row decoder 22 by receiving the signal output from the counter 24 when the access frequencies with respect to all memory cells 40 reach the prescribed frequency. The access detecting portion 25 of the clock generation circuit 27 (see FIG. 17) is provided for detecting an access operation with respect to the memory cells 40. The counter 24 is so formed as to increase the count of the access frequencies by +1 by receiving the fact that an access operation with respect to the memory cells 40 has been detected by the access detecting portion 25.

The counter 24 is connected to the row address buffer 28, the column address buffer 29, the write amplifier 30 and the read amplifier 31, as shown in FIG. 17. The input buffer 32 and the output buffer 33 are connected to the write amplifier 30 and the read amplifier 31 respectively. The row address buffer 28 and the column address buffer 29 are connected to the row decoder 22 and the column decoder 34 respectively. The word line source driver 35 is connected to the row decoder 22, while the voltage generation circuit 36 and the state machine circuit 26 of the clock generation circuit 27 are connected to the word line source driver 35. The column decoder 34 is connected to the bit lines BL of the memory cell array 21 through the sense amplifier 37. The write amplifier 30, the read amplifier 31 and the bit line source driver 38 are connected to the sense amplifier 37, while the voltage generation circuit 36 and the state machine circuit 26 are connected to the bit line source driver 38.

Operations of the ferroelectric memory according to the third embodiment of the present invention are now described with reference to FIGS. 17 to 19.

The ferroelectric memory according to the third embodiment first resets the counter 24 (see FIG. 18) in a power-up state, thereby setting the count of the counter 24 to "0". The ferroelectric memory also resets all latch circuit portions 22b corresponding to the respective memory cell blocks 21a, thereby bringing all latch circuit portions 22b into states (reset states) holding low-level data. Then, the ferroelectric memory starts an access operation with respect to the memory cells 40 (see FIG. 17). At this time, the access operation with respect to all memory cells 40 is detected by the access detecting portion 25. Every time the access operation is detected once by the access detecting portion 25, the count of the counter 24 is increased by +1. Thus, the access frequency with respect to all memory cells 40 in the memory cell 21 is detected by the counter 24.

When the access operation with respect to the memory cells 40 is a read operation, the word line WL (see FIG. 17) corresponding to a row address input from outside the ferroelectric memory is selected by the row decoder 22. Thus, data of the plurality of memory cells 40 connected to the selected word line WL (hereinafter referred to as the selected word line WL) are collectively read on the sense amplifier 37 through the bit lines BL, while the data are amplified by the sense amplifier 37. The data amplified by the sense amplifier 38 are read from the ferroelectric memory through the read amplifier 31 and the output buffer 33. Thereafter the data read by the sense amplifier 37 are rewritten in the memory cells 40 from which the data have been read. When the access operation with respect to the memory cells 40 is a write operation, on the other hand, data of the plurality of memory cells 40 connected to the selected word line WL are read on the sense amplifier 37 similarly to the case of the aforementioned read operation, and the read data are thereafter replaced with data input from outside the ferroelectric memory. Thereafter the replaced data are written in the memory cells 40 from the sense amplifier 37.

In the aforementioned rewrite operation after the read operation and the write operation, a prescribed voltage (½ Vcc or ⅓ Vcc) is applied to the memory cells 40 connected to word lines WL (hereinafter referred to as unselected word lines WL) other than the selected word line WL in the memory cell block 21a corresponding to the selected word line WL. Thus, disturbance takes place in the memory cells 40 connected to the unselected word lines WL in the memory cell block 21a corresponding to the selected word line WL due to reduction of the quantities of polarization of the ferroelectric capacitors 39. In the aforementioned access operation, the latch circuit portion 22b corresponding to the memory cell block 21a subjected to the access operation enters a state holding high-level data, while low-level data are held in the latch circuit portions 22b corresponding to the memory cell blocks 21a subjected to no access operation.

Then, according to the third embodiment, the counter 24 outputs a prescribed signal to the refresh control circuit 23 when detecting that the access frequencies with respect to all memory cells 40 have reached the prescribed frequency. Receiving this signal from the counter 24, the refresh control circuit 23 outputs a control signal for starting a refresh operation to the row decoder 22. At this time, the refresh control circuit 23 outputs row addresses for selecting the word line WL subjected to the refresh operation to the row decoder circuit portion 22a on the basis of the data held in the latch circuit portions 22b in the third embodiment. In other words, the refresh control circuit 23 outputs the row addresses of the word lines WL included in the memory cell block 21a corresponding to any latch circuit portion 22b if this latch circuit portion 22b holds high-level data, while outputting no row addresses of the word lines WL included in the memory cell block 21a corresponding to any latch circuit portion 22b if this latch circuit portion 22b holds low-level data.

For example, it is assumed that there has been an access operation with respect to the memory cell blocks 21a of the row addresses (0,0), (1,0) and (1,1) while there has been no access operation with respect to the memory cell block 21a of the row address (0,1) in the memory cell array 21 shown in FIG. 19. In this case, high-level data are held in the latch circuit portions 22b (see FIG. 18) corresponding to the memory cell blocks 21a of the row addresses (0,0), (1,0) and (1,1), while low-level data is held in the latch circuit portion 22b (see FIG. 18) corresponding to the memory cell block 21a of the row address (0,1). In this case, the refresh control circuit 23 (see FIG. 18) successively outputs row addresses (0,0,0,0,0) to (0,0,1,1,1) corresponding to the word lines WL included in the memory cell block 21a of the row address (0,0) to the row decoder circuit portion 22a, and thereafter outputs no row addresses (0,1,0,0,0) to (0,1,1,1,1) corresponding to the word lines WL included in the memory cell block 21a of the row address (0,1). Therefore, the refresh control circuit 23 successively outputs row addresses (1,0,0,0,0) to (1,0,1,1,1) and (1,1,0,0,0) to (1,1,1,1,1) corresponding to the word lines WL included in the memory cell blocks 21a of the row addresses (1,0) and (1,1) after outputting the row address (0,0,1,1,1).

The word lines WL are selected by the row decoder circuit portion 22a in the order of the row addresses output to the row decoder circuit portion 22a in the aforementioned manner, and data of the memory cells 40 connected to the selected word lines WL are read and amplified by the sense amplifier 37. Thereafter the same data as the data read by the sense amplifier 37 are rewritten in the original memory cells 40. Therefore, rewriting is performed on the memory cells 40 connected to the word lines WL of the row addresses (0,0,0, 0,0) to (0,0,1,1,1), (1,0,0,0,0) to (1,0,1,1,1) and (1,1,0,0,0) to (1,1,1,1,1) output from the refresh control circuit 23 to the row decoder circuit portion 22a, while no rewriting is performed on the memory cells 40 connected to the word lines WL of the eight row addresses (0,1,0,0,0) to (0,1,1,1,1) not output from the refresh control circuit 23 to the row decoder circuit portion 22a. Thus, rewriting is performed on all memory cells 40 included in the memory cell blocks 21a of the row addresses (0,0), (1,0) and (1,1) subjected to the access operation while no rewriting is performed on all memory cells 40 included in the memory cell block 21a of the row address (0,1) subjected to no access operation. The refresh operation on the memory cells 40 is performed in the aforementioned manner.

In the rewriting by the refresh operation, the prescribed voltage (½ Vcc or ⅓ Vcc) is applied to the memory cells 40 connected to unselected word lines WL in the memory cell blocks 21a corresponding to the selected word lines WL, whereby disturbance takes place due to reduction of the quantities of polarization of ferroelectric capacitors 19. After the refresh operation is terminated, the ferroelectric memory resets the counter 24 thereby setting the count to "0" while resetting all latch circuit portions 22a thereby bringing the same into states holding low-level data, similarly to the power-up state. Thereafter the aforementioned operations are repetitively performed.

According to the third embodiment, as hereinabove described, the latch circuit portions 22b holding presence/absence of the access operation every memory cell block 21a are provided while the refresh control circuit 23 is so formed as to perform rewriting on the memory cells 40 included in the memory cell blocks 21a corresponding to the latch circuit portions 22b on the basis of the fact that it is held by the latch circuit portions 22b that there has been an access operation (high-level data) with respect to the corresponding memory cell blocks 21a, whereby the ferroelectric memory can perform rewriting restrictively on the memory cells 40 in the memory cell blocks 21a subjected to the access operation. Thus, the ferroelectric memory can reliably reduce the frequency by which the memory cells 40 already subjected to rewriting (refresh) receive disturbance resulting from a refresh operation of other memory cells 40 as compared with a case of successively performing rewriting on all memory cells 40 included in the memory cell array 21 in the refresh operation. Thus, the ferroelectric memory can reduce the frequency of disturbance applied to the memory cells 40 in refreshing.

According to the third embodiment, the refresh control circuit 23 is so formed as to perform rewriting on the basis of the fact that it has been detected by the counter 24 that the sum of access frequencies with respect to all memory cells 40 included in the memory cell array 21 has reached the prescribed frequency, whereby the ferroelectric memory can periodically perform the refresh operation every constant access frequency dissimilarly to a case of detecting the access frequency with respect to each memory cell block 21a and performing a refresh operation every prescribed access frequency with respect to each memory cell block 21a. Thus, the ferroelectric memory can periodically exercise control such as that for temporarily bringing the ordinary access operation into a standby state in the refresh operation every constant access frequency, whereby control of the ferroelectric memory can be simplified.

Fourth Embodiment

The structure of a ferroelectric memory according to a fourth embodiment of the present invention is now described with reference to FIG. 20.

Figure 20:
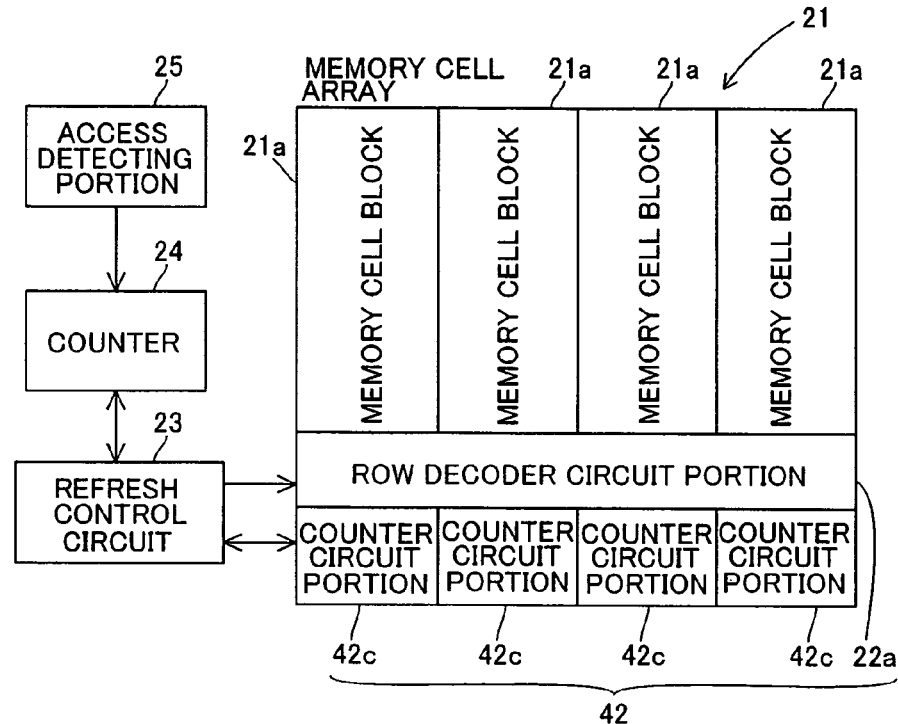
FIG. 20 is a model diagram for illustrating the structure of a ferroelectric memory according to a fourth embodiment of the present invention.

In the ferroelectric memory according to the fourth embodiment, a counter circuit portion 42c is provided to correspond to each memory cell block 21a as shown in FIG. 20, dissimilarly to the ferroelectric memory according to the aforementioned third embodiment. This counter circuit portion 42c is an example of the "second frequency detecting portion" in the present invention. This counter circuit portion 42c is provided for detecting an access frequency every memory cell block 21a. The counter circuit portion 42c is so formed as to increase the count thereof by +1 every time an access operation with respect to the corresponding memory cell block 21a is performed once. According to the fourth embodiment, no latch circuit portions 22b (see FIG. 18) are provided, while a row decoder 42 is constituted of one row decoder circuit portion 22a and four counter circuit portions 42c. The remaining structure of the ferroelectric memory according to the fourth embodiment is similar to the structure of the ferroelectric memory according to the aforementioned third embodiment.

Operations of the ferroelectric memory according to the fourth embodiment are now described with reference to FIG. 20. The ferroelectric memory according to the fourth embodiment detects access frequencies with respect to all memory cells 40 (see FIG. 17) with the counter 24, and detects the access frequency every memory cell block 21a with each counter circuit portion 42c. The counter circuit portion 42c increase the count of the access frequency by +1 every time an access operation with respect to the corresponding memory cell block 21a is performed once.

On the basis of the fact that the counter 24 has detected that the access frequencies with respect to all memory cells 40 have reached a prescribed frequency, the counter 24 outputs a signal to a refresh control circuit 23. The refresh control circuit 23 outputs a control signal for starting a refresh operation to the row decoder 42 on the basis of the signal from the counter 24. At this time, the refresh control circuit 23 outputs row addresses for selecting word lines WL subjected to the refresh operation to the row decoder circuit portion 22a on the basis of the access frequency every memory cell block 21a detected by each counter circuit portion 42c according to the fourth embodiment. When the access frequency detected by any counter circuit portion 42a is less than the prescribed frequency (Nb), the refresh control circuit 23 outputs no row addresses of word lines WL included in the memory cell block 21a corresponding to the counter circuit portion 42c to the row decoder circuit portion 22a. When the access frequency detected by any counter circuit portion 42c is in excess of the prescribed frequency (Nb), on the other hand, the refresh control circuit 23 outputs row addresses of the word lines WL included in the memory cell block 21a corresponding to the counter circuit portion 42c to the row decoder circuit portion 22a. Thus, the ferroelectric memory can perform no refresh operation on the memory cells 40 of the memory cell block 21a whose access frequency is less than the prescribed frequency (Nb), and can perform a refresh operation on the memory cells 40 of the memory cell block 21a whose access frequency is in excess of the prescribed frequency (Nb). The remaining operations of the ferroelectric memory according to the fourth embodiment are similar to those of the ferroelectric memory according to the aforementioned third embodiment.

According to the fourth embodiment, as hereinabove described, the counter circuit portions 42c detecting the access frequency every memory cell block 21a are provided while the refresh control circuit 23 is so formed as to perform rewriting on all memory cells 40 included in the memory cell block 21a corresponding to any counter circuit portion 42c on the basis of the fact that it has been detected by the counter circuit portion 42c that the access frequency with respect to the corresponding memory cell block 21a has reached the prescribed frequency (Nb), whereby the ferroelectric memory can perform rewriting restrictively on the memory cells 40 in the memory cell block 21a which must be subjected to the refresh operation due to the access frequency reaching the prescribed frequency (Nb). Thus, the ferroelectric memory can reduce the frequency of disturbance applied to the memory cells 40 already subjected to rewriting (refresh) due to a refresh operation of other memory cells 40 as compared with a case of successively performing rewriting on all memory cells 40 included in the memory cell array 21 in the refresh operation. Thus, the ferroelectric memory can reduce the frequency of disturbance applied to the memory cells 40 in refreshing.

According to the fourth embodiment, the refresh control circuit 23 is so formed as to perform rewriting on the basis of the fact that it has been detected by the counter 24 that the sum of access frequencies with respect to all memory cells 40 included in the memory cell array 21 has reached the prescribed frequency, whereby the ferroelectric memory can periodically perform the refresh operation every constant access frequency dissimilarly to a case of detecting the access frequency with respect to each memory cell block 21*a* and performing a refresh operation every prescribed access frequency with respect to each memory cell block 21*a*. Thus, the ferroelectric memory can periodically exercise control such as that for temporarily bringing the ordinary access operation into a standby state in the refresh operation every constant access frequency, whereby control of the ferroelectric memory can be simplified.

Fifth Embodiment

The structure of a ferroelectric memory according to a fifth embodiment of the present invention is now described with reference to FIGS. 21 and 22.

Figure 21:
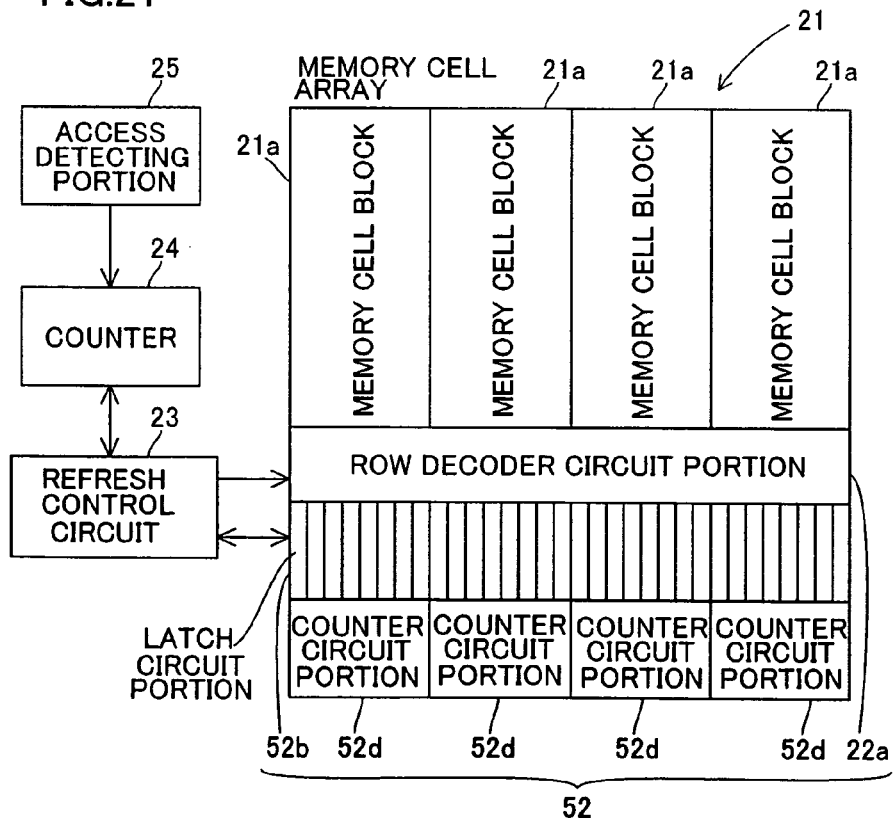
FIG. 21 is a model diagram for illustrating the structure of a ferroelectric memory according to a fifth embodiment of the present invention.
Figure 22:
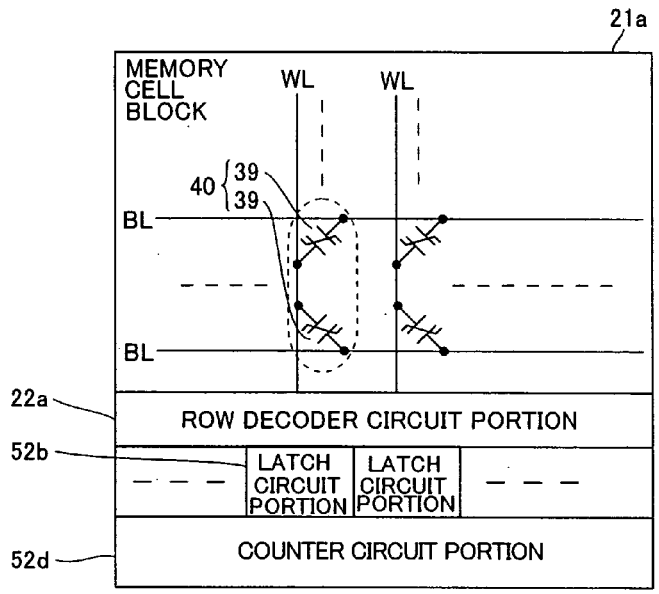
FIG. 22 is a model diagram for illustrating the structures of a memory cell block and a row decoder of the ferroelectric memory according to the fifth embodiment shown in FIG. 21.

In the ferroelectric memory according to the fifth embodiment, a latch circuit portion 52*b* is provided every word line WL as shown in FIGS. 21 and 22, dissimilarly to the ferroelectric memory according to the aforementioned third embodiment. Therefore, eight latch circuit portions 52*b* are provided every memory cell block 21*a* since each memory block 21*a* includes eight word lines WL. These latch circuit portions 52*b* are examples of the "first holding portion" in the present invention. Each latch circuit portion 52*b* has a function of holding presence/absence of an access operation every word line WL. More specifically, this latch circuit portion 52*b* is so formed as to hold high-level data when there has been an access operation through the corresponding word line WL, while holding low-level data when there is no access operation through the corresponding word line WL.

The ferroelectric memory according to the fifth embodiment has a counter circuit portion 52*d* for detecting the access frequency every memory cell block 21*a*. This counter circuit portion 52*d* is an example of the "second frequency detecting portion" in the present invention. This counter circuit portion 52*d* is provided every memory cell block 21*a*. The counter circuit portion 52*d* is so formed as to increase the count thereof by +1 every time an access operation with respect to the corresponding memory cell block 21*a* is performed once. According to the fifth embodiment, a row decoder 52 is constituted of one row decoder circuit portion 22*a*, 32 latch circuit portions 52*b* and four counter circuit portions 52*d*. The remaining structure of the ferroelectric memory according to the fifth embodiment is similar to that of the ferroelectric memory according to the aforementioned third embodiment.

Operations of the ferroelectric memory according to the fifth embodiment of the present invention are now described with reference to FIGS. 21 and 22. When an access operation with respect to memory cells 40 is performed through each word line WL (see FIG. 22) in the ferroelectric memory according to the fifth embodiment, data held in the latch circuit portion 52*b* corresponding to the word line WL is changed to a high level. Every time an access operation with respect to the memory cells 40 is performed once through each word line WL, the access frequency is increased by +1 in the counter circuit portion 52*d* corresponding to the memory cell block 21*a* to which the word line WL belongs.

If high-level data are held by the eight latch circuit portions 52*b* corresponding to any memory cell block 21*a* when it has been detected by the counter circuit portion 52*d* that the access frequency with respect to this memory cell block 21*a* has reached the prescribed frequency (Nc), the ferroelectric memory converts and fixes the data held by the eight latch circuit portions 52*b* to low levels according to the fifth embodiment. If latch circuit portions 52*b* holding low-level data and latch circuit portions 52*b* holding high-level data are present in the eight latch circuit portions 52*b* corresponding to any memory cell block 21*a* when it has been detected by the counter circuit portion 52*d* that the access frequency with respect to this memory cell block 21*a* has reached the prescribed frequency (Nc), the ferroelectric memory converts and fixes the data held in the eight latch circuit portions 52*b* to high levels.

On the basis of the fact that a counter 24 has detected that the access frequencies with respect to all memory cells 40 have reached the prescribed frequency, the counter 24 outputs a signal to a refresh control circuit 23. The refresh control circuit 23 outputs a control signal for starting a refresh operation to the row decoder 52 on the basis of the signal from the counter 24. At this time, the refresh control circuit 23 outputs row addresses for selecting word lines WL subjected to the refresh operation to the row decoder circuit portion 22*a* on the basis of the data held in the latch circuit portions 52*b* according to the fifth embodiment. When data held in the eight latch circuit portions 52*b* corresponding to a prescribed memory cell block 21*a* are at high levels, the refresh control circuit 23 outputs the row addresses of all word lines WL included in this memory cell block 21*a* to the row decoder circuit portion 22*a*. When all data held in the eight latch circuit portions 52*b* corresponding to the prescribed memory cell block 21*a* are at low levels, on the other hand, the refresh control circuit 23 does not output the row addresses of all word lines WL included in this memory cell block 21*a* to the row decoder circuit portion 22*a*. Thus, no refresh operation is performed on all memory cells 40 included in the memory cell block 21*a* when there has been an access operation through all eight word lines WL included in the memory cell block 21*a* and when there has been absolutely no access operation through the eight word lines WL.

When word lines WL subjected to the access operation and word lines WL subjected to no access operation are present in the eight word lines WL included in the memory cell block 21*a*, on the other hand, the refresh operation is performed on all memory cells 40 included in the memory cell block 21*a*. When there has been an access operation through all eight word lines WL included in the memory cell block 21*a*, the ferroelectric memory performs no refresh operation on all memory cells 40 included in the memory cell block 21*a* for the following reason: The memory cells 40 of the memory cell block 21*a* subjected to the access operation through all eight word lines WL are conceivably relatively uniformly subjected to the access operation, and hence influence by disturbance is conceivably relatively small. The remaining operations of the ferroelectric memory according to the fifth embodiment are similar to those of the ferroelectric memory according to the aforementioned third embodiment.

According to the fifth embodiment, as hereinabove described, the circuit portions 52*b* holding presence/absence of an access operation every word line WL are provided while the refresh control circuit 23 is so formed as to perform rewriting on the memory cells 40 included in the memory cell block 21*a* corresponding to the latch circuit portion 52*b* on the basis of the fact that it is held by the latch circuit portion 52*b* that there has been an access operation (high-level data) with respect to the corresponding memory cell block 21*a*, whereby the ferroelectric memory can perform rewriting restrictively on the memory cells 40 in the memory cell block 21*a* subjected to the access operation. Thus, the ferroelectric memory can reduce the frequency of disturbance applied to the memory cells 40 already subjected to rewriting (refresh) due to a refresh operation of other memory cells 40 as compared with a case of successively performing rewriting on all memory cells 40 included in the memory cell array 21 in the refresh operation. Therefore, the ferroelectric memory can reduce the frequency of disturbance applied to the memory cells 40 in refreshing.

According to the fifth embodiment, the refresh control circuit 23 is so formed as to perform rewriting on the basis of the fact that it has been detected by the counter 24 that the sum of the access frequencies with respect to all memory cells 40 included in the memory cell array 21 has reached the prescribed frequency, whereby the ferroelectric memory can periodically perform the refresh operation every constant access frequency dissimilarly to a case of detecting the access frequency with respect to each memory cell block 21a and performing a refresh operation every prescribed access frequency with respect to each memory cell block 21a. Thus, the ferroelectric memory can periodically exercise control such as that for temporarily bringing the ordinary access operation into a standby state in the refresh operation every constant access frequency, whereby control of the ferroelectric memory can be simplified.

According to the fifth embodiment, the ferroelectric memory can make the refresh control circuit 23 not output the row addresses of the word lines WL included in any memory cell block 21a to the row decoder circuit portion 22a by entirely converting and fixing data held by the eight latch circuit portions 52b to low levels if high-level data are held by all of the eight latch circuit portions 52b corresponding to the memory cell block 21a when it has been detected by the counter circuit portion 52b that the access frequency with respect to the memory cell block 21a has reached the prescribed frequency (Nc). Thus, the ferroelectric memory can perform no rewriting (refresh) on the memory cell block 21a whose memory cells 40 have been relatively uniformly subjected to the access operation due to the access operation performed through all of the eight word lines WL. Therefore, the ferroelectric memory can perform no rewriting on the memory cells 40 of the memory cell block 21a conceivably slightly influenced by disturbance due to the access operation relatively uniformly performed on the memory cells 40 in the refresh operation. Thus, the ferroelectric memory can reduce the frequency for performing rewriting by the refresh operation, thereby reducing the frequency of disturbance applied to the memory cells 40 in the refresh operation also according to this.

Sixth Embodiment

The structure of a ferroelectric memory according to a sixth embodiment of the present invention is now described with reference to FIGS. 23 to 26.

Figure 23:
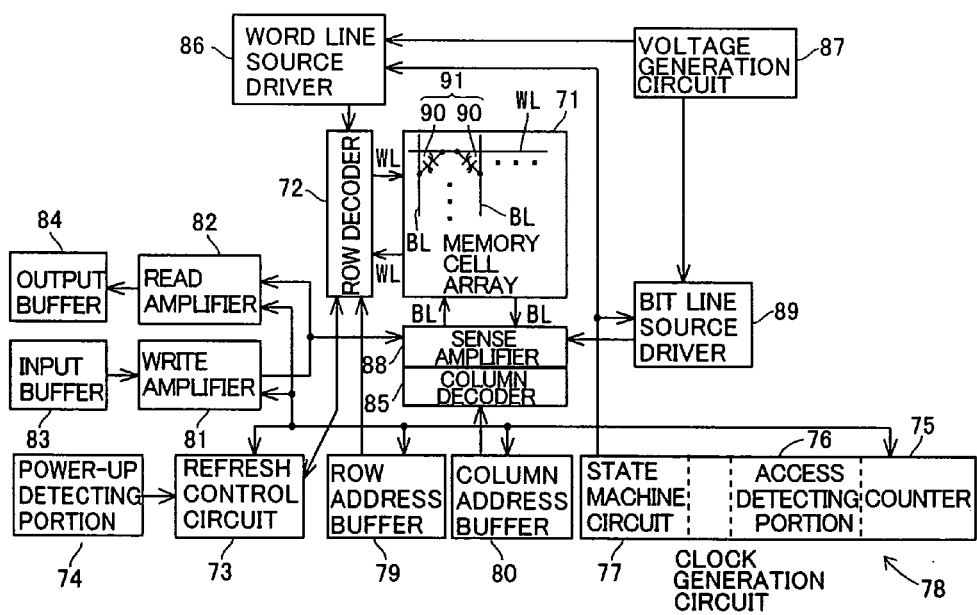
FIG. 23 is a model diagram for illustrating the overall structure of a ferroelectric memory according to a sixth embodiment of the present invention.

The ferroelectric memory according to the sixth embodiment comprises a memory cell array 71, a row decoder 72, a refresh control circuit 73, a power-up detecting portion 74, a clock generation circuit 78 including a counter 75, an access detecting portion 76 and a state machine circuit 77, a row address buffer 79, a column address buffer 80, a write amplifier 81, a read amplifier 82, an input buffer 83, an output buffer 84, a column decoder 85, a word line source driver 86, a voltage generation circuit 87, a sense amplifier 88 and a bit line source driver 89, as shown in FIG. 23. The refresh control circuit 73 is an example of the "refresh portion" in the present invention, and the power-up detecting portion 74 is an example of the "power-up detecting portion" in the present invention. The counter 75 is an example of the "first frequency detecting portion" in the present invention.

Figure 24:
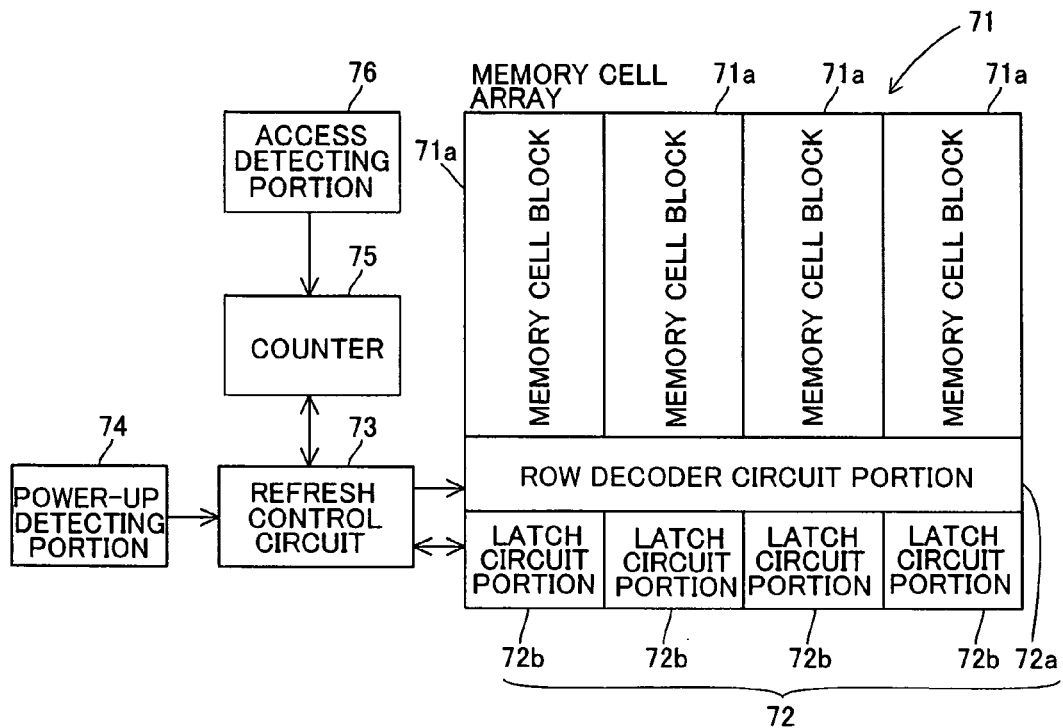
FIG. 24 is a model diagram for illustrating the detailed structure of the ferroelectric memory according to the sixth embodiment shown in FIG. 23.
Figure 25:
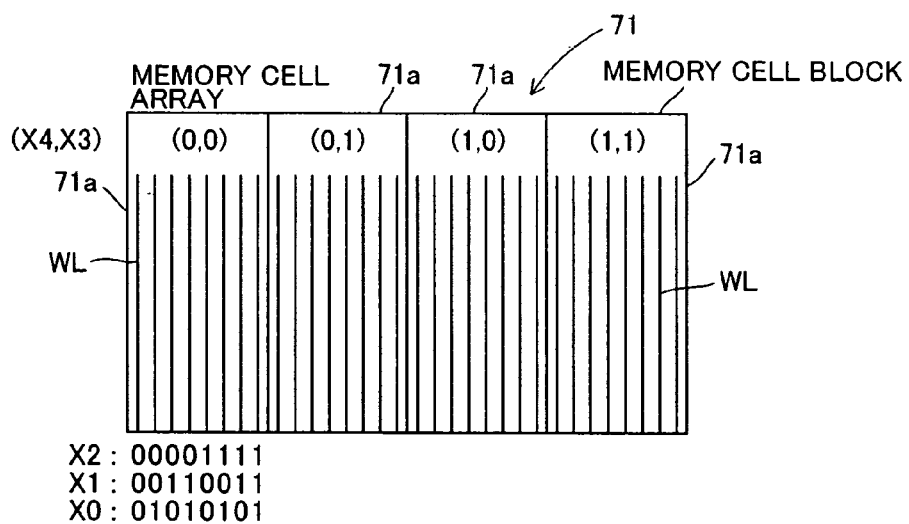
FIG. 25 is a model diagram for illustrating the structure of a memory cell array of the ferroelectric memory according to the sixth embodiment shown in FIG. 23.

In the memory cell array 71, a plurality of word lines WL and a plurality of bit lines BL are arranged to intersect with each other, while ferroelectric capacitors 90 are arranged on the respective intersectional positions thereof. The ferroelectric capacitors 90 include ferroelectric films (not shown) arranged between the word lines WL and the bit lines BL. One memory cell 91 is constituted of two ferroelectric capacitors 90. The memory cell array 71 is constituted of four memory cell blocks 71a, as shown in FIG. 24. Each memory cell block 71a includes eight word lines WL and a plurality of memory cells 91 (see FIG. 23) connected to each word line WL, as shown in FIG. 25.

Prescribed row addresses are allocated to each memory cell block 71a and each word line WL respectively. More specifically, a row address expressed as (X4,X3) is allocated to each memory cell block 71a while an address expressed as (X2, X1,X0) is allocated to each word line WL, as shown in FIG. 25. Thus, the row address of each word line WL included in each memory cell block 21a is expressed as (X4,X3,X2,X1, X0). The row addresses (X4,X3) of the four memory cell blocks 71a are expressed by row addresses (0,0), (0,1), (1,0) and (1,1) respectively. Further, the row addresses (X2,X1,X0) of the eight word lines WL are expressed by row addresses (0,0,0), (0,0,1), (0,1,0), (0,1,1), (1,0,0), (1,0,1), (1,1,0) and (1,1,1) respectively.

The row decoder 72 is connected to the word lines WL, as shown in FIG. 23. This row decoder 72 is constituted of a row decoder circuit portion 72a connected to the word lines WL (see FIG. 23) and four latch circuit portions 72b, as shown in FIG. 24. These latch circuit portions 72b are examples of the "first holding portion" in the present invention.

According to the sixth embodiment, the latch circuit portions 72b are provided to correspond to the memory cell blocks 71a respectively. Further, each latch circuit portion 72b has a function of holding presence/absence of read and rewrite operations or a write operation (hereinafter referred to as an access operation) every memory cell block 71a. More specifically, each latch circuit portion 72b is so formed as to hold high-level data when there has been an access operation with respect to the corresponding memory cell block 71a while holding low-level data when there has been no access operation with respect to the corresponding memory cell block 71a. The refresh control circuit 73 for controlling a refresh operation with respect to the memory cells 91 is connected to the row decoder 72, while the power-up detecting portion 74 and the counter 75 of the clock generation circuit 78 are connected to the refresh control circuit 73.

Figure 26:
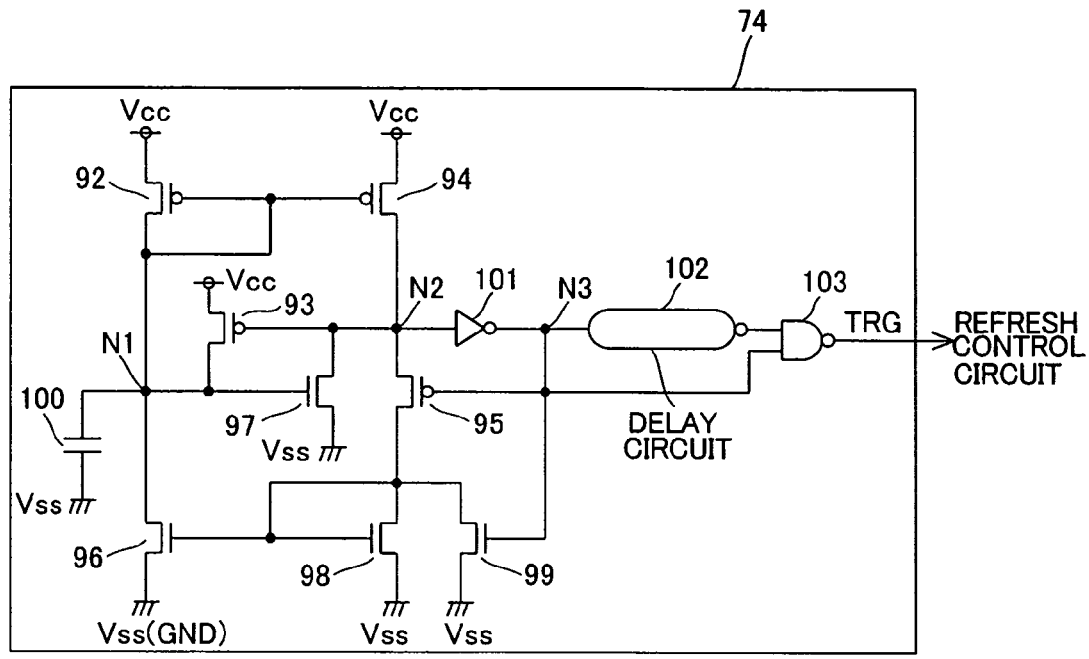
FIG. 26 is a circuit diagram for illustrating the structure of a power-up detecting portion of the ferroelectric memory according to the sixth embodiment shown in FIG. 23.

The power-up detecting portion 74 according to the sixth embodiment is so formed as to output a trigger signal TRG for driving the refresh control circuit 73 to the refresh control circuit 73 by detecting a power-up state. More specifically, the power-up detecting portion 74 is constituted of four p-channel transistors 92 to 95, four n-channel transistors 96 to 99, a capacitor 100, an inverter circuit 101, a delay circuit 102 and a NAND circuit 103, as shown in FIG. 26. A power supply voltage Vcc is supplied to the source of the p-channel transistor 92, while the drain of the n-channel transistor 96 is connected to the drain thereof. A first electrode of the capacitor 100 is connected to a node N1 between the drains of the p-channel transistor 92 and the n-channel transistor 96. A second electrode of this capacitor 100 is grounded. The drain of the p-channel transistor 93 and the gate of the n-channel transistor 97 are connected to the node N1. The power supply voltage Vcc is supplied to the source of the p-channel transistor 93. The source of the n-channel transistor 97 is grounded.

The gate and the drain of the p-channel transistor 92 are connected with each other, and the gate of the p-channel transistor 94 is connected to the gate and the drain of this p-channel transistor 92. The power supply voltage Vcc is supplied to the source of the p-channel transistor 94, while the drain thereof is connected to the source of the p-channel transistor 95. The gate of the p-channel transistor 93, the drain of the n-channel transistor 97 and an input side of the inverter circuit 101 are connected to a node N2 between the drain of this p-channel transistor 94 and the source of the p-channel transistor 95. The drains of the n-channel transistors 98 and 99 are connected to the drain of the p-channel transistor 95. The gate and the drain of the n-channel transistor 98 are connected with each other. The sources of the n-channel transistors 96, 98 and 99 are grounded respectively.

The inverter circuit 101 is formed to be supplied with the power supply voltage Vcc as a high-level voltage. This inverter 101 operates after the supplied power supply voltage Vcc rises to a prescribed voltage upon power supply (in a power-up state). In a period when the supplied power supply voltage Vcc is smaller than the prescribed voltage immediately after power supply, therefore, the inverter circuit 101 is not driven and does not output a signal obtained by inverting an input signal. The delay circuit 102 is connected to an output side of the inverter circuit 101. This delay circuit 102 is so formed as to output a signal delayed by a prescribed period and inverted with respect to an input signal. Further, the delay circuit 102 is formed to be supplied with the power supply voltage Vcc as a high-level voltage, similarly to the aforementioned inverter circuit 101. Thus, the delay circuit 102 is not driven in the period when the supplied power supply voltage Vcc is smaller than the prescribed voltage immediately after power supply, and does not output the signal obtained by inverting the input signal. The gates of the p-channel transistor 95 and the n-channel transistor 99 and a first input terminal of the NAND circuit 103 are connected to a node N3 between the inverter circuit 101 and the delay circuit 102. An output of the delay circuit 102 is supplied to a second input terminal of the NAND circuit 103. The NAND circuit 103 is so formed that the trigger signal TRG for driving the refresh control circuit 73 (see FIG. 23) is output therefrom. Further, the NAND circuit 103 is formed to be supplied with the power supply voltage Vcc as a high-level voltage, similarly to the aforementioned inverter circuit 101. Thus, the NAND circuit 103 is not driven in the period when the supplied power supply voltage Vcc is smaller than the prescribed voltage immediately after power supply, and outputs a low-level signal in this period.

The counter 75 (see FIG. 24) is so formed as to detect access frequencies (frequencies of read and rewrite operations and write operations) with respect to all memory cells 91 (see FIG. 23) included in the memory cell array 71 and to output a prescribed signal to the refresh control circuit 73 when the access frequencies reach a prescribed frequency. Further, the refresh control circuit 73 is so formed as to output a control signal for starting a refresh operation to the row decoder 72 when the trigger signal TRG is input from the power-up detecting portion 74 in the power-up state and when the prescribed signal is input from the counter 75 when the access frequencies with respect to all memory cells 91 have reached the prescribed frequency. The access detecting portion 76 of the clock generation circuit 78 (see FIG. 23) is provided for detecting the access frequencies with respect to the memory cells 91. The counter 75 is so formed as to increase the count of the access frequencies by +1 by receiving that an access operation with respect to the memory cells 91 has been detected by the access detecting portion 76.

The counter 75 is connected to the row address buffer 79, the column address buffer 80, the write amplifier 81 and the read amplifier 82, as shown in FIG. 23. The input buffer 83 and the output buffer 84 are connected to the write amplifier 81 and the read amplifier 82 respectively. The row address buffer 79 and the column address buffer 80 are connected to the row decoder 72 and the column decoder 85 respectively. The word line source driver 86 is connected to the row decoder 72, while the voltage generation circuit 87 and the state machine circuit 77 of the clock generation circuit 78 are connected to the word line source driver 86. The column decoder 85 is connected to the bit lines BL of the memory cell array 71 through the sense amplifier 88. The write amplifier 81, the read amplifier 82 and the bit line source driver 89 are connected to the sense amplifier 88, while the voltage generation circuit 87 and the state machine circuit 77 are connected to the bit line source driver 89.

Operations of the ferroelectric memory according to the sixth embodiment of the present invention are now described with reference to FIGS. 23 to 27.

Figure 27:
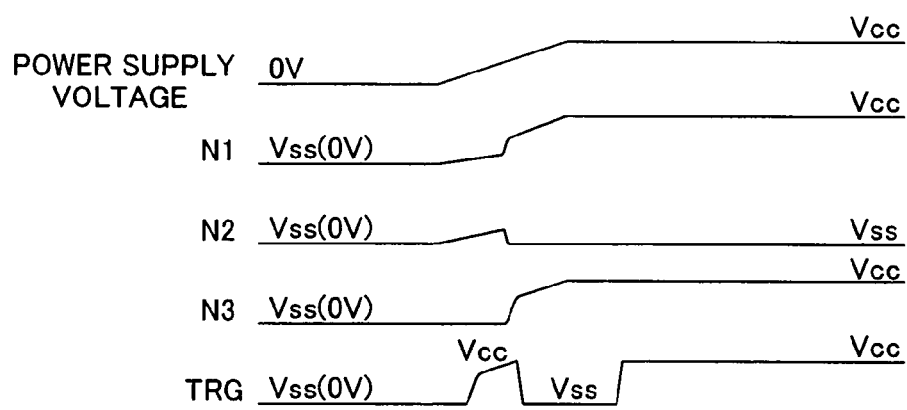
FIG. 27 is a voltage waveform diagram for illustrating operations of the power-up detecting portion of the ferroelectric memory according to the sixth embodiment of the present invention.

In use of the ferroelectric memory according to the sixth embodiment, power is first supplied to bring the ferroelectric memory into a power-up state. According to this sixth embodiment, the ferroelectric memory performs a refresh operation on all memory cells 91 (see FIG. 23) in the power-up state. More specifically, the power supply voltage Vcc of the power-up detecting portion 74 (see FIG. 26), the voltages of the nodes N1 to N3 and the voltage of the trigger signal TRG are 0 V in an initial state before starting power supply, as shown in FIG. 27. In the power-up state, the potential of the power supply voltage Vcc gradually rises from 0 V to a set potential. Thus, the potential of the node N1 (see FIG. 26) is gradually increased from 0 V through the p-channel transistor 92, while the potential of the node N2 is gradually increased through the p-channel transistor 94. At this time, the capacitor 100 liked to the node N1 is so charged that the potential of the node N1 is slowly increased as compared with the potential of the node N2. At this time, all of the inverter circuit 101, the delay circuit 102 and the NAND circuit 103 are not driven until the supplied power supply voltage Vcc reaches a prescribed voltage, whereby the potential of the node N3 and the trigger signal TRG are held at Vss (0 V: low level) until the power supply voltage Vcc reaches the prescribed voltage.

Then, the power supply voltage Vcc supplied to the inverter circuit 101, the delay circuit 102 and the NAND circuit 103 reaches the prescribed voltage so that the inverter circuit 101, the delay circuit 102 and the NAND circuit 103 are driven. At this time, the potential of the node N2 is higher than the logical threshold of the inverter circuit 101. Thus, a signal of Vss (0 V: low level) obtained by inverting the input signal is output from the inverter circuit 101, whereby the potential of the node N3 is held at Vss (0 V: low level). Therefore, the voltage of a first input signal directly input from the node N3 in the NAND circuit 103 is held at Vss (0 V: low level). The voltage of a second input signal input from the node N3 in the NAND circuit 103 through the delay circuit 102 rises to the set voltage (high level) of Vcc. Thus, the trigger signal TRG output from the NAND circuit 103 rises to the set voltage (high level) of Vcc.

When the potential of the node N1 rises to the threshold voltage of the n-channel transistor 97, the n-channel transistor 97 enters an ON state. Thus, the potential of the node N2 lowers to Vss (0 V: low level) through the n-channel transistor 97. Therefore, the output of the inverter circuit 101 is inverted, so that the output of the inverter circuit 101 rises to the set voltage (high level) of Vcc. Thus, the potential of the node N3 rises to the set voltage (high level) of Vcc, whereby the voltage of the first input signal directly input from the node N3 in the NAND circuit 103 rises from Vss (0 V: low level) to the set voltage (high level) of Vcc. The voltage of the second input signal input from the node N3 in the NAND circuit 103 through the delay circuit 102 lowers from the set voltage (high level) of Vcc to Vss (0 V: low level) in a delay by a prescribed period from the point of time when the potential of the node N3 rises to the set voltage (high level) of Vcc. Therefore, the voltage of the input signal input from the node N3 in the NAND circuit 103 through the delay circuit 102 is held at the set voltage (high level) of Vcc for the prescribed period from the point of time when the potential of the node N3 rises to the set voltage (high level) of Vcc. Thus, the trigger signal TRG output from the NAND circuit 103 lowers to Vss (0 V: low level) following the potential of the node N3 rising to the set voltage (high level) of Vcc, and is thereafter held at Vss (0 V: low level) for the prescribed period. Thereafter the trigger signal TRG rises to the set voltage (high level) of Vcc.

When the trigger signal TRG of Vss (0 V: low level) is input from the NAND circuit 103 in the refresh control circuit 73 (see FIG. 24), the refresh control circuit 73 outputs the control signal for starting the refresh operation on all memory cells 91 (see FIG. 23) to the row decoder 72. At this time, the refresh control circuit 73 successively outputs all row addresses (0,0, 0,0,0) to (1,1,1,1,1) (see FIG. 25) to the row decoder circuit portion 72a. Thus, the refresh operation is successively performed on all memory cells 91 in the memory cell array 71.

The refresh operation is performed by performing reading and rewriting on the memory cells 91. More specifically, a word line WL corresponding to any row address output to the row decoder circuit portion 72a is selected. Data of the plurality of memory cells 91 connected to the selected word line WL (hereinafter referred to as the selected word line WL) are collectively read on the sense amplifier 88, and the data are amplified by the sense amplifier 88. Thereafter the data read by the sense amplifier 88 are rewritten in the memory cells 91 from which the data have been read. All memory cells 91 in the memory cell array 71 are successively refreshed in the power-up state in the aforementioned manner.

According to the sixth embodiment, the ferroelectric memory resets the counter 75 (see FIG. 24) in the power-up state, thereby setting the count of the counter 75 to "0". Further, the ferroelectric memory also entirely resets the latch circuit portions 72b corresponding to the respective memory cell blocks 71a, thereby bringing all latch circuit portions 72b into states (reset states) holding low-level data. Then, the ferroelectric memory starts an access operation with respect to the memory cells 91 (see FIG. 23). At this time, the access operation with respect to all memory cells 91 is detected by the access detecting portion 76. Every time the access operation is detected by the access detecting portion 76 once, the count of the counter 75 is increased by +1. Thus, the access frequencies with respect to all memory cells 91 in the memory cell array 71 are detected by the counter 75.

When the access operation with respect to the memory cells 91 is read and rewrite operations, the word line WL (see FIG. 23) corresponding to any row address input from outside the ferroelectric memory is selected by the row decoder 72. Thus, data of the plurality of memory cells 91 connected to the selected word line WL are collectively read on the sense amplifier 88 through the bit lines BL, and the data are amplified by the sense amplifier 88. The data amplified by the sense amplifier 88 are read out from the ferroelectric memory through the read amplifier 82 and the output buffer 84. Thereafter the data read by the sense amplifier 88 are rewritten in the memory cells 91 from which the data have been read. When the access operation with respect to the memory cells 91 is a write operation, on the other hand, data of the plurality of memory cells 91 connected to the selected word line WL are read on the sense amplifier 88 similarly to the case of the aforementioned read operation, and the read data are thereafter replaced with data input from outside the ferroelectric memory. Thereafter the replaced data are written in the memory cells 91 from the sense amplifier 88.

In the rewrite operation after the aforementioned read operation and the write operation, a prescribed voltage (½ Vcc or ⅓ Vcc) is applied to the memory cells 91 connected to word lines WL (hereinafter referred to as unselected word lines WL) other than the selected word line WL in the memory cell block 71a corresponding to the selected word line WL. Thus, disturbance takes place in the memory cells 91 connected to the unselected word lines WL in the memory cell block 71a corresponding to the selected word line WL due to reduction of the quantities of polarization of the ferroelectric capacitors 90. In the aforementioned access operation, the latch circuit portion 72b corresponding to the memory cell block 71a subjected to the access operation enters a state holding high-level data, while low-level data are held in the latch circuit portions 72b corresponding to the memory cell blocks 71a subjected to no access operation.

Then, according to the sixth embodiment, the counter 75 outputs a prescribed signal to the refresh control circuit 73 when detecting that the access frequencies with respect to all memory cells 91 have reached the prescribed frequency. Receiving this signal from the counter 75, the refresh control circuit 73 outputs a control signal for starting a refresh operation to the row decoder 72. At this time, the refresh control circuit 73 outputs row addresses for selecting the word line WL subjected to the refresh operation to the row decoder circuit portion 72a on the basis of the data held in the latch circuit portions 72b in the sixth embodiment. In other words, the refresh control circuit 73 outputs the row addresses of the word lines WL included in the memory cell block 71a corresponding to any latch circuit portion 72b if this latch circuit portion 72b holds high-level data, while outputting no row addresses of the word lines WL included in the memory cell block 71a corresponding to any latch circuit portion 72b if this latch circuit portion 72b hold low-level data.

For example, it is assumed that there has been an access operation with respect to the memory cell blocks 71a of the row addresses (0,0), (1,0) and (1,1) while there has been no access operation with respect to the memory cell block 71a of the row address (0,1) in the memory cell array 71 shown in FIG. 25. In this case, high-level data are held in the latch circuit portions 72b (see FIG. 24) corresponding to the memory cell blocks 71a of the row addresses (0,0), (1,0) and (1,1), while low-level data is held in the latch circuit portion 72b (see FIG. 24) corresponding to the memory cell block 71a of the row address (0,1). In this case, the refresh control circuit 73 (see FIG. 24) successively outputs row addresses (0,0,0,0,0) to (0,0,1,1,1) corresponding to the word lines WL included in the memory cell block 71a of the row address (0,0) to the row decoder circuit portion 72a, and thereafter outputs no row addresses (0,1,0,0,0) to (0,1,1,1,1) corresponding to the word lines WL included in the memory cell block 71a of the row address (0,1). Therefore, the refresh control circuit 73 successively outputs row addresses (1,0,0, 0,0) to (1,0,1,1,1) and (1,1,0,0,0) to (1,1,1,1,1) corresponding to the word lines WL included in the memory cell blocks 71a of the row addresses (1,0) and (1,1) after outputting the row address (0,0,1,1,1).

The word lines WL are selected by the row decoder circuit portion 72a in the order of the row addresses output to the row decoder circuit portion 72a (see FIG. 24) in the aforementioned manner, and data of the memory cells 91 connected to the selected word lines WL are read and amplified by the sense amplifier 88. Thereafter the same data as the data read by the sense amplifier 88 are rewritten in the original memory cells 91. Therefore, reading and rewriting are performed on the memory cells 91 connected to the word lines WL of the row addresses (0,0,0,0) to (0,0,1,1), (1,0,0,0) to (1,0,1, 1,1) and (1,1,0,0,0) to (1,1,1,1,1) output from the refresh control circuit 73 to the row decoder circuit portion 72a, while no reading and rewriting are performed on the memory cells 91 connected to the word lines WL of the eight row addresses (0,1,0,0,0) to (0,1,1,1,1) not output from the refresh control circuit 73 to the row decoder circuit portion 72a. Thus, reading and rewriting are performed on all memory cells 91 included in the memory cell blocks 71a of the row addresses (0,0), (1,0) and (1,1) subjected to the access operation while no reading and rewriting are performed on all memory cells 91 included in the memory cell block 71a of the row address (0,1) subjected to no access operation. The refresh operation on the memory cells 91 after the prescribed frequency of access operations is performed in the aforementioned manner.

In the reading and rewriting by the refresh operation, the prescribed voltage (½ Vcc or ⅓ Vcc) is applied to the memory cells 91 connected to unselected word lines WL in the memory cell blocks 71a corresponding to the selected word lines WL, whereby disturbance takes place due to reduction of the quantities of polarization of the ferroelectric capacitors 90. After the refresh operation following the prescribed frequency of access operations is terminated, the ferroelectric memory resets the counter 75 thereby setting the count to "0" while resetting all latch circuit portions 72a thereby bringing the same into states holding low-level data, similarly to the power-up state. Thereafter the aforementioned operations are repetitively performed.

According to the sixth embodiment, as hereinabove described, the ferroelectric memory can perform a refresh operation on all memory cells 91 every time supplied with power, by performing reading and rewriting on all memory cells 91 with the refresh control circuit 73 in the power-up state. Thus, the ferroelectric memory can prevent the memory cells 91 from accumulation of disturbance resulting from an access operation in advance of a power-down state also when repeating an operation of entering a power-down state before reaching the prescribed frequency and thereafter entering a power-up state. Consequently, the ferroelectric memory can suppress loss of data from the memory cells 91 caused by accumulated disturbance.

According to the sixth embodiment, the ferroelectric memory can more reliably suppress loss of data from the memory cells 91 caused by disturbance by performing reading and rewriting on the memory cells 91 on the basis of the fact that it has been detected by the counter 75 that the sum of the access frequencies with respect to the memory cells 91 has reached the prescribed frequency in addition to the power-up state.

According to the sixth embodiment, the latch circuit portions 72b holding presence/absence of the access operation every memory cell block 71a are provided while the refresh control circuit 73 is so formed as to perform rewriting on the memory cells 91 included in the memory cell blocks 71a corresponding to the latch circuit portions 72b on the basis of the fact that it is held by the latch circuit portions 72b that there has been an access operation (high-level data) with respect to the corresponding memory cell blocks 71a, whereby the ferroelectric memory can perform rewriting restrictively on the memory cells 91 in the memory cell blocks 71a subjected to the access operation. Thus, the ferroelectric memory can reduce the frequency by which the memory cells 91 already subjected to rewriting (refresh) receive disturbance resulting from a refresh operation of other memory cells 91 as compared with a case of successively performing rewriting on all memory cells 91 included in the memory cell array 71 in the refresh operation. Thus, the ferroelectric memory can reduce the frequency of disturbance applied to the memory cells 91.

According to the sixth embodiment, the refresh control circuit 73 is so formed as to perform rewriting on the basis of the fact that it has been detected by the counter 75 that the sum of access frequencies with respect to all memory cells 91 included in the memory cell array 71 has reached the prescribed frequency, whereby the ferroelectric memory can periodically perform the refresh operation every constant access frequency dissimilarly to a case of detecting the access frequency with respect to each memory cell block 71a and performing a refresh operation every prescribed access frequency with respect to each memory cell block 71a. Thus, the ferroelectric memory can periodically exercise control such as that for temporarily bringing the ordinary access operation into a standby state in the refresh operation every constant access frequency, whereby control of the ferroelectric memory can be simplified.

Seventh Embodiment

The structure of a ferroelectric memory according to a seventh embodiment of the present invention is now described with reference to FIG. 28.

Figure 28:
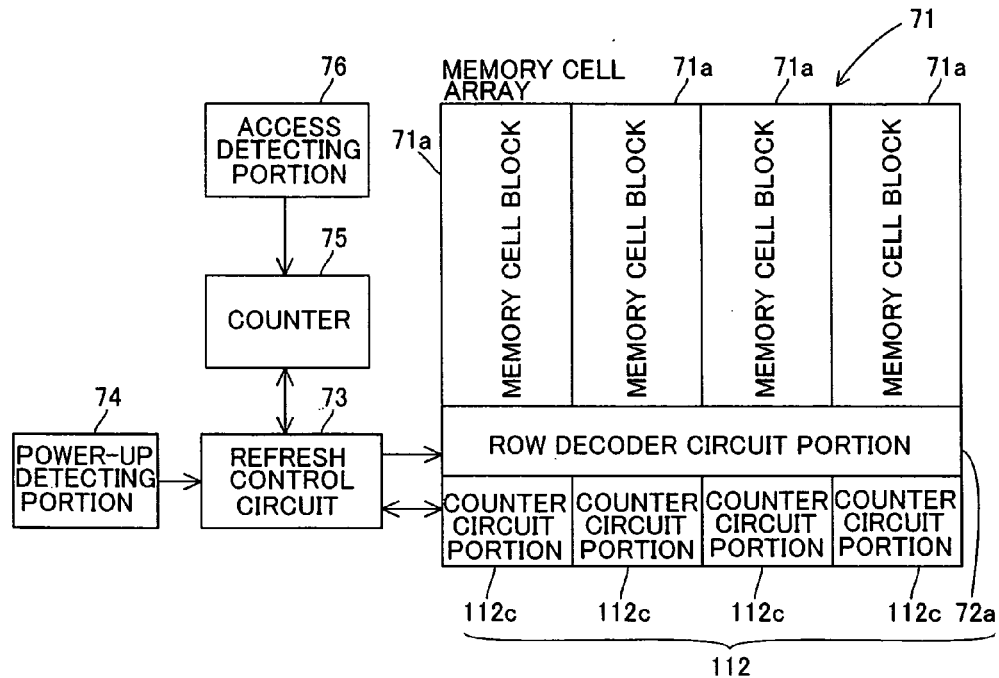
FIG. 28 is a model diagram for illustrating the structure of a ferroelectric memory according to a seventh embodiment of the present invention.

In the ferroelectric memory according to the seventh embodiment, a counter circuit portion 112c is provided to correspond to each memory cell block 71a as shown in FIG. 28, dissimilarly to the aforementioned sixth embodiment. This counter circuit portion 112c is an example of the "second frequency detecting portion" in the present invention. This counter circuit portion 112c is provided for detecting an access frequency every memory cell block 71a. Further, the counter circuit portion 112c is so formed as to increase the count thereof by +1 every time an access operation with respect to the corresponding memory cell block 71a is performed once. According to the seventh embodiment, no latch circuit portions 72b (see FIG. 24) are provided, while a row decoder 112 is constituted of one row decoder circuit portion 72a and four counter circuit portions 112c. The remaining structure of the ferroelectric memory according to the seventh embodiment is similar to the structure of the ferroelectric memory according to the aforementioned sixth embodiment.

Operations of the ferroelectric memory according to the seventh embodiment are now described with reference to FIG. 28. The ferroelectric memory according to the seventh embodiment performs a refresh operation (reading and rewriting) on all memory cells 91 (see FIG. 23) in a power-up state, similarly to the ferroelectric memory according to the aforementioned sixth embodiment. Further, the ferroelectric memory according to the seventh embodiment detects access frequencies with respect to all memory cells 91 with a counter 75, and detects the access frequency every memory cell block 71a with each counter circuit portion 112c. The counter circuit portion 112c increases the count of the access frequency by +1 every time an access operation with respect to the corresponding memory cell block 71a is performed once.

On the basis of the fact that the counter 75 has detected that the access frequencies with respect to all memory cells 91 have reached a prescribed frequency, the counter 75 outputs a prescribed signal to a refresh control circuit 73. The refresh control circuit 73 outputs a control signal for starting a refresh operation to the row decoder 112. At this time, the refresh control circuit 73 outputs row addresses for selecting word lines WL subjected to a refresh operation to the row decoder circuit portion 72a on the basis of the access frequency every memory cell block 71a detected by each counter circuit portion 112c in the seventh embodiment. If the access frequency detected by any counter circuit portion 112c is less than a prescribed frequency (Nb), the refresh control circuit 73 does not output row addresses of the word lines WL included in the memory cell block 71a corresponding to this counter circuit portion 112c to the row decoder circuit portion 72a. If the access frequency detected by any counter circuit portion 112c is in excess of the prescribed frequency (Nb), on the other hand, the refresh control circuit 73 outputs row addresses of the word lines WL included in the memory cell block 71a corresponding to this counter circuit portion 112c to the row decoder circuit portion 72a. Thus, the ferroelectric memory can perform no refresh operation on the memory cells 91 of the memory cell block 71a whose access frequency is less than the prescribed frequency (Nb), and can perform the refresh operation on the memory cells 91 of the memory cell block 71a whose access frequency is in excess of the prescribed frequency (Nb). The remaining operations of the ferroelectric memory according to the seventh embodiment are similar to those of the ferroelectric memory according to the aforementioned sixth embodiment.

According to the seventh embodiment, as hereinabove described, the ferroelectric memory can perform the refresh operation on all memory cells 91 every time power is supplied, by performing reading and rewriting on all memory cells 91 with the refresh control circuit 73 in the power-up state. Thus, the ferroelectric memory can prevent the memory cells 91 from accumulation of disturbance resulting from an access operation in advance of a power-down state also when repeating the power-up state and the power-down state, thereby suppressing loss of data from the memory cells 91 caused by accumulated disturbance.

According to the seventh embodiment, the counter circuit portions 112c detecting the access frequency every memory cell block 71a are provided while the refresh control circuit 73 is so formed as to perform rewriting on all memory cells 91 included in the memory cell block 71a corresponding to the counter circuit portion 112c on the basis of the fact that it has been detected by the counter circuit portion 112c that the access frequency with respect to the corresponding memory cell block 71a has reached the prescribed frequency (Nb), whereby the ferroelectric memory can perform rewriting restrictively on the memory cells 91 in the memory cell block 71a requiring a refresh operation due to the access frequency reaching the prescribed frequency (Nb). Thus, the ferroelectric memory can reduce the frequency by which the memory cells 91 already subjected to rewriting (refresh) receive disturbance resulting from a refresh operation of other memory cells 91 as compared with a case of successively performing rewriting on all memory cells 91 included in the memory cell array 71 in the refresh operation. Thus, the ferroelectric memory can reduce the frequency of disturbance applied to the memory cells 91 in refreshing.

The remaining effects according to the seventh embodiment are similar to those according to the aforementioned sixth embodiment.

Eighth Embodiment

The structure of a ferroelectric memory according to an eighth embodiment of the present invention is now described with reference to FIGS. 29 and 30.

Figure 29:
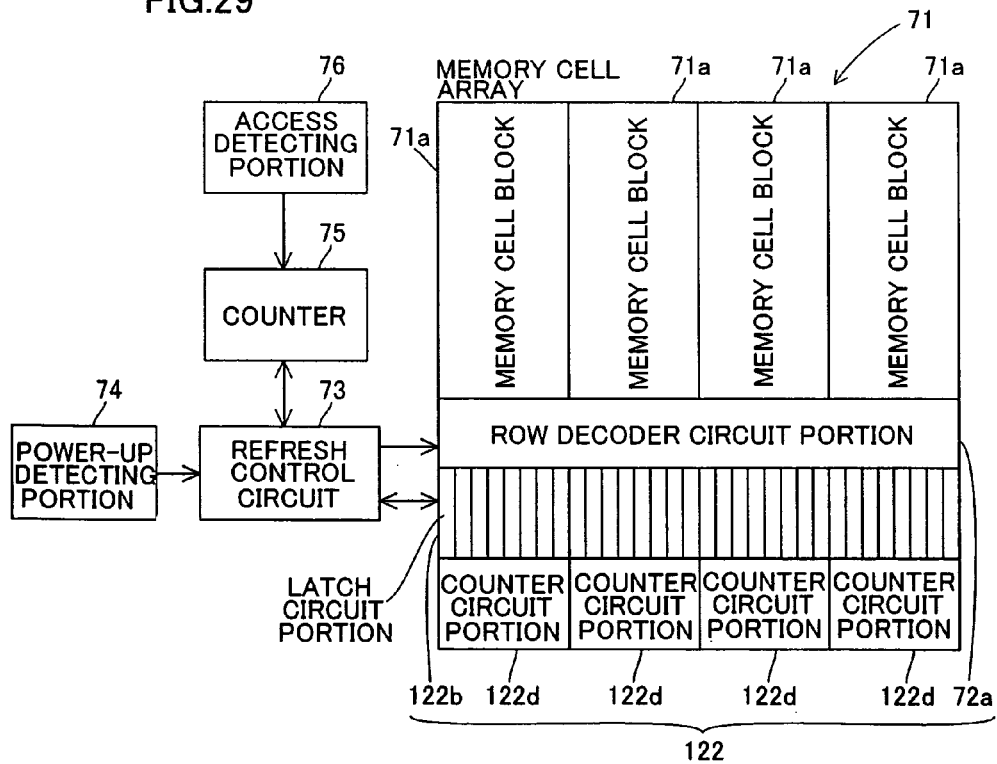
FIG. 29 is a model diagram for illustrating the structure of a ferroelectric memory according to an eighth embodiment of the present invention.
Figure 30:
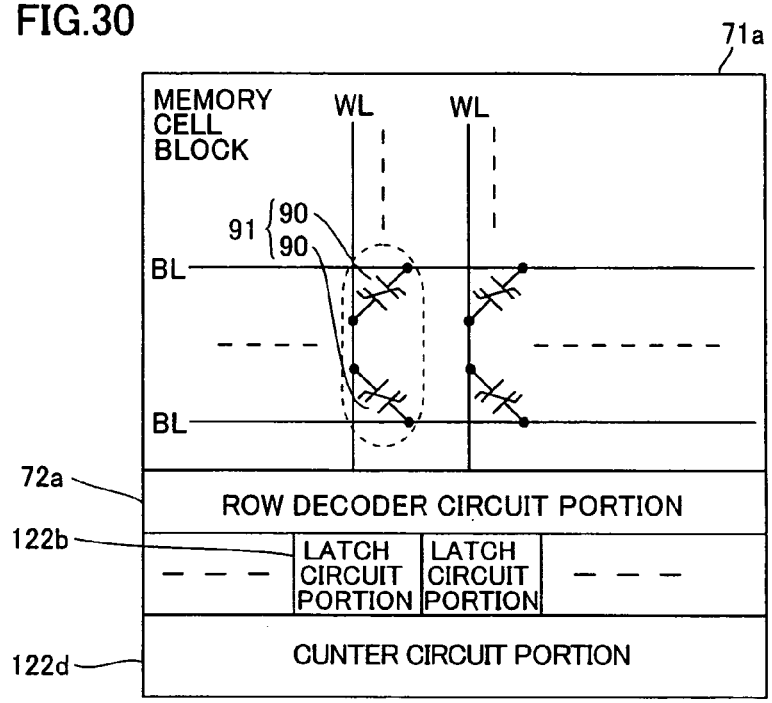
FIG. 30 is a model diagram for illustrating the structures of a memory cell block and a row decoder of the ferroelectric memory according to the eighth embodiment shown in FIG. 29.

In the ferroelectric memory according to the eighth embodiment, a latch circuit portion 112b is provided every word line WL as shown in FIGS. 29 and 30, dissimilarly to the ferroelectric memory according to the aforementioned sixth embodiment. Therefore, eight latch circuit portions 122b are provided every memory cell block 71a since each memory cell block 71a includes eight word lines WL. These latch circuit portions 122b are examples of the "first holding portion" in the present invention. Each latch circuit portion 122b has a function of holding presence/absence of an access operation every word line WL. More specifically, this latch circuit portion 122b is so formed as to hold high-level data when there has been an access operation through the corresponding word line WL, while holding low-level data when there is no access operation through the corresponding word line WL.

Further, the ferroelectric memory according to the eighth embodiment has a counter circuit portion 122d for detecting an access frequency every memory cell block 71a. This counter circuit portion 122d is an example of the "second frequency detecting portion" in the present invention. This counter circuit portion 122d is provided every memory cell block 71a. The counter circuit portion 122d is so formed as to increase the count thereof by +1 every time an access operation with respect to the corresponding memory cell block 71a is performed once. A row decoder 52 is constituted of one row decoder circuit portion 72a, 32 latch circuit portions 122b and four counter circuit portions 122d. The remaining structure of the ferroelectric memory according to the eighth embodiment is similar to that of the ferroelectric memory according to the aforementioned sixth embodiment.

Operations of the ferroelectric memory according to the eighth embodiment of the present invention are now described with reference to FIGS. 29 and 30. The ferroelectric memory according to the eighth embodiment performs a refresh operation (reading and rewriting) on all memory cells 91 (see FIG. 30) in a power-up state, similarly to the ferroelectric memory according to the aforementioned sixth embodiment. When an access operation with respect to the memory cells 91 is performed through each word line WL, data held in the latch circuit portion 122b corresponding to this word line WL is converted to a high level in the ferroelectric memory according to the eighth embodiment. Every time an access operation with respect to the memory cells 91 is performed once through each word line WL, the count of the access frequency is increased by +1 in the counter circuit portion 122d corresponding to the memory cell block 71a to which this word line WL belongs.

According to the eighth embodiment, the ferroelectric memory converts and fixes data held by the eight latch circuit portions 122b to low levels if high-level data are held by the eight latch circuit portions 122b corresponding to the memory cell block 71a when it has been detected by the counter circuit portion 122d that the access frequency with respect to the memory cell block 71a has reached a prescribed frequency (Nc). If latch circuit portions 122b holding low-level data and latch circuit portions 122b holding high-level data are present in the eight latch circuit portions 122b corresponding to the memory cell block 71a when it has been detected by the counter circuit portion 122d that the access frequency with respect to the memory cell block 71a has reached the prescribed frequency (Nc), the ferroelectric memory converts and fixes the data held by the eight latch circuit portions 122b to high levels.

On the basis of the fact that a counter 75 has detected that access frequencies with respect to all memory cells 91 have reached the prescribed frequency, the counter 75 outputs a signal to a signal to a refresh control circuit 73. The refresh control circuit 73 outputs a control signal for starting a refresh operation to the row decoder 122 on the basis of the signal from the counter 75. At this time, the refresh control circuit 73 outputs row addresses for selecting word lines WL subjected to the refresh operation to the row decoder circuit portion 72a on the basis of the data held in the latch circuit portions 122b according to the eighth embodiment. When data held in the eight latch circuit portions 122b corresponding to a prescribed memory cell block 71a are at high levels, the refresh control circuit 73 outputs row addresses of all word lines WL included in this memory cell block 71a to the row decoder circuit portion 72a. When all of the data held in the eight latch circuit portions 122b corresponding to the prescribed memory cell block 71a are at low levels, on the other hand, the refresh control circuit 73 does not output row addresses of all word lines WL included in this memory cell block 71a to the row decoder circuit portion 72a. Thus, no refresh operation is performed on all memory cells 91 included in the memory cell block 71a when there has been an access operation through all of the eight word lines WL included in the memory cell block 71a and when there has been absolutely no access operation through the eight word lines WL.

When word lines WL subjected to an access operation and word lines WL subjected to no access operation are present in the eight word lines WL included in the memory cell block 71a, on the other hand, a refresh operation is performed on all memory cells 91 included in this memory cell block 71a. When there has been an access operation through all eight word lines WL included in the memory cell block 71a, the ferroelectric memory performs no refresh operation on all memory cells 91 included in the memory cell block 71a for the following reason: The memory cells 91 of the memory cell block 71a subjected to the access operation through all eight word lines WL are conceivably relatively uniformly subjected to the access operation, and hence influence by disturbance is conceivably relatively small. The remaining operations of the ferroelectric memory according to the eighth embodiment are similar to those of the ferroelectric memory according to the aforementioned sixth embodiment.

According to the eighth embodiment, as hereinabove described, the ferroelectric memory can perform the refresh operation on all memory cells 91 every time power is supplied by performing reading and rewriting on all memory cells 91 with the refresh control circuit 73 in the power-up state. Thus, the ferroelectric memory can prevent the memory cells 91 from accumulation of disturbance resulting from an access operation in advance of a power-down state also when repeating an operation of entering a power-down state before reaching the prescribed frequency and thereafter entering a power-up state. Consequently, the ferroelectric memory can suppress loss of data from the memory cells 91 caused by accumulated disturbance.

According to the eighth embodiment, the ferroelectric memory can make the refresh control circuit 73 not output the row addresses of the word lines WL included in any memory cell block 71a to the row decoder circuit portion 72a by entirely converting and fixing data held by the eight latch circuit portions 122b to low levels if high-level data are held by all of the latch circuit portions 122b corresponding to the memory cell block 71a when it has been detected by the counter circuit portion 122b that the access frequency with respect to the memory cell block 71a has reached the prescribed frequency (Nc). Thus, the ferroelectric memory can perform no reading and rewriting (refresh) on the memory cell block 71a whose memory cells 91 have been relatively uniformly subjected to the access operation due to the access operation performed through all of the eight word lines WL. Therefore, the ferroelectric memory can perform no reading and rewriting on the memory cells 91 of the memory cell block 71a conceivably slightly influenced by disturbance due to the access operation relatively uniformly performed on the memory cells 91 in the refresh operation. Thus, the ferroelectric memory can reduce the frequency for performing rewriting by the refresh operation, thereby reducing the frequency of disturbance applied to the memory cells 91 in the refresh operation also according to this.

The remaining effects according to the eighth embodiment are similar to those according to the aforementioned sixth embodiment.

The embodiments disclosed this time must be considered as illustrative and not restrictive in all points. The range of the present invention is shown not by the above description of the embodiments but by the scope of claim for patent, and all modifications within the meaning and range equivalent to the scope of claim for patent are included.

For example, the ferroelectric memory as an exemplary memory according to the present invention has been described in each of the above first to eighth embodiments, the present invention is not restricted to this but is also applicable to a memory other than the ferroelectric memory.

Figure 31:
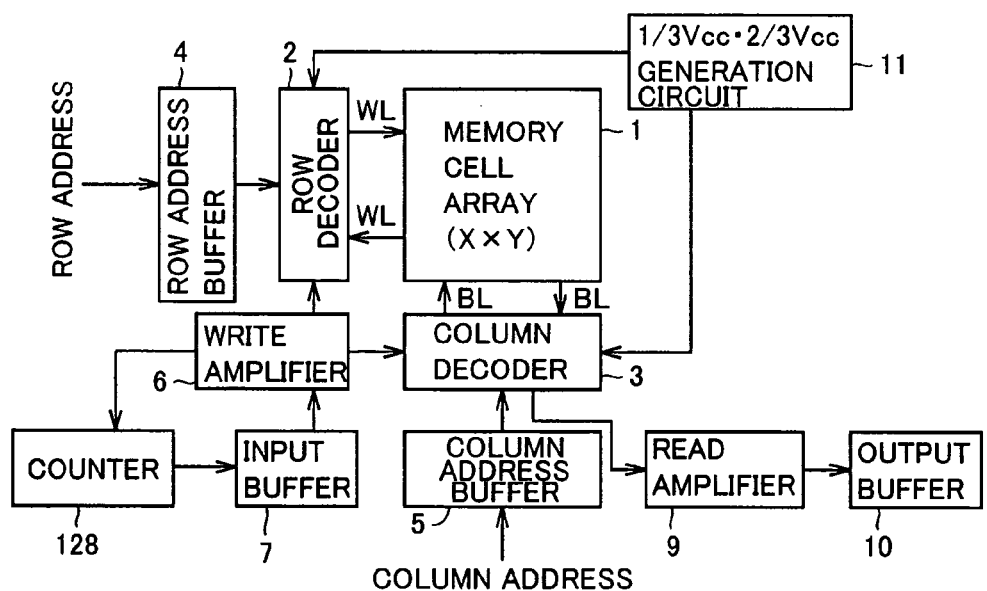
FIG. 31 is a block diagram showing the overall structure of a simple matrix ferroelectric memory according to a first modification of the first embodiment of the present invention.
Figure 32:
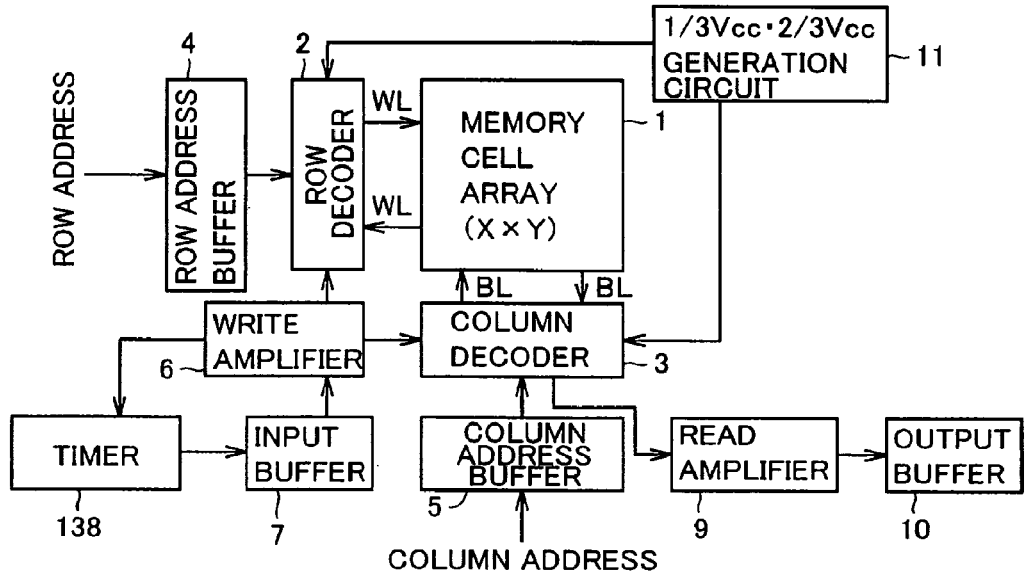
FIG. 32 is a block diagram showing the overall structure of a simple matrix ferroelectric memory according to a second modification of the first embodiment of the present invention.
Figure 33:
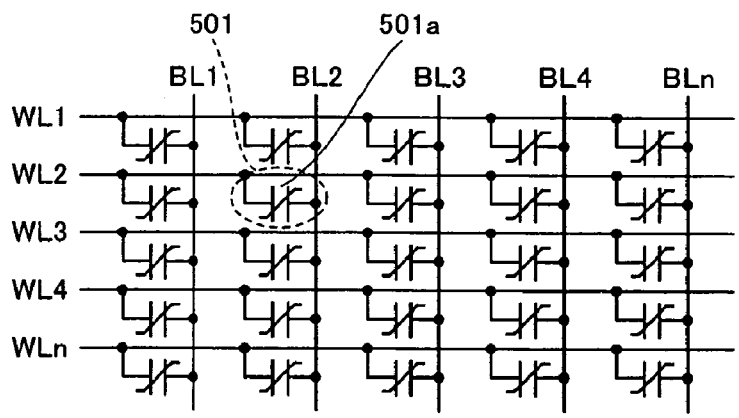
FIG. 33 is an equivalent circuit diagram showing a memory cell array of an exemplary conventional simple matrix ferroelectric memory.

While the ferroelectric memory starts the refresh operation on the memory cells with the refresh control circuit in the aforementioned first embodiment, the present invention is not restricted to this but the ferroelectric memory may alternatively start the refresh operation on the memory cells with control means other than the refresh control circuit. For example, the ferroelectric memory may count an access frequency with respect to a memory cell array 1 with a counter 128 set in place of the refresh control circuit, and may start a refresh operation on memory cells every prescribed access frequency, as shown in FIG. 31. This counter 128 is an example of the "counting portion" in the present invention. In this case, the ferroelectric memory sets the prescribed access frequency for starting the refresh operation to an access frequency before such deterioration of quantities of residual polarization that the ferroelectric memory cannot determine data "0" or "1" with a read amplifier 9 is accumulated in the memory cells by previously performing a simulation. Further alternatively, the ferroelectric memory may count an access time with respect to a memory cell array 1 with a timer 138 set in place of the refresh control circuit and may start a refresh operation every time a prescribed access time counted by the timer 138 elapses, as shown in FIG. 32. This timer 138 is an example of the "counting portion" in the present invention. In this case, the ferroelectric memory sets the prescribed access time for starting the refresh operation to an access time before such deterioration of quantities of residual polarization that the ferroelectric memory cannot determine data "0" or "1" with a read amplifier 9 is accumulated in the memory cells by previously performing a simulation. The ferroelectric memory may necessarily perform a refresh operation on all memory cells in a power-on state or a power-off state of the memory.

While the dummy cell is provided in the refresh control circuit in each of the aforementioned first and second embodiments, the present invention is not restricted to this but the dummy cell may alternatively be provided in the memory cell array, for example, outside the refresh control circuit.

While the ferroelectric memory sets the timing for starting the refresh operation to the point of time when the quantities of residual polarization of the unselected cells deteriorate by at least about 10% from the quantities of residual polarization immediately after the write operation in each of the aforementioned first and second embodiments, the present invention is not restricted to this but the ferroelectric memory may alternatively set the timing for starting the refresh operation to a point of time when the quantities of residual polarization of the unselected cells deteriorate by a quantity other than at least about 10% of the quantities of residual polarization immediately after the write operation.

While eight word lines are provided for each memory cell block in each of the aforementioned third to eighth embodiments, the present invention is not restricted to this but word lines of a number other than eight may alternatively be provided for each memory cell block.

While the ferroelectric memory converts and fixes the data held by the latch circuit portions 52b to high levels or low levels on the basis of the high-level or low-level data held by the latch circuit portions 52b corresponding to the memory cell block 21a when it has been detected by the counter circuit portion 52d that the access frequency with respect to the memory cell block 21a has reached the prescribed frequency (Nc) in the aforementioned fifth embodiment, the present invention is not restricted to this but a latch circuit may alternatively be separately provided every memory cell block 21a and the ferroelectric memory may alternatively convert and fix data held by the latch circuit on the basis of the high-level or low-level data held by the aforementioned latch circuit portions 52b. When the refresh control circuit 23 outputs row addresses to the row decoder circuit portion 22a, the ferroelectric memory may decide row addresses output to the row decoder circuit portion 22a and non-output row addresses on the basis of data held by the aforementioned separately provided latch circuit.

While the ferroelectric memory is so formed as to start the refresh operation by making the power-up detecting portion provided in the memory detect the power-up state and inputting the trigger signal from the power-up detecting portion in the refresh control circuit in each of the aforementioned sixth to eighth embodiments, the present invention is not restricted but the ferroelectric memory may alternatively start the refresh operation in the power-up state by various structures other than the above. For example, the ferroelectric memory may alternatively be so formed as to start a refresh operation by making a power-up detecting portion provided outside the memory detect the power-up state and inputting a prescribed signal from the power-up detecting portion provided outside the memory in the refresh control circuit.

While the ferroelectric memory converts and fixes the data held by the latch circuit portions 122b to high levels or low levels on the basis of the high-level or low-level data held by the latch circuit portions 122b corresponding to the memory cell block 71a when it has been detected by the counter circuit portion 122d that the access frequency with respect to the memory cell block 71a has reached the prescribed frequency (Nc) in the aforementioned eighth embodiment, the present invention is not restricted to this but a latch circuit may alternatively be separately provided every memory cell block 71a and the ferroelectric memory may alternatively convert and fix data held by the latch circuit on the basis of the high-level or low-level data held by the aforementioned latch circuit portions 122b. When the refresh control circuit 73 outputs row addresses to the row decode circuit portion 72a, the ferroelectric memory may decide row addresses output to the row decoder circuit portion 72a and non-output row addresses on the basis of data held by the aforementioned separately provided latch circuit.

The invention claimed is:

1. A memory, comprising:
    a memory cell array including a bit line, a word line arranged to intersect with the bit line, and a first memory cell connected between the bit line and the word line; and
    a refresh control circuit;
    wherein the refresh control circuit is configured to apply, to the first memory cell through an access operation, a first voltage pulse that provides an electrical field in a first direction to invert stored data and a second voltage pulse that provides an electrical field in a second direction, opposite to the first direction, to not invert stored data;
    wherein the access operation includes at least one of a read operation, a rewrite operation, or a write operation to be performed on a selected memory cell; and
    wherein the refresh control circuit is further configured to perform a recovery operation on the first memory cell to recover a quantity of residual polarization.

2. The memory of claim 1, wherein the refresh control circuit is further configured to perform the recovery operation to maintain a quantity of residual polarization in an arbitrary memory cell of the memory cell array.

3. The memory of claim 2, wherein the refresh control circuit is further configured to perform the recovery operation after deterioration of the quantity of residual polarization in the arbitrary memory cell exceeds a prescribed quantity.

4. The memory of claim 1, wherein:
    the first memory cell comprises an unselected memory cell; and
    the refresh control circuit is further configured to perform the recovery operation by varying a technique used to apply the first voltage pulse and the second voltage pulse to the first memory cell based on whether data read by the read operation is first data or second data.

5. The memory of claim 4, wherein the refresh control circuit is further configured to perform the recovery operation by applying the first voltage pulse and the second voltage pulse to the first memory cell at same respective frequencies as frequencies of the read and rewrite operations performed on the selected memory cell.

6. The memory of claim 1, wherein the refresh control circuit is further configured to perform the recovery operation one by one on all memory cells linked to a word line of the selected memory cell.

7. The memory of claim 1, wherein the refresh control circuit is further configured to collectively perform the recovery operation on all memory cells linked to a word line of the selected memory cell.

8. The memory of claim 1, wherein the refresh control circuit comprises a recovery operation control circuit configured to start the recovery operation on the first memory cell if deterioration of the quantity of residual polarization in the first memory cell exceeds a prescribed quantity.

9. The memory of claim 8, further comprising:
    a dummy cell, wherein the refresh control circuit is further configured to apply to the dummy cell a third voltage pulse providing an electrical field in the first direction and having a voltage substantially identical to the first voltage pulse and a fourth voltage pulse providing an electrical field in the second direction and having a voltage substantially identical to the second voltage pulse, and wherein the refresh control circuit is further configured to apply the third voltage pulse and the fourth voltage pulse in correspondence with the application of the first voltage pulse and the second voltage pulse to the first memory cell;
    wherein the recovery operation control circuit is configured to start the recovery operation on the first memory cell if deterioration of a quantity of residual polarization in the dummy cell exceeds a prescribed quantity.

10. The memory of claim 1, wherein:

the first memory cell comprises a ferroelectric capacitor;

the memory is configured to apply a high-voltage voltage pulse having a prescribed pulse width to the selected memory cell while applying a low-voltage voltage pulse having the prescribed pulse width to the first memory cell at least either in the access operation or in the recovery operation; and the memory is further configured to set the prescribed pulse width to a pulse width causing polarization inversion if the memory applies the high-voltage voltage pulse to the ferroelectric capacitor, while substantially causing no polarization inversion if the memory applies the low-voltage voltage pulse to the ferroelectric capacitor.

* * * * *

UNITED STATES PATENT AND TRADEMARK OFFICE
CERTIFICATE OF CORRECTION

PATENT NO.      : 7,652,908 B2  
APPLICATION NO. : 11/630851  
DATED           : January 26, 2010  
INVENTOR(S)     : Miyamoto et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 300 days.

Signed and Sealed this

Twenty-eighth Day of December, 2010

David J. Kappos
*Director of the United States Patent and Trademark Office*